US 9,140,728 B2

(12) United States Patent
Jayanth et al.

(10) Patent No.: US 9,140,728 B2
(45) Date of Patent: Sep. 22, 2015

(54) COMPRESSOR SENSOR MODULE

(75) Inventors: Nagaraj Jayanth, Sidney, OH (US);
Troy W. Renken, Camarillo, CA (US)

(73) Assignee: Emerson Climate Technologies, Inc., Sidney, OH (US)

( * ) Notice: Subject to any disclaimer, the term of this patent is extended or adjusted under 35 U.S.C. 154(b) by 316 days.

(21) Appl. No.: 12/261,643

(22) Filed: Oct. 30, 2008

(65) Prior Publication Data

US 2009/0119036 A1    May 7, 2009

Related U.S. Application Data

(60) Provisional application No. 60/984,902, filed on Nov. 2, 2007.

(51) Int. Cl.
G01R 21/06       (2006.01)
G01R 15/00       (2006.01)
G01R 21/00       (2006.01)
(Continued)

(52) U.S. Cl.
CPC ............ G01R 21/00 (2013.01); F04B 49/065 (2013.01); F04D 27/00 (2013.01); H02H 7/0822 (2013.01); *F04B 2203/0201* (2013.01); *F04B 2203/0202* (2013.01); *F04B 2203/0208* (2013.01)

(58) Field of Classification Search
CPC ............................ G01R 21/133; G01R 21/00
USPC ....................................... 702/60, 57
See application file for complete search history.

(56) References Cited

U.S. PATENT DOCUMENTS 2,054,542 A    9/1936   Hoelle
2,296,822 A    9/1942   Wolfed
(Continued)

FOREIGN PATENT DOCUMENTS

CA    1147440 A1    5/1983
CA    2567264 A1    7/2007
(Continued)

OTHER PUBLICATIONS

"Product Performance Introduction of York Company," cited in First Office Action from the Patent Office of the People's Republic of China dated Jun. 29, 2007 regarding Application No. 200510005907.8, including translation by CCPIT Patent and Trademark Law Office.
(Continued)

*Primary Examiner* — Michael Nghiem
*Assistant Examiner* — Haidong Zhang
(74) *Attorney, Agent, or Firm* — Harness, Dickey & Pierce, P.L.C.

(57) ABSTRACT

A sensor module for a compressor having an electric motor connected to a power supply and a processor disposed within an electrical enclosure of the compressor is provided, with the electrical enclosure being configured to house electrical terminals for connecting the power supply to the electric motor. The sensor module includes a first input connected to a voltage sensor that generates a voltage signal corresponding to a voltage of the power supply and a second input connected to a current sensor that generates a current signal corresponding to a current of the power supply. The processor is connected to the first and second inputs. The processor may calculate a power factor of the compressor, detect an unexpected variation in the power supply, and/or detect a mechanical malfunction of the compressor based on the voltage measurements and the current measurements.

15 Claims, 23 Drawing Sheets

(51) Int. Cl.
  *F04B 49/06*    (2006.01)
  *F04D 27/00*    (2006.01)
  *H02H 7/08*     (2006.01)

(56) References Cited

U.S. PATENT DOCUMENTS

| | | | |
|---|---|---|---|
| 2,631,050 A | 3/1953 | Haeberlein |
| 2,804,839 A | 9/1957 | Hallinan |
| 2,962,702 A | 11/1960 | Derr et al. |
| 2,978,879 A | 4/1961 | Heidorn |
| 3,027,865 A | 4/1962 | Kautz et al. |
| 3,047,696 A | 7/1962 | Heidorn |
| 3,082,951 A | 3/1963 | Kayan |
| 3,107,843 A | 10/1963 | Finn |
| 3,170,304 A | 2/1965 | Hale |
| 3,232,519 A | 2/1966 | Long |
| 3,278,111 A | 10/1966 | Parker |
| 3,400,374 A | 9/1968 | Schumann |
| 3,513,662 A | 5/1970 | Golber |
| 3,581,281 A | 5/1971 | Martin et al. |
| 3,585,451 A | 6/1971 | Day, III |
| 3,653,783 A | 4/1972 | Sauder |
| 3,665,399 A | 5/1972 | Zehr et al. |
| 3,697,953 A | 10/1972 | Schoenwitz |
| 3,707,851 A | 1/1973 | McAshan, Jr. |
| 3,729,949 A | 5/1973 | Talbot |
| 3,735,377 A | 5/1973 | Kaufman |
| 3,742,303 A | 6/1973 | Dageford |
| 3,767,328 A | 10/1973 | Ladusaw |
| 3,783,681 A | 1/1974 | Hirt et al. |
| 3,820,074 A | 6/1974 | Toman |
| 3,882,305 A | 5/1975 | Johnstone |
| 3,924,972 A | 12/1975 | Szymaszek |
| 3,927,712 A | 12/1975 | Nakayama |
| 3,935,519 A | 1/1976 | Pfarrer et al. |
| 3,950,962 A | 4/1976 | Odashima |
| 3,960,011 A | 6/1976 | Renz et al. |
| 3,978,382 A | 8/1976 | Pfarrer et al. |
| 3,998,068 A | 12/1976 | Chirnside |
| 4,006,460 A | 2/1977 | Hewitt et al. |
| 4,014,182 A | 3/1977 | Granryd |
| 4,018,584 A | 4/1977 | Mullen |
| 4,019,172 A | 4/1977 | Srodes |
| 4,024,725 A | 5/1977 | Uchida et al. |
| 4,027,289 A | 5/1977 | Toman |
| 4,034,570 A | 7/1977 | Anderson et al. |
| 4,038,061 A | 7/1977 | Anderson et al. |
| 4,046,532 A | 9/1977 | Nelson |
| RE29,450 E | 10/1977 | Goldsby et al. |
| 4,060,716 A | 11/1977 | Pekrul et al. |
| 4,066,869 A | 1/1978 | Apaloo et al. |
| 4,090,248 A | 5/1978 | Swanson et al. |
| 4,102,150 A | 7/1978 | Kountz |
| 4,102,394 A | 7/1978 | Botts |
| 4,104,888 A | 8/1978 | Reedy et al. |
| 4,105,063 A | 8/1978 | Bergt |
| 4,112,703 A | 9/1978 | Kountz |
| 4,132,086 A | 1/1979 | Kountz |
| 4,136,730 A | 1/1979 | Kinsey |
| 4,137,057 A | 1/1979 | Piet et al. |
| 4,137,725 A | 2/1979 | Martin |
| 4,142,375 A | 3/1979 | Abe et al. |
| 4,143,707 A | 3/1979 | Lewis et al. |
| 4,146,085 A | 3/1979 | Wills |
| RE29,966 E | 4/1979 | Nussbaum |
| 4,151,725 A | 5/1979 | Kountz et al. |
| 4,153,003 A | 5/1979 | Willis |
| 4,156,350 A | 5/1979 | Elliott et al. |
| 4,161,106 A | 7/1979 | Savage et al. |
| 4,165,619 A | 8/1979 | Girard |
| 4,171,622 A | 10/1979 | Yamaguchi et al. |
| 4,173,871 A | 11/1979 | Brooks |
| RE30,242 E | 4/1980 | del Toro et al. |
| 4,197,717 A | 4/1980 | Schumacher |
| 4,205,381 A | 5/1980 | Games et al. |
| 4,209,994 A | 7/1980 | Mueller et al. |
| 4,211,089 A | 7/1980 | Mueller et al. |
| 4,217,761 A | 8/1980 | Cornaire et al. |
| 4,220,010 A | 9/1980 | Mueller et al. |
| 4,227,862 A | 10/1980 | Andrew et al. |
| 4,232,530 A | 11/1980 | Mueller |
| 4,233,818 A | 11/1980 | Lastinger |
| 4,236,379 A | 12/1980 | Mueller |
| 4,244,182 A | 1/1981 | Behr |
| 4,246,763 A | 1/1981 | Mueller et al. |
| 4,248,051 A | 2/1981 | Darcy et al. |
| 4,251,988 A | 2/1981 | Allard et al. |
| 4,257,795 A | 3/1981 | Shaw |
| 4,259,847 A | 4/1981 | Pearse, Jr. |
| 4,267,702 A | 5/1981 | Houk |
| 4,270,174 A | 5/1981 | Karlin et al. |
| 4,271,898 A | 6/1981 | Freeman |
| 4,281,358 A | 7/1981 | Plouffe et al. |
| 4,284,849 A | 8/1981 | Anderson et al. |
| 4,286,438 A | 9/1981 | Clarke |
| 4,290,480 A | 9/1981 | Sulkowski |
| 4,296,727 A | 10/1981 | Bryan |
| 4,301,660 A | 11/1981 | Mueller et al. |
| 4,306,293 A | 12/1981 | Marathe |
| 4,307,775 A | 12/1981 | Saunders |
| 4,308,725 A | 1/1982 | Chiyoda |
| 4,311,188 A | 1/1982 | Kojima et al. |
| 4,319,461 A | 3/1982 | Shaw |
| 4,321,529 A | 3/1982 | Simmonds et al. |
| 4,325,223 A | 4/1982 | Cantley |
| 4,328,678 A | 5/1982 | Kono et al. |
| 4,328,680 A | 5/1982 | Stamp, Jr. et al. |
| 4,333,316 A | 6/1982 | Stamp, Jr. et al. |
| 4,333,317 A | 6/1982 | Sawyer |
| 4,336,001 A | 6/1982 | Andrew et al. |
| 4,338,790 A | 7/1982 | Saunders et al. |
| 4,338,791 A | 7/1982 | Stamp, Jr. et al. |
| 4,345,162 A | 8/1982 | Hammer et al. |
| 4,346,755 A | 8/1982 | Alley et al. |
| 4,350,021 A | 9/1982 | Lundstrom |
| 4,350,023 A | 9/1982 | Kuwabara et al. |
| 4,351,163 A | 9/1982 | Johannsen |
| 4,356,703 A | 11/1982 | Vogel |
| 4,361,273 A | 11/1982 | Levine et al. |
| 4,365,983 A | 12/1982 | Abraham et al. |
| 4,370,098 A | 1/1983 | McClain et al. |
| 4,372,119 A | 2/1983 | Gillbrand et al. |
| 4,381,549 A | 4/1983 | Stamp, Jr. et al. |
| 4,382,367 A | 5/1983 | Roberts |
| 4,384,462 A | 5/1983 | Overman et al. |
| 4,387,368 A | 6/1983 | Day et al. |
| 4,387,578 A | 6/1983 | Paddock |
| 4,390,058 A | 6/1983 | Otake et al. |
| 4,390,321 A | 6/1983 | Langlois et al. |
| 4,390,922 A | 6/1983 | Pelliccia |
| 4,395,886 A | 8/1983 | Mayer |
| 4,395,887 A | 8/1983 | Sweetman |
| 4,399,548 A | 8/1983 | Castleberry |
| 4,402,054 A | 8/1983 | Osborne et al. |
| 4,406,133 A | 9/1983 | Saunders et al. |
| 4,407,138 A | 10/1983 | Mueller |
| 4,408,660 A | 10/1983 | Sutoh et al. |
| 4,412,788 A | 11/1983 | Shaw et al. |
| 4,415,896 A | 11/1983 | Allgood |
| 4,418,388 A | 11/1983 | Allgor et al. |
| 4,420,947 A | 12/1983 | Yoshino |
| 4,425,010 A | 1/1984 | Bryant et al. |
| 4,429,578 A | 2/1984 | Darrel et al. |
| 4,432,232 A | 2/1984 | Brantley et al. |
| 4,434,390 A | 2/1984 | Elms |
| 4,441,329 A | 4/1984 | Dawley |
| 4,448,038 A | 5/1984 | Barbier |
| 4,449,375 A | 5/1984 | Briccetti |
| 4,451,929 A | 5/1984 | Yoshida |
| 4,460,123 A | 7/1984 | Beverly |
| 4,463,571 A | 8/1984 | Wiggs |
| 4,463,574 A | 8/1984 | Spethmann et al. |
| 4,463,576 A | 8/1984 | Burnett et al. |
| 4,465,229 A | 8/1984 | Kompelien |

(56) References Cited

U.S. PATENT DOCUMENTS

| | | |
|---|---|---|
| 4,467,230 A | 8/1984 | Rovinsky |
| 4,467,385 A | 8/1984 | Bandoli et al. |
| 4,467,613 A | 8/1984 | Behr et al. |
| 4,470,092 A | 9/1984 | Lombardi |
| 4,470,266 A | 9/1984 | Briccetti et al. |
| 4,474,024 A | 10/1984 | Eplett et al. |
| 4,479,389 A | 10/1984 | Anderson, III et al. |
| 4,484,452 A | 11/1984 | Houser, Jr. |
| 4,489,551 A | 12/1984 | Watanabe et al. |
| 4,490,986 A | 1/1985 | Paddock |
| 4,494,383 A | 1/1985 | Nagatomo et al. |
| 4,495,779 A | 1/1985 | Tanaka et al. |
| 4,496,296 A | 1/1985 | Arai et al. |
| 4,497,031 A | 1/1985 | Froehling et al. |
| 4,498,310 A | 2/1985 | Imanishi et al. |
| 4,499,739 A | 2/1985 | Matsuoka et al. |
| 4,502,084 A | 2/1985 | Hannett |
| 4,502,833 A | 3/1985 | Hibino et al. |
| 4,502,842 A | 3/1985 | Currier et al. |
| 4,502,843 A | 3/1985 | Martin |
| 4,505,125 A | 3/1985 | Baglione |
| 4,506,518 A | 3/1985 | Yoshikawa et al. |
| 4,507,934 A | 4/1985 | Tanaka et al. |
| 4,510,547 A | 4/1985 | Rudich, Jr. |
| 4,510,576 A | 4/1985 | MacArthur et al. |
| 4,512,161 A | 4/1985 | Logan et al. |
| 4,516,407 A | 5/1985 | Watabe |
| 4,517,468 A | 5/1985 | Kemper et al. |
| 4,520,674 A | 6/1985 | Canada et al. |
| 4,523,435 A | 6/1985 | Lord |
| 4,523,436 A | 6/1985 | Schedel et al. |
| 4,527,247 A | 7/1985 | Kaiser et al. |
| 4,527,399 A | 7/1985 | Lord |
| 4,535,607 A | 8/1985 | Mount |
| 4,538,420 A | 9/1985 | Nelson |
| 4,538,422 A | 9/1985 | Mount et al. |
| 4,539,820 A | 9/1985 | Zinsmeyer |
| 4,540,040 A | 9/1985 | Fukumoto et al. |
| 4,545,210 A | 10/1985 | Lord |
| 4,545,214 A | 10/1985 | Kinoshita |
| 4,548,549 A | 10/1985 | Murphy et al. |
| 4,549,403 A | 10/1985 | Lord et al. |
| 4,549,404 A | 10/1985 | Lord |
| 4,550,770 A | 11/1985 | Nussdorfer et al. |
| 4,553,400 A | 11/1985 | Branz |
| 4,555,057 A | 11/1985 | Foster |
| 4,555,910 A | 12/1985 | Sturges |
| 4,557,317 A | 12/1985 | Harmon, Jr. |
| 4,558,181 A | 12/1985 | Blanchard et al. |
| 4,561,260 A | 12/1985 | Nishi et al. |
| 4,563,624 A | 1/1986 | Yu |
| 4,563,877 A | 1/1986 | Harnish |
| 4,563,878 A | 1/1986 | Baglione |
| 4,567,733 A | 2/1986 | Mecozzi |
| 4,568,909 A | 2/1986 | Whynacht |
| 4,574,871 A | 3/1986 | Parkinson et al. |
| 4,575,318 A | 3/1986 | Blain |
| 4,577,977 A | 3/1986 | Pejsa |
| 4,580,947 A | 4/1986 | Shibata et al. |
| 4,583,373 A | 4/1986 | Shaw |
| 4,589,060 A | 5/1986 | Zinsmeyer |
| 4,593,367 A | 6/1986 | Slack et al. |
| 4,598,764 A | 7/1986 | Beckey |
| 4,602,484 A | 7/1986 | Bendikson |
| 4,603,556 A | 8/1986 | Suefuji et al. |
| 4,604,036 A | 8/1986 | Sutou et al. |
| 4,611,470 A | 9/1986 | Enstrom |
| 4,612,775 A | 9/1986 | Branz et al. |
| 4,614,089 A | 9/1986 | Dorsey |
| 4,617,804 A | 10/1986 | Fukushima et al. |
| 4,620,286 A | 10/1986 | Smith et al. |
| 4,620,424 A | 11/1986 | Tanaka et al. |
| 4,621,502 A | 11/1986 | Ibrahim et al. |
| 4,627,245 A | 12/1986 | Levine |
| 4,627,483 A | 12/1986 | Harshbarger, III et al. |
| 4,627,484 A | 12/1986 | Harshbarger, Jr. et al. |
| 4,630,572 A | 12/1986 | Evans |
| 4,630,670 A | 12/1986 | Wellman et al. |
| 4,642,034 A | 2/1987 | Terauchi |
| 4,642,782 A | 2/1987 | Kemper et al. |
| 4,644,479 A | 2/1987 | Kemper et al. |
| 4,646,532 A | 3/1987 | Nose |
| 4,648,044 A | 3/1987 | Hardy et al. |
| 4,649,515 A | 3/1987 | Thompson et al. |
| 4,649,710 A | 3/1987 | Inoue et al. |
| 4,653,280 A | 3/1987 | Hansen et al. |
| 4,653,285 A | 3/1987 | Pohl |
| 4,655,688 A | 4/1987 | Bohn et al. |
| 4,660,386 A | 4/1987 | Hansen et al. |
| 4,662,184 A | 5/1987 | Pohl et al. |
| 4,674,292 A | 6/1987 | Ohya et al. |
| 4,677,830 A | 7/1987 | Sumikawa et al. |
| 4,680,940 A | 7/1987 | Vaughn |
| 4,682,473 A | 7/1987 | Rogers, III |
| 4,684,060 A | 8/1987 | Adams et al. |
| 4,685,615 A | 8/1987 | Hart |
| 4,686,835 A | 8/1987 | Alsenz |
| 4,689,967 A | 9/1987 | Han et al. |
| 4,697,431 A | 10/1987 | Alsenz |
| 4,698,978 A | 10/1987 | Jones |
| 4,698,981 A | 10/1987 | Kaneko et al. |
| 4,701,824 A | 10/1987 | Beggs et al. |
| 4,703,325 A | 10/1987 | Chamberlin et al. |
| 4,706,152 A | 11/1987 | DeFilippis et al. |
| 4,706,469 A | 11/1987 | Oguni et al. |
| 4,712,648 A | 12/1987 | Mattes et al. |
| 4,713,717 A | 12/1987 | Pejouhy et al. |
| 4,715,190 A | 12/1987 | Han et al. |
| 4,715,792 A | 12/1987 | Nishizawa et al. |
| 4,716,582 A | 12/1987 | Blanchard et al. |
| 4,716,957 A | 1/1988 | Thompson et al. |
| 4,720,980 A | 1/1988 | Howland |
| 4,735,054 A | 4/1988 | Beckey |
| 4,735,060 A | 4/1988 | Alsenz |
| 4,744,223 A | 5/1988 | Umezu |
| 4,745,765 A | 5/1988 | Pettitt |
| 4,745,766 A | 5/1988 | Bahr |
| 4,745,767 A | 5/1988 | Ohya et al. |
| 4,750,332 A | 6/1988 | Jenski et al. |
| 4,750,672 A | 6/1988 | Beckey et al. |
| 4,751,501 A | 6/1988 | Gut |
| 4,751,825 A | 6/1988 | Voorhis et al. |
| 4,754,410 A | 6/1988 | Leech et al. |
| 4,755,957 A | 7/1988 | White et al. |
| 4,765,150 A | 8/1988 | Persem |
| 4,768,346 A | 9/1988 | Mathur |
| 4,768,348 A | 9/1988 | Noguchi |
| 4,783,752 A | 11/1988 | Kaplan et al. |
| 4,787,213 A | 11/1988 | Gras et al. |
| 4,790,142 A | 12/1988 | Beckey |
| 4,796,142 A | 1/1989 | Libert |
| 4,796,466 A | 1/1989 | Farmer |
| 4,798,055 A | 1/1989 | Murray et al. |
| 4,805,118 A | 2/1989 | Rishel |
| 4,807,445 A | 2/1989 | Matsuoka et al. |
| 4,829,779 A | 5/1989 | Munson et al. |
| 4,831,560 A | 5/1989 | Zaleski |
| 4,831,832 A | 5/1989 | Alsenz |
| 4,831,833 A | 5/1989 | Duenes et al. |
| 4,835,706 A | 5/1989 | Asahi |
| 4,835,980 A | 6/1989 | Oyanagi et al. |
| 4,838,037 A | 6/1989 | Wood |
| 4,841,734 A | 6/1989 | Torrence |
| 4,843,575 A | 6/1989 | Crane |
| 4,845,956 A | 7/1989 | Berntsen et al. |
| 4,848,099 A | 7/1989 | Beckey et al. |
| 4,848,100 A | 7/1989 | Barthel et al. |
| 4,850,198 A | 7/1989 | Helt et al. |
| 4,850,204 A | 7/1989 | Bos et al. |
| 4,852,363 A | 8/1989 | Kampf et al. |
| 4,853,693 A | 8/1989 | Eaton-Williams |
| 4,856,286 A | 8/1989 | Sulfstede et al. |
| 4,858,676 A | 8/1989 | Bolfik et al. |
| 4,866,635 A | 9/1989 | Kahn et al. |

(56) References Cited

U.S. PATENT DOCUMENTS

| | | |
|---|---|---|
| 4,866,944 A | 9/1989 | Yamazaki |
| 4,869,073 A | 9/1989 | Kawai et al. |
| 4,873,836 A | 10/1989 | Thompson |
| 4,875,589 A | 10/1989 | Lacey et al. |
| 4,878,355 A | 11/1989 | Beckey et al. |
| 4,881,184 A | 11/1989 | Abegg, III et al. |
| 4,882,747 A | 11/1989 | Williams |
| 4,882,908 A | 11/1989 | White |
| 4,884,412 A | 12/1989 | Sellers et al. |
| 4,885,707 A | 12/1989 | Nichol et al. |
| 4,885,914 A | 12/1989 | Pearman |
| 4,887,436 A | 12/1989 | Enomoto et al. |
| 4,887,857 A | 12/1989 | VanOmmeren |
| 4,889,280 A | 12/1989 | Grald et al. |
| 4,893,480 A | 1/1990 | Matsui et al. |
| 4,899,551 A | 2/1990 | Weintraub |
| 4,903,500 A | 2/1990 | Hanson |
| 4,903,759 A | 2/1990 | Lapeyrouse |
| 4,904,993 A | 2/1990 | Sato |
| 4,909,041 A | 3/1990 | Jones |
| 4,909,076 A | 3/1990 | Busch et al. |
| 4,910,966 A | 3/1990 | Levine et al. |
| 4,913,625 A | 4/1990 | Gerlowski |
| 4,916,633 A | 4/1990 | Tychonievich et al. |
| 4,916,909 A | 4/1990 | Mathur et al. |
| 4,916,912 A | 4/1990 | Levine et al. |
| 4,918,690 A | 4/1990 | Markkula, Jr. et al. |
| 4,918,932 A | 4/1990 | Gustafson et al. |
| 4,924,404 A | 5/1990 | Reinke, Jr. |
| 4,924,418 A | 5/1990 | Bachman et al. |
| 4,928,750 A | 5/1990 | Nurczyk |
| 4,932,588 A | 6/1990 | Fedter et al. |
| 4,939,909 A | 7/1990 | Tsuchiyama et al. |
| 4,943,003 A | 7/1990 | Shimizu et al. |
| 4,944,160 A | 7/1990 | Malone et al. |
| 4,945,491 A | 7/1990 | Rishel |
| 4,948,040 A | 8/1990 | Kobayashi et al. |
| 4,949,550 A | 8/1990 | Hanson |
| 4,953,784 A | 9/1990 | Yasufuku et al. |
| 4,959,970 A | 10/1990 | Meckler |
| 4,964,060 A | 10/1990 | Hartsog |
| 4,964,125 A | 10/1990 | Kim |
| 4,966,006 A | 10/1990 | Thuesen et al. |
| 4,967,567 A | 11/1990 | Proctor et al. |
| 4,974,427 A | 12/1990 | Diab |
| 4,974,665 A | 12/1990 | Zillner, Jr. |
| 4,975,024 A | 12/1990 | Heckel |
| 4,977,751 A | 12/1990 | Hanson |
| 4,985,857 A | 1/1991 | Bajpai et al. |
| 4,987,748 A | 1/1991 | Meckler |
| 4,990,057 A | 2/1991 | Rollins |
| 4,990,893 A | 2/1991 | Kiluk |
| 4,991,770 A | 2/1991 | Bird et al. |
| 5,000,009 A | 3/1991 | Clanin |
| 5,005,365 A | 4/1991 | Lynch |
| 5,009,074 A | 4/1991 | Goubeaux et al. |
| 5,009,075 A | 4/1991 | Okoren |
| 5,009,076 A | 4/1991 | Winslow |
| 5,018,357 A | 5/1991 | Livingstone et al. |
| 5,018,665 A | 5/1991 | Sulmone |
| RE33,620 E | 6/1991 | Persem |
| 5,022,234 A | 6/1991 | Goubeaux et al. |
| 5,039,009 A | 8/1991 | Baldwin et al. |
| 5,042,264 A | 8/1991 | Dudley |
| 5,051,720 A | 9/1991 | Kittirutsunetorn |
| 5,056,036 A | 10/1991 | Van Bork |
| 5,056,329 A | 10/1991 | Wilkinson |
| 5,058,388 A | 10/1991 | Shaw et al. |
| 5,062,278 A | 11/1991 | Sugiyama |
| 5,065,593 A | 11/1991 | Dudley et al. |
| 5,067,099 A | 11/1991 | McCown et al. |
| RE33,775 E | 12/1991 | Behr et al. |
| 5,070,468 A | 12/1991 | Niinomi et al. |
| 5,071,065 A | 12/1991 | Aalto et al. |
| 5,073,091 A | 12/1991 | Burgess et al. |
| 5,073,862 A | 12/1991 | Carlson |
| 5,076,067 A | 12/1991 | Prenger et al. |
| 5,076,494 A | 12/1991 | Ripka |
| 5,077,983 A | 1/1992 | Dudley |
| 5,083,438 A | 1/1992 | McMullin |
| 5,086,385 A | 2/1992 | Launey et al. |
| 5,088,297 A | 2/1992 | Maruyama et al. |
| 5,094,086 A | 3/1992 | Shyu |
| 5,095,712 A | 3/1992 | Narreau |
| 5,095,715 A | 3/1992 | Dudley |
| 5,099,654 A | 3/1992 | Baruschke et al. |
| 5,103,391 A | 4/1992 | Barrett |
| 5,107,500 A | 4/1992 | Wakamoto et al. |
| 5,109,222 A | 4/1992 | Welty |
| 5,109,676 A | 5/1992 | Waters et al. |
| 5,109,700 A | 5/1992 | Hicho |
| 5,109,916 A | 5/1992 | Thompson |
| 5,115,406 A | 5/1992 | Zatezalo et al. |
| 5,115,643 A | 5/1992 | Hayata et al. |
| 5,115,644 A | 5/1992 | Alsenz |
| 5,115,967 A | 5/1992 | Wedekind |
| 5,118,260 A | 6/1992 | Fraser, Jr. |
| 5,119,466 A | 6/1992 | Suzuki |
| 5,119,637 A | 6/1992 | Bard et al. |
| 5,121,610 A | 6/1992 | Atkinson et al. |
| 5,123,017 A | 6/1992 | Simpkins et al. |
| 5,123,252 A | 6/1992 | Hanson |
| 5,123,253 A | 6/1992 | Hanson et al. |
| 5,123,255 A | 6/1992 | Ohizumi |
| 5,125,067 A | 6/1992 | Erdman |
| 5,127,232 A | 7/1992 | Paige et al. |
| 5,131,237 A | 7/1992 | Valbjorn |
| 5,141,407 A | 8/1992 | Ramsey et al. |
| 5,142,877 A | 9/1992 | Shimizu |
| 5,150,584 A | 9/1992 | Tomasov et al. |
| 5,156,539 A | 10/1992 | Anderson et al. |
| 5,167,494 A | 12/1992 | Inagaki et al. |
| 5,170,935 A | 12/1992 | Federspiel et al. |
| 5,170,936 A | 12/1992 | Kubo et al. |
| 5,181,389 A | 1/1993 | Hanson et al. |
| 5,186,014 A | 2/1993 | Runk |
| 5,197,666 A | 3/1993 | Wedekind |
| 5,199,855 A | 4/1993 | Nakajima et al. |
| 5,200,872 A | 4/1993 | D'Entremont et al. |
| 5,200,987 A | 4/1993 | Gray |
| 5,201,862 A | 4/1993 | Pettitt |
| 5,203,178 A | 4/1993 | Shyu |
| 5,203,179 A | 4/1993 | Powell |
| 5,209,076 A | 5/1993 | Kauffman et al. |
| 5,209,400 A | 5/1993 | Winslow et al. |
| 5,219,041 A | 6/1993 | Greve |
| 5,224,354 A | 7/1993 | Ito et al. |
| 5,224,835 A | 7/1993 | Oltman |
| 5,226,472 A | 7/1993 | Benevelli et al. |
| 5,228,300 A | 7/1993 | Shim |
| 5,228,304 A | 7/1993 | Ryan |
| 5,228,307 A | 7/1993 | Koce |
| 5,230,223 A | 7/1993 | Hullar et al. |
| 5,231,844 A | 8/1993 | Park |
| 5,233,841 A | 8/1993 | Jyrek |
| 5,235,526 A | 8/1993 | Saffell |
| 5,237,830 A | 8/1993 | Grant |
| 5,241,664 A | 8/1993 | Ohba et al. |
| 5,241,833 A | 9/1993 | Ohkoshi |
| 5,243,827 A | 9/1993 | Hagita et al. |
| 5,243,829 A | 9/1993 | Bessler |
| 5,245,833 A | 9/1993 | Mei et al. |
| 5,248,244 A | 9/1993 | Ho et al. |
| 5,251,453 A | 10/1993 | Stanke et al. |
| 5,251,454 A | 10/1993 | Yoon |
| 5,255,977 A | 10/1993 | Eimer et al. |
| 5,257,506 A | 11/1993 | DeWolf et al. |
| 5,265,434 A | 11/1993 | Alsenz |
| 5,269,458 A | 12/1993 | Sol |
| 5,271,556 A | 12/1993 | Helt et al. |
| 5,274,571 A | 12/1993 | Hesse et al. |
| 5,276,630 A | 1/1994 | Baldwin et al. |
| 5,279,458 A | 1/1994 | DeWolf et al. |
| 5,282,728 A | 2/1994 | Swain |

(56) References Cited

U.S. PATENT DOCUMENTS

| | | |
|---|---|---|
| 5,284,026 A | 2/1994 | Powell |
| 5,289,362 A | 2/1994 | Liebl et al. |
| 5,290,154 A | 3/1994 | Kotlarek et al. |
| 5,291,752 A | 3/1994 | Alvarez et al. |
| 5,299,504 A | 4/1994 | Abele |
| 5,303,112 A | 4/1994 | Zulaski et al. |
| 5,303,560 A | 4/1994 | Hanson et al. |
| 5,311,451 A | 5/1994 | Barrett |
| 5,311,562 A | 5/1994 | Palusamy et al. |
| 5,316,448 A | 5/1994 | Ziegler et al. |
| 5,320,506 A | 6/1994 | Fogt |
| 5,333,460 A * | 8/1994 | Lewis et al. .................. 62/6 |
| 5,335,507 A | 8/1994 | Powell |
| 5,336,058 A | 8/1994 | Yokoyama |
| 5,347,476 A | 9/1994 | McBean, Sr. |
| 5,351,037 A | 9/1994 | Martell et al. |
| 5,362,206 A | 11/1994 | Westerman et al. |
| 5,362,211 A | 11/1994 | Iizuka et al. |
| 5,368,446 A | 11/1994 | Rode |
| 5,369,958 A | 12/1994 | Kasai et al. |
| 5,381,669 A | 1/1995 | Bahel et al. |
| 5,381,692 A | 1/1995 | Winslow et al. |
| 5,388,176 A | 2/1995 | Dykstra et al. |
| 5,395,042 A | 3/1995 | Riley et al. |
| 5,410,230 A | 4/1995 | Bessler et al. |
| 5,414,792 A | 5/1995 | Shorey |
| 5,415,008 A | 5/1995 | Bessler |
| 5,416,781 A | 5/1995 | Ruiz |
| 5,423,190 A | 6/1995 | Friedland |
| 5,423,192 A | 6/1995 | Young et al. |
| 5,426,952 A | 6/1995 | Bessler |
| 5,431,026 A | 7/1995 | Jaster |
| 5,432,500 A | 7/1995 | Scripps |
| 5,435,145 A | 7/1995 | Jaster |
| 5,440,890 A | 8/1995 | Bahel et al. |
| 5,440,891 A | 8/1995 | Hindmon, Jr. et al. |
| 5,440,895 A | 8/1995 | Bahel et al. |
| 5,446,677 A | 8/1995 | Jensen et al. |
| 5,450,359 A | 9/1995 | Sharma et al. |
| 5,452,291 A | 9/1995 | Eisenhandler et al. |
| 5,454,229 A | 10/1995 | Hanson et al. |
| 5,457,965 A | 10/1995 | Blair et al. |
| 5,460,006 A | 10/1995 | Torimitsu |
| 5,467,011 A | 11/1995 | Hunt |
| 5,467,264 A | 11/1995 | Rauch et al. |
| 5,469,045 A | 11/1995 | Dove et al. |
| 5,475,986 A | 12/1995 | Bahel et al. |
| 5,478,212 A | 12/1995 | Sakai et al. |
| 5,481,481 A | 1/1996 | Frey et al. |
| 5,481,884 A | 1/1996 | Scoccia |
| 5,491,978 A | 2/1996 | Young et al. |
| 5,495,722 A | 3/1996 | Manson et al. |
| 5,499,512 A | 3/1996 | Jurewicz et al. |
| 5,509,786 A | 4/1996 | Mizutani et al. |
| 5,511,387 A | 4/1996 | Tinsler |
| 5,512,883 A | 4/1996 | Lane, Jr. |
| 5,515,267 A | 5/1996 | Alsenz |
| 5,515,692 A | 5/1996 | Sterber et al. |
| 5,519,301 A | 5/1996 | Yoshida et al. |
| 5,528,908 A | 6/1996 | Bahel et al. |
| 5,533,347 A | 7/1996 | Ott et al. |
| 5,535,136 A | 7/1996 | Standifer |
| 5,535,597 A | 7/1996 | An |
| 5,546,015 A | 8/1996 | Okabe |
| 5,546,073 A | 8/1996 | Duff et al. |
| 5,546,756 A | 8/1996 | Ali |
| 5,546,757 A | 8/1996 | Whipple, III |
| 5,548,966 A | 8/1996 | Tinsler |
| 5,555,195 A | 9/1996 | Jensen et al. |
| 5,562,426 A | 10/1996 | Watanabe et al. |
| 5,563,490 A | 10/1996 | Kawaguchi et al. |
| 5,564,280 A | 10/1996 | Schilling et al. |
| 5,566,084 A | 10/1996 | Cmar |
| 5,570,085 A | 10/1996 | Bertsch |
| 5,570,258 A | 10/1996 | Manning |
| 5,572,643 A | 11/1996 | Judson |
| 5,577,905 A | 11/1996 | Momber et al. |
| 5,579,648 A | 12/1996 | Hanson et al. |
| 5,581,229 A | 12/1996 | Hunt |
| 5,586,445 A | 12/1996 | Bessler |
| 5,586,446 A | 12/1996 | Torimitsu |
| 5,590,830 A | 1/1997 | Kettler et al. |
| 5,592,058 A | 1/1997 | Archer et al. |
| 5,592,824 A | 1/1997 | Sogabe et al. |
| 5,596,507 A | 1/1997 | Jones et al. |
| 5,600,960 A | 2/1997 | Schwedler et al. |
| 5,602,749 A | 2/1997 | Vosburgh |
| 5,602,757 A | 2/1997 | Haseley et al. |
| 5,602,761 A | 2/1997 | Spoerre et al. |
| 5,610,339 A | 3/1997 | Haseley et al. |
| 5,611,674 A | 3/1997 | Bass et al. |
| 5,613,841 A | 3/1997 | Bass et al. |
| 5,616,829 A | 4/1997 | Balaschak et al. |
| 5,623,834 A | 4/1997 | Bahel et al. |
| 5,628,201 A | 5/1997 | Bahel et al. |
| 5,630,325 A | 5/1997 | Bahel et al. |
| 5,635,896 A | 6/1997 | Tinsley et al. |
| 5,641,270 A | 6/1997 | Sgourakes et al. |
| 5,643,482 A | 7/1997 | Sandelman et al. |
| 5,650,936 A | 7/1997 | Loucks et al. |
| 5,655,379 A | 8/1997 | Jaster et al. |
| 5,655,380 A | 8/1997 | Calton |
| 5,682,949 A | 11/1997 | Ratcliffe et al. |
| 5,684,463 A | 11/1997 | Diercks et al. |
| 5,689,963 A | 11/1997 | Bahel et al. |
| 5,691,692 A | 11/1997 | Herbstritt |
| 5,694,010 A | 12/1997 | Oomura et al. |
| 5,696,501 A | 12/1997 | Ouellette et al. |
| 5,699,670 A | 12/1997 | Jurewicz et al. |
| 5,706,007 A | 1/1998 | Fragnito et al. |
| 5,707,210 A | 1/1998 | Ramsey et al. |
| 5,711,785 A | 1/1998 | Maxwell |
| 5,713,724 A | 2/1998 | Centers et al. |
| 5,714,931 A | 2/1998 | Petite et al. |
| 5,715,704 A | 2/1998 | Cholkeri et al. |
| 5,718,822 A | 2/1998 | Richter |
| 5,724,571 A | 3/1998 | Woods |
| 5,729,474 A | 3/1998 | Hildebrand et al. |
| 5,737,931 A | 4/1998 | Ueno et al. |
| 5,741,120 A | 4/1998 | Bass et al. |
| 5,743,109 A | 4/1998 | Schulak |
| 5,745,114 A | 4/1998 | King et al. |
| 5,749,238 A | 5/1998 | Schmidt |
| 5,751,916 A | 5/1998 | Kon et al. |
| 5,752,385 A | 5/1998 | Nelson |
| 5,754,450 A | 5/1998 | Solomon et al. |
| 5,754,732 A | 5/1998 | Vlahu |
| 5,757,664 A | 5/1998 | Rogers et al. |
| 5,757,892 A | 5/1998 | Blanchard et al. |
| 5,761,083 A | 6/1998 | Brown, Jr. et al. |
| 5,764,509 A | 6/1998 | Gross et al. |
| 5,772,214 A | 6/1998 | Stark |
| 5,772,403 A | 6/1998 | Allison et al. |
| 5,784,232 A | 7/1998 | Farr |
| 5,790,898 A | 8/1998 | Kishima et al. |
| 5,795,381 A | 8/1998 | Holder |
| 5,798,941 A | 8/1998 | McLeister |
| 5,805,856 A | 9/1998 | Hanson |
| 5,807,336 A | 9/1998 | Russo et al. |
| 5,808,441 A | 9/1998 | Nehring |
| 5,810,908 A | 9/1998 | Gray et al. |
| 5,812,061 A | 9/1998 | Simons |
| 5,825,597 A | 10/1998 | Young |
| 5,827,963 A | 10/1998 | Selegatto et al. |
| 5,839,094 A | 11/1998 | French |
| 5,839,291 A | 11/1998 | Chang |
| 5,841,654 A | 11/1998 | Verissimo et al. |
| 5,860,286 A | 1/1999 | Tulpule |
| 5,861,807 A | 1/1999 | Leyden et al. |
| 5,867,998 A | 2/1999 | Guertin |
| 5,869,960 A | 2/1999 | Brand |
| 5,873,257 A | 2/1999 | Peterson |
| 5,875,430 A | 2/1999 | Koether |
| 5,875,638 A | 3/1999 | Tinsler |

(56) References Cited

U.S. PATENT DOCUMENTS

| | | | |
|---|---|---|---|
| 5,884,494 | A | 3/1999 | Okoren et al. |
| 5,887,786 | A | 3/1999 | Sandelman |
| 5,900,801 | A | 5/1999 | Heagle et al. |
| 5,904,049 | A | 5/1999 | Jaster et al. |
| 5,918,200 | A | 6/1999 | Tsutsui et al. |
| 5,924,295 | A | 7/1999 | Park |
| 5,924,486 | A | 7/1999 | Ehlers et al. |
| 5,926,103 | A | 7/1999 | Petite |
| 5,926,531 | A | 7/1999 | Petite |
| 5,930,773 | A | 7/1999 | Crooks et al. |
| 5,934,087 | A | 8/1999 | Watanabe et al. |
| 5,939,974 | A | 8/1999 | Heagle et al. |
| 5,946,922 | A | 9/1999 | Viard et al. |
| 5,947,693 | A | 9/1999 | Yang |
| 5,947,701 | A | 9/1999 | Hugenroth |
| 5,949,677 | A | 9/1999 | Ho |
| 5,953,490 | A | 9/1999 | Wiklund et al. |
| 5,956,658 | A | 9/1999 | McMahon |
| 5,971,712 | A | 10/1999 | Kann |
| 5,975,854 | A | 11/1999 | Culp, III et al. |
| 5,984,645 | A | 11/1999 | Cummings |
| 5,986,571 | A | 11/1999 | Flick |
| 5,988,986 | A | 11/1999 | Brinken et al. |
| 5,995,347 | A | 11/1999 | Rudd et al. |
| 5,995,351 | A | 11/1999 | Katsumata et al. |
| 6,006,142 | A | 12/1999 | Seem et al. |
| 6,006,171 | A | 12/1999 | Vines et al. |
| 6,013,108 | A | 1/2000 | Karolys et al. |
| 6,017,192 | A | 1/2000 | Clack et al. |
| 6,020,702 | A | 2/2000 | Farr |
| 6,023,420 | A | 2/2000 | McCormick et al. |
| 6,026,651 | A | 2/2000 | Sandelman |
| 6,028,522 | A | 2/2000 | Petite |
| 6,035,661 | A | 3/2000 | Sunaga et al. |
| 6,038,871 | A | 3/2000 | Gutierrez et al. |
| 6,041,605 | A | 3/2000 | Heinrichs |
| 6,041,609 | A | 3/2000 | Hornsleth et al. |
| 6,041,856 | A | 3/2000 | Thrasher et al. |
| 6,042,344 | A | 3/2000 | Lifson |
| 6,044,062 | A | 3/2000 | Brownrigg et al. |
| 6,047,557 | A | 4/2000 | Pham et al. |
| 6,050,098 | A | 4/2000 | Meyer et al. |
| 6,050,780 | A | 4/2000 | Hasegawa et al. |
| 6,052,731 | A | 4/2000 | Holdsworth et al. |
| 6,057,771 | A | 5/2000 | Lakra |
| 6,065,946 | A | 5/2000 | Lathrop |
| 6,068,447 | A | 5/2000 | Foege |
| 6,070,110 | A | 5/2000 | Shah et al. |
| 6,075,530 | A | 6/2000 | Lucas et al. |
| 6,077,051 | A | 6/2000 | Centers et al. |
| 6,081,750 | A | 6/2000 | Hoffberg et al. |
| 6,082,495 | A | 7/2000 | Steinbarger et al. |
| 6,082,971 | A | 7/2000 | Gunn et al. |
| 6,085,530 | A | 7/2000 | Barito |
| 6,088,659 | A | 7/2000 | Kelley et al. |
| 6,088,688 | A | 7/2000 | Crooks et al. |
| 6,092,370 | A | 7/2000 | Tremoulet, Jr. et al. |
| 6,092,378 | A | 7/2000 | Das et al. |
| 6,092,992 | A | 7/2000 | Imblum et al. |
| 6,095,674 | A | 8/2000 | Verissimo et al. |
| 6,098,893 | A | 8/2000 | Berglund et al. |
| 6,102,665 | A | 8/2000 | Centers et al. |
| 6,110,260 | A | 8/2000 | Kubokawa |
| 6,119,949 | A | 9/2000 | Lindstrom |
| 6,122,603 | A | 9/2000 | Budike, Jr. |
| 6,125,642 | A | 10/2000 | Seener et al. |
| 6,128,583 | A * | 10/2000 | Dowling ............... 702/58 |
| 6,128,953 | A | 10/2000 | Mizukoshi |
| 6,129,527 | A | 10/2000 | Donahoe et al. |
| 6,138,461 | A | 10/2000 | Park et al. |
| 6,142,741 | A | 11/2000 | Nishihata et al. |
| 6,144,888 | A | 11/2000 | Lucas et al. |
| 6,145,328 | A | 11/2000 | Choi |
| 6,147,601 | A | 11/2000 | Sandelman et al. |
| 6,152,375 | A | 11/2000 | Robison |
| 6,152,376 | A | 11/2000 | Sandelman et al. |
| 6,153,942 | A | 11/2000 | Roseman et al. |
| 6,154,488 | A | 11/2000 | Hunt |
| 6,157,310 | A | 12/2000 | Milne et al. |
| 6,158,230 | A | 12/2000 | Katsuki |
| 6,160,477 | A | 12/2000 | Sandelman et al. |
| 6,169,979 | B1 | 1/2001 | Johnson |
| 6,172,476 | B1 | 1/2001 | Tolbert, Jr. et al. |
| 6,174,136 | B1 | 1/2001 | Kilayko et al. |
| 6,176,686 | B1 | 1/2001 | Wallis et al. |
| 6,177,884 | B1 | 1/2001 | Hunt et al. |
| 6,178,362 | B1 | 1/2001 | Woolard et al. |
| 6,179,214 | B1 | 1/2001 | Key et al. |
| 6,190,442 | B1 | 2/2001 | Redner |
| 6,191,545 | B1 | 2/2001 | Kawabata et al. |
| 6,192,282 | B1 | 2/2001 | Smith et al. |
| 6,199,018 | B1 | 3/2001 | Quist et al. |
| 6,211,782 | B1 | 4/2001 | Sandelman et al. |
| 6,213,731 | B1 | 4/2001 | Doepker et al. |
| 6,215,405 | B1 | 4/2001 | Handley et al. |
| 6,216,956 | B1 | 4/2001 | Ehlers et al. |
| 6,218,953 | B1 | 4/2001 | Petite |
| 6,223,543 | B1 | 5/2001 | Sandelman |
| 6,223,544 | B1 | 5/2001 | Seem |
| 6,228,155 | B1 | 5/2001 | Tai |
| 6,230,501 | B1 | 5/2001 | Bailey, Sr. et al. |
| 6,233,327 | B1 | 5/2001 | Petite |
| 6,234,019 | B1 | 5/2001 | Caldeira |
| 6,240,733 | B1 | 6/2001 | Brandon et al. |
| 6,240,736 | B1 | 6/2001 | Fujita et al. |
| 6,244,061 | B1 | 6/2001 | Takagi et al. |
| 6,249,516 | B1 | 6/2001 | Brownrigg et al. |
| 6,260,004 | B1 | 7/2001 | Hays et al. |
| 6,266,968 | B1 | 7/2001 | Redlich |
| 6,268,664 | B1 | 7/2001 | Rolls et al. |
| 6,272,868 | B1 | 8/2001 | Grabon et al. |
| 6,276,901 | B1 | 8/2001 | Farr et al. |
| 6,279,332 | B1 | 8/2001 | Yeo et al. |
| 6,290,043 | B1 | 9/2001 | Ginder et al. |
| 6,293,114 | B1 | 9/2001 | Kamemoto |
| 6,293,767 | B1 | 9/2001 | Bass |
| 6,302,654 | B1 | 10/2001 | Millet et al. |
| 6,304,934 | B1 | 10/2001 | Pimenta et al. |
| 6,324,854 | B1 | 12/2001 | Jayanth |
| 6,327,541 | B1 | 12/2001 | Pitchford et al. |
| 6,332,327 | B1 | 12/2001 | Street et al. |
| 6,334,093 | B1 | 12/2001 | More |
| 6,349,883 | B1 | 2/2002 | Simmons et al. |
| 6,359,410 | B1 | 3/2002 | Randolph |
| 6,360,551 | B1 | 3/2002 | Renders |
| 6,366,889 | B1 | 4/2002 | Zaloom |
| 6,375,439 | B1 | 4/2002 | Missio |
| 6,378,315 | B1 | 4/2002 | Gelber et al. |
| 6,381,971 | B2 | 5/2002 | Honda |
| 6,385,510 | B1 | 5/2002 | Hoog et al. |
| 6,389,823 | B1 | 5/2002 | Loprete et al. |
| 6,390,779 | B1 | 5/2002 | Cunkelman |
| 6,391,102 | B1 | 5/2002 | Bodden et al. |
| 6,393,848 | B2 | 5/2002 | Roh et al. |
| 6,397,606 | B1 | 6/2002 | Roh et al. |
| 6,397,612 | B1 | 6/2002 | Kernkamp et al. |
| 6,406,265 | B1 | 6/2002 | Hahn et al. |
| 6,406,266 | B1 | 6/2002 | Hugenroth et al. |
| 6,408,228 | B1 | 6/2002 | Seem et al. |
| 6,408,258 | B1 | 6/2002 | Richer |
| 6,412,293 | B1 | 7/2002 | Pham et al. |
| 6,414,594 | B1 | 7/2002 | Guerlain |
| 6,430,268 | B1 | 8/2002 | Petite |
| 6,433,791 | B2 | 8/2002 | Selli et al. |
| 6,437,691 | B1 | 8/2002 | Sandelman et al. |
| 6,437,692 | B1 | 8/2002 | Petite et al. |
| 6,438,981 | B1 | 8/2002 | Whiteside |
| 6,442,953 | B1 | 9/2002 | Trigiani et al. |
| 6,449,972 | B2 | 9/2002 | Pham et al. |
| 6,450,771 | B1 | 9/2002 | Centers et al. |
| 6,451,210 | B1 | 9/2002 | Sivavec et al. |
| 6,453,687 | B2 | 9/2002 | Sharood et al. |
| 6,454,177 | B1 | 9/2002 | Sasao et al. |
| 6,454,538 | B1 | 9/2002 | Witham et al. |

(56) References Cited

U.S. PATENT DOCUMENTS

| | | | |
|---|---|---|---|
| 6,456,928 B1 | 9/2002 | Johnson | |
| 6,457,319 B1 | 10/2002 | Ota et al. | |
| 6,457,948 B1 | 10/2002 | Pham | |
| 6,460,731 B2 | 10/2002 | Estelle et al. | |
| 6,462,654 B1 | 10/2002 | Sandelman et al. | |
| 6,463,747 B1 | 10/2002 | Temple | |
| 6,466,971 B1 | 10/2002 | Humpleman et al. | |
| 6,467,280 B2 | 10/2002 | Pham et al. | |
| 6,471,486 B1 | 10/2002 | Centers et al. | |
| 6,474,084 B2 | 11/2002 | Gauthier et al. | |
| 6,484,520 B2 | 11/2002 | Kawaguchi et al. | |
| 6,487,457 B1 | 11/2002 | Hull et al. | |
| 6,490,506 B1 | 12/2002 | March | |
| 6,492,923 B1 | 12/2002 | Inoue et al. | |
| 6,497,554 B2 | 12/2002 | Yang et al. | |
| 6,501,240 B2 | 12/2002 | Ueda et al. | 318/135 |
| 6,501,629 B1 | 12/2002 | Marriott | |
| 6,502,409 B1 | 1/2003 | Gatling et al. | |
| 6,505,087 B1 | 1/2003 | Lucas et al. | |
| 6,505,475 B1 | 1/2003 | Zugibe et al. | |
| 6,510,350 B1 | 1/2003 | Steen, III et al. | |
| 6,522,974 B2 | 2/2003 | Sitton | |
| 6,523,130 B1 | 2/2003 | Hickman et al. | |
| 6,526,766 B1 | 3/2003 | Hiraoka et al. | |
| 6,529,590 B1 | 3/2003 | Centers | |
| 6,529,839 B1 | 3/2003 | Uggerud et al. | |
| 6,533,552 B2 | 3/2003 | Centers et al. | |
| 6,535,123 B2 | 3/2003 | Sandelman et al. | |
| 6,535,859 B1 | 3/2003 | Yablonowski et al. | |
| 6,537,034 B2 | 3/2003 | Park et al. | |
| 6,542,062 B1 | 4/2003 | Herrick | |
| 6,549,135 B2 | 4/2003 | Singh et al. | |
| 6,551,069 B2 | 4/2003 | Narney, II et al. | |
| 6,553,774 B1 | 4/2003 | Ishio et al. | |
| 6,558,126 B1 | 5/2003 | Hahn et al. | |
| 6,560,976 B2 | 5/2003 | Jayanth | |
| 6,571,280 B1 | 5/2003 | Hubacher | |
| 6,571,566 B1 | 6/2003 | Temple et al. | |
| 6,574,561 B2 | 6/2003 | Alexander et al. | |
| 6,577,959 B1 | 6/2003 | Chajec et al. | |
| 6,577,962 B1 | 6/2003 | Afshari | |
| 6,578,373 B1 | 6/2003 | Barbier | |
| 6,583,720 B1 | 6/2003 | Quigley | |
| 6,591,620 B2 | 7/2003 | Kikuchi et al. | |
| 6,595,475 B2 | 7/2003 | Svabek et al. | |
| 6,595,757 B2 | 7/2003 | Shen | |
| 6,598,056 B1 | 7/2003 | Hull et al. | |
| 6,601,397 B2 | 8/2003 | Pham et al. | |
| 6,604,093 B1 | 8/2003 | Etzion et al. | |
| 6,609,070 B1 | 8/2003 | Lueck | |
| 6,609,078 B2 | 8/2003 | Starling et al. | |
| 6,615,594 B2 | 9/2003 | Jayanth et al. | |
| 6,616,415 B1 | 9/2003 | Renken et al. | |
| 6,618,578 B1 | 9/2003 | Petite | |
| 6,618,709 B1 | 9/2003 | Sneeringer | |
| 6,621,443 B1 | 9/2003 | Selli et al. | |
| 6,622,925 B2 | 9/2003 | Carner et al. | |
| 6,622,926 B1 | 9/2003 | Sartain et al. | |
| 6,628,764 B1 | 9/2003 | Petite | |
| 6,629,420 B2 | 10/2003 | Renders | |
| 6,631,298 B1 | 10/2003 | Pagnano et al. | |
| 6,636,893 B1 | 10/2003 | Fong | |
| 6,643,567 B2 | 11/2003 | Kolk et al. | |
| 6,644,848 B1 | 11/2003 | Clayton et al. | |
| 6,647,735 B2 | 11/2003 | Street et al. | |
| 6,658,373 B2 | 12/2003 | Rossi et al. | |
| 6,662,584 B1 | 12/2003 | Whiteside | |
| 6,662,653 B1 | 12/2003 | Scaliante et al. | |
| 6,671,586 B2 | 12/2003 | Davis et al. | |
| 6,675,591 B2 | 1/2004 | Singh et al. | |
| 6,679,072 B2 | 1/2004 | Pham et al. | |
| 6,684,349 B2 | 1/2004 | Gullo et al. | |
| 6,685,438 B2 | 2/2004 | Yoo et al. | |
| 6,698,218 B2 | 3/2004 | Goth et al. | |
| 6,701,725 B2 | 3/2004 | Rossi et al. | |
| 6,708,083 B2 | 3/2004 | Orthlieb et al. | |
| 6,708,508 B2 | 3/2004 | Demuth et al. | |
| 6,709,244 B2 | 3/2004 | Pham | |
| 6,711,470 B1 | 3/2004 | Hartenstein et al. | |
| 6,711,911 B1 | 3/2004 | Grabon et al. | |
| 6,717,513 B1 | 4/2004 | Sandelman et al. | |
| 6,721,770 B1 | 4/2004 | Morton et al. | |
| 6,725,182 B2 | 4/2004 | Pagnano et al. | |
| 6,732,538 B2 | 5/2004 | Trigiani et al. | |
| 6,745,107 B1 | 6/2004 | Miller | |
| 6,747,557 B1 | 6/2004 | Petite et al. | |
| 6,758,050 B2 | 7/2004 | Jayanth et al. | |
| 6,758,051 B2 | 7/2004 | Jayanth et al. | |
| 6,760,207 B2 | 7/2004 | Wyatt et al. | |
| 6,772,096 B2 | 8/2004 | Murakami et al. | |
| 6,772,598 B1 | 8/2004 | Rinehart | |
| 6,775,995 B1 | 8/2004 | Bahel et al. | |
| 6,784,807 B2 | 8/2004 | Petite et al. | |
| 6,785,592 B1 | 8/2004 | Smith et al. | |
| 6,786,473 B1 | 9/2004 | Alles | |
| 6,799,951 B2 | 10/2004 | Lifson et al. | |
| 6,804,993 B2 | 10/2004 | Selli | |
| 6,811,380 B2 | 11/2004 | Kim | |
| 6,816,811 B2 | 11/2004 | Seem | |
| 6,823,680 B2 | 11/2004 | Jayanth | |
| 6,829,542 B1 | 12/2004 | Reynolds et al. | |
| 6,832,120 B1 | 12/2004 | Frank et al. | |
| 6,832,898 B2 | 12/2004 | Yoshida et al. | 417/44.11 |
| 6,836,737 B2 | 12/2004 | Petite et al. | |
| 6,837,922 B2 | 1/2005 | Gorin | |
| 6,839,790 B2 | 1/2005 | Barros De Almeida et al. | |
| 6,854,345 B2 | 2/2005 | Alves et al. | |
| 6,862,498 B2 | 3/2005 | Davis et al. | |
| 6,868,678 B2 | 3/2005 | Mei et al. | |
| 6,868,686 B2 | 3/2005 | Ueda et al. | |
| 6,869,272 B2 | 3/2005 | Odachi et al. | |
| 6,870,486 B2 | 3/2005 | Souza et al. | |
| 6,885,949 B2 | 4/2005 | Selli | |
| 6,889,173 B2 | 5/2005 | Singh | |
| 6,891,838 B1 | 5/2005 | Petite et al. | |
| 6,892,546 B2 | 5/2005 | Singh et al. | |
| 6,897,772 B1 | 5/2005 | Scheffler et al. | |
| 6,900,738 B2 | 5/2005 | Crichlow | |
| 6,901,066 B1 | 5/2005 | Helgeson | |
| 6,904,385 B1 | 6/2005 | Budike, Jr. | |
| 6,914,533 B2 | 7/2005 | Petite | |
| 6,914,893 B2 | 7/2005 | Petite | |
| 6,922,155 B1 | 7/2005 | Evans et al. | |
| 6,931,445 B2 | 8/2005 | Davis | |
| 6,934,862 B2 | 8/2005 | Sharood et al. | |
| 6,952,658 B2 | 10/2005 | Greulich et al. | |
| 6,956,344 B2 | 10/2005 | Robertson et al. | |
| 6,964,558 B2 | 11/2005 | Hahn et al. | |
| 6,966,759 B2 | 11/2005 | Hahn et al. | |
| 6,968,295 B1 | 11/2005 | Carr | |
| 6,973,410 B2 | 12/2005 | Seigel | |
| 6,973,793 B2 | 12/2005 | Douglas et al. | |
| 6,973,794 B2 | 12/2005 | Street et al. | |
| 6,976,366 B2 | 12/2005 | Starling et al. | |
| 6,978,225 B2 | 12/2005 | Retlich et al. | |
| 6,981,384 B2 | 1/2006 | Dobmeier et al. | |
| 6,983,321 B2 | 1/2006 | Trinon et al. | |
| 6,983,889 B2 | 1/2006 | Alles | |
| 6,986,469 B2 | 1/2006 | Gauthier et al. | |
| 6,987,450 B2 | 1/2006 | Marino et al. | |
| 6,990,821 B2 | 1/2006 | Singh et al. | |
| 6,996,441 B1 | 2/2006 | Tobias | |
| 6,997,390 B2 | 2/2006 | Alles | |
| 6,998,963 B2 | 2/2006 | Flen et al. | |
| 6,999,996 B2 | 2/2006 | Sunderland | |
| 7,000,422 B2 | 2/2006 | Street et al. | |
| 7,003,378 B2 | 2/2006 | Poth | |
| 7,009,510 B1 | 3/2006 | Douglass et al. | |
| 7,010,925 B2 | 3/2006 | Sienel et al. | |
| 7,019,667 B2 | 3/2006 | Petite et al. | |
| 7,024,665 B2 | 4/2006 | Ferraz et al. | |
| 7,024,870 B2 | 4/2006 | Singh et al. | |
| 7,030,752 B2 | 4/2006 | Tyroler | |
| 7,031,880 B1 | 4/2006 | Seem et al. | |

(56) References Cited

U.S. PATENT DOCUMENTS

| | | | |
|---|---|---|---|
| 7,035,693 | B2 | 4/2006 | Cassiolato et al. |
| 7,039,532 | B2 | 5/2006 | Hunter |
| 7,042,350 | B2 | 5/2006 | Patrick et al. |
| 7,043,339 | B2 | 5/2006 | Maeda et al. |
| 7,043,459 | B2 | 5/2006 | Peevey |
| 7,047,753 | B2 | 5/2006 | Street et al. |
| 7,053,766 | B2 | 5/2006 | Fisler et al. |
| 7,053,767 | B2 | 5/2006 | Petite et al. |
| 7,054,271 | B2 | 5/2006 | Brownrigg et al. |
| 7,062,580 | B2 | 6/2006 | Donaires |
| 7,062,830 | B2 | 6/2006 | Alles |
| 7,063,537 | B2 | 6/2006 | Selli et al. |
| 7,072,797 | B2 | 7/2006 | Gorinevsky |
| 7,075,327 | B2 | 7/2006 | Dimino et al. |
| 7,079,810 | B2 | 7/2006 | Petite et al. |
| 7,079,967 | B2 | 7/2006 | Rossi et al. |
| 7,082,380 | B2 | 7/2006 | Wiebe et al. |
| 7,089,125 | B2 | 8/2006 | Sonderegger |
| 7,091,847 | B2 | 8/2006 | Capowski et al. |
| 7,092,767 | B2 | 8/2006 | Pagnano et al. |
| 7,092,794 | B1 | 8/2006 | Hill et al. |
| 7,096,153 | B2 | 8/2006 | Guralnik et al. |
| 7,102,490 | B2 | 9/2006 | Flen et al. |
| 7,103,511 | B2 | 9/2006 | Petite |
| 7,110,843 | B2 | 9/2006 | Pagnano et al. |
| 7,110,898 | B2 | 9/2006 | Montijo et al. |
| 7,113,376 | B2 | 9/2006 | Nomura et al. |
| 7,114,343 | B2 | 10/2006 | Kates |
| 7,123,020 | B2 | 10/2006 | Hill et al. |
| 7,123,458 | B2 | 10/2006 | Mohr et al. |
| 7,126,465 | B2 | 10/2006 | Faltesek |
| 7,130,170 | B2 | 10/2006 | Wakefield et al. |
| 7,130,832 | B2 | 10/2006 | Bannai et al. |
| 7,134,295 | B2 | 11/2006 | Maekawa |
| 7,137,550 | B1 | 11/2006 | Petite |
| 7,142,125 | B2 | 11/2006 | Larson et al. |
| 7,145,438 | B2 | 12/2006 | Flen et al. |
| 7,145,462 | B2 | 12/2006 | Dewing et al. |
| 7,159,408 | B2 | 1/2007 | Sadegh et al. |
| 7,162,884 | B2 | 1/2007 | Alles |
| 7,163,158 | B2 | 1/2007 | Rossi et al. |
| 7,171,372 | B2 | 1/2007 | Daniel et al. |
| 7,174,728 | B2 | 2/2007 | Jayanth |
| 7,180,412 | B2 | 2/2007 | Bonicatto et al. |
| 7,184,861 | B2 | 2/2007 | Petite |
| 7,188,482 | B2 | 3/2007 | Sadegh et al. |
| 7,188,779 | B2 | 3/2007 | Alles |
| 7,201,006 | B2 | 4/2007 | Kates |
| 7,207,496 | B2 | 4/2007 | Alles |
| 7,209,840 | B2 | 4/2007 | Petite et al. |
| 7,212,887 | B2 | 5/2007 | Shah et al |
| 7,222,493 | B2 | 5/2007 | Jayanth et al. |
| 7,224,740 | B2 | 5/2007 | Hunt |
| 7,225,193 | B2 | 5/2007 | Mets et al. |
| 7,227,450 | B2 | 6/2007 | Garvy et al. |
| 7,228,691 | B2 | 6/2007 | Street et al. |
| 7,230,528 | B2 | 6/2007 | Kates |
| 7,234,313 | B2 | 6/2007 | Bell et al. |
| 7,236,765 | B2 | 6/2007 | Bonicatto et al. |
| 7,244,294 | B2 | 7/2007 | Kates |
| 7,246,014 | B2 | 7/2007 | Forth et al. |
| 7,255,285 | B2 | 8/2007 | Troost et al. |
| 7,257,501 | B2 | 8/2007 | Zhan et al. |
| 7,260,505 | B2 | 8/2007 | Felke et al. |
| 7,261,762 | B2 | 8/2007 | Kang et al. |
| 7,263,073 | B2 | 8/2007 | Petite et al. |
| 7,263,446 | B2 | 8/2007 | Morin et al. |
| 7,266,812 | B2 | 9/2007 | Pagnano |
| 7,270,278 | B2 | 9/2007 | Street et al. |
| 7,274,995 | B2 | 9/2007 | Zhan et al. |
| 7,275,377 | B2 | 10/2007 | Kates |
| 7,286,945 | B2 | 10/2007 | Zhan et al. |
| 7,290,398 | B2 | 11/2007 | Wallace et al. |
| 7,295,128 | B2 | 11/2007 | Petite |
| 7,295,896 | B2 | 11/2007 | Norbeck |
| 7,317,952 | B2 | 1/2008 | Bhandiwad et al. |
| 7,328,192 | B1 | 2/2008 | Stengard et al. |
| 7,330,886 | B2 | 2/2008 | Childers et al. |
| 7,331,187 | B2 | 2/2008 | Kates |
| 7,336,168 | B2 | 2/2008 | Kates |
| 7,337,191 | B2 | 2/2008 | Haeberle et al. |
| 7,343,750 | B2 | 3/2008 | Lifson et al. |
| 7,343,751 | B2 | 3/2008 | Kates |
| 7,346,463 | B2 | 3/2008 | Petite et al. |
| 7,346,472 | B1 | 3/2008 | Moskowitz et al. |
| 7,349,824 | B2 | 3/2008 | Seigel |
| 7,350,112 | B2 | 3/2008 | Fox et al. |
| 7,351,274 | B2 | 4/2008 | Helt et al. |
| 7,363,200 | B2 | 4/2008 | Lu |
| 7,376,712 | B1 | 5/2008 | Granatelli et al. |
| 7,377,118 | B2 | 5/2008 | Esslinger |
| 7,383,030 | B2 | 6/2008 | Brown et al. |
| 7,383,158 | B2 | 6/2008 | Krocker et al. |
| 7,392,661 | B2 | 7/2008 | Alles |
| 7,397,907 | B2 | 7/2008 | Petite |
| 7,400,240 | B2 | 7/2008 | Shrode et al. |
| 7,412,842 | B2 | 8/2008 | Pham |
| 7,414,525 | B2 | 8/2008 | Costea et al. |
| 7,421,351 | B2 | 9/2008 | Navratil |
| 7,421,374 | B2 | 9/2008 | Zhan et al. |
| 7,421,850 | B2 | 9/2008 | Street et al. |
| 7,424,343 | B2 | 9/2008 | Kates |
| 7,424,345 | B2 | 9/2008 | Norbeck |
| 7,424,527 | B2 | 9/2008 | Petite |
| 7,432,824 | B2 | 10/2008 | Flen et al. |
| 7,433,854 | B2 | 10/2008 | Joseph et al. |
| 7,434,742 | B2 | 10/2008 | Mueller et al. |
| 7,437,150 | B1 | 10/2008 | Morelli et al. |
| 7,440,560 | B1 | 10/2008 | Barry |
| 7,440,767 | B2 | 10/2008 | Ballay et al. |
| 7,443,313 | B2 | 10/2008 | Davis et al. |
| 7,445,665 | B2 | 11/2008 | Hsieh et al. |
| 7,447,603 | B2 | 11/2008 | Bruno |
| 7,447,609 | B2 | 11/2008 | Guralnik et al. |
| 7,451,606 | B2 | 11/2008 | Harrod |
| 7,454,439 | B1 | 11/2008 | Gansner et al. |
| 7,458,223 | B2 | 12/2008 | Pham |
| 7,468,661 | B2 | 12/2008 | Petite et al. |
| 7,469,546 | B2 | 12/2008 | Kates |
| 7,474,992 | B2 | 1/2009 | Ariyur |
| 7,480,501 | B2 | 1/2009 | Petite |
| 7,483,810 | B2 | 1/2009 | Jackson et al. |
| 7,484,376 | B2 | 2/2009 | Pham |
| 7,490,477 | B2 | 2/2009 | Singh et al. |
| 7,491,034 | B2 | 2/2009 | Jayanth |
| 7,503,182 | B2 | 3/2009 | Bahel et al. |
| 7,510,126 | B2 | 3/2009 | Rossi et al. |
| 7,523,619 | B2 | 4/2009 | Kojima et al. |
| 7,528,711 | B2 | 5/2009 | Kates |
| 7,533,070 | B2 | 5/2009 | Guralnik et al. |
| 7,537,172 | B2 | 5/2009 | Rossi et al. |
| 7,552,030 | B2 | 6/2009 | Guralnik et al. |
| 7,555,364 | B2 | 6/2009 | Poth et al. |
| 7,574,333 | B2 | 8/2009 | Lu |
| 7,580,812 | B2 | 8/2009 | Ariyur et al. |
| 7,594,407 | B2 | 9/2009 | Singh et al. |
| 7,596,959 | B2 | 10/2009 | Singh et al. |
| 7,606,683 | B2 | 10/2009 | Bahel et al. |
| 7,631,508 | B2 | 12/2009 | Braun et al. |
| 7,636,901 | B2 | 12/2009 | Munson et al. |
| 7,644,591 | B2 | 1/2010 | Singh et al. |
| 7,648,077 | B2 | 1/2010 | Rossi et al. |
| 7,648,342 | B2 | 1/2010 | Jayanth |
| 7,650,425 | B2 | 1/2010 | Davis et al. |
| 7,660,700 | B2 | 2/2010 | Moskowitz et al. |
| 7,660,774 | B2 | 2/2010 | Mukherjee et al. |
| 7,664,613 | B2 | 2/2010 | Hansen |
| 7,665,315 | B2 | 2/2010 | Singh et al. |
| 7,686,872 | B2 | 3/2010 | Kang |
| 7,693,809 | B2 | 4/2010 | Gray |
| 7,697,492 | B2 | 4/2010 | Petite |
| 7,703,694 | B2 | 4/2010 | Mueller et al. |
| 7,704,052 | B2 | 4/2010 | Iimura et al. |
| 7,706,320 | B2 | 4/2010 | Davis et al. |

(56) References Cited

U.S. PATENT DOCUMENTS

| | | | |
|---|---|---|---|
| 7,724,131 B2 | 5/2010 | Chen |
| 7,726,583 B2 | 6/2010 | Maekawa |
| 7,734,451 B2 | 6/2010 | MacArthur et al. |
| 7,738,999 B2 | 6/2010 | Petite |
| 7,739,378 B2 | 6/2010 | Petite |
| 7,742,393 B2 | 6/2010 | Bonicatto et al. |
| 7,752,853 B2 | 7/2010 | Singh et al. |
| 7,752,854 B2 | 7/2010 | Singh et al. |
| 7,756,086 B2 | 7/2010 | Petite et al. |
| 7,791,468 B2 | 9/2010 | Bonicatto et al. |
| 7,844,366 B2 | 11/2010 | Singh |
| 7,845,179 B2 | 12/2010 | Singh et al. |
| 7,848,827 B2 | 12/2010 | Chen |
| 7,848,900 B2 | 12/2010 | Steinberg et al. |
| 7,877,218 B2 | 1/2011 | Bonicatto et al. |
| 7,885,959 B2 | 2/2011 | Horowitz et al. |
| 7,885,961 B2 | 2/2011 | Horowitz et al. |
| 7,905,098 B2 | 3/2011 | Pham |
| 7,908,116 B2 | 3/2011 | Steinberg et al. |
| 7,908,117 B2 | 3/2011 | Steinberg et al. |
| 7,922,914 B1 | 4/2011 | Verdegan et al. |
| 7,937,623 B2 | 5/2011 | Ramacher et al. |
| 7,941,294 B2 | 5/2011 | Shahi et al. |
| 7,949,494 B2 | 5/2011 | Moskowitz et al. |
| 7,949,615 B2 | 5/2011 | Ehlers et al. |
| 7,963,454 B2 | 6/2011 | Sullivan et al. |
| 7,966,152 B2 | 6/2011 | Stluka et al. |
| 7,967,218 B2 | 6/2011 | Alles |
| 7,978,059 B2 | 7/2011 | Petite et al. |
| 7,987,679 B2 | 8/2011 | Tanaka et al. |
| 7,996,045 B1 | 8/2011 | Bauer et al. |
| 7,999,668 B2 | 8/2011 | Cawthorne et al. |
| 8,000,314 B2 | 8/2011 | Brownrigg et al. |
| 8,002,199 B2 | 8/2011 | Habegger |
| 8,005,640 B2 | 8/2011 | Chiefetz et al. |
| 8,010,237 B2 | 8/2011 | Cheung et al. |
| 8,013,732 B2 | 9/2011 | Petite et al. |
| 8,019,567 B2 | 9/2011 | Steinberg et al. |
| 8,029,608 B1 | 10/2011 | Breslin |
| 8,031,650 B2 | 10/2011 | Petite et al. |
| 8,034,170 B2 | 10/2011 | Kates |
| 8,036,844 B2 | 10/2011 | Ling et al. |
| 8,040,231 B2 | 10/2011 | Kuruvila et al. |
| 8,041,539 B2 | 10/2011 | Guralnik et al. |
| 8,046,107 B2 | 10/2011 | Zugibe et al. |
| 8,061,417 B2 | 11/2011 | Gray |
| 8,064,412 B2 | 11/2011 | Petite |
| 8,065,886 B2 | 11/2011 | Singh et al. |
| 8,068,997 B2 | 11/2011 | Ling et al. |
| 8,090,477 B1 | 1/2012 | Steinberg |
| 8,090,559 B2 | 1/2012 | Parthasarathy et al. |
| 8,090,824 B2 | 1/2012 | Tran et al. |
| 8,095,337 B2 | 1/2012 | Kolbet et al. |
| 8,108,200 B2 | 1/2012 | Anne et al. |
| 8,125,230 B2 | 2/2012 | Bharadwaj et al. |
| 8,131,497 B2 | 3/2012 | Steinberg et al. |
| 8,131,506 B2 | 3/2012 | Steinberg et al. |
| 8,134,330 B2 | 3/2012 | Alles |
| 8,150,720 B2 | 4/2012 | Singh et al. |
| 8,156,208 B2 | 4/2012 | Bornhoevd et al. |
| 8,170,968 B2 | 5/2012 | Colclough et al. |
| 8,171,136 B2 | 5/2012 | Petite |
| 8,175,846 B2 | 5/2012 | Khalak et al. |
| 8,180,492 B2 | 5/2012 | Steinberg |
| 8,182,579 B2 | 5/2012 | Woo et al. |
| 8,214,175 B2 | 7/2012 | Moskowitz et al. |
| 8,239,922 B2 | 8/2012 | Sullivan et al. |
| 8,258,763 B2 | 9/2012 | Nakamura et al. |
| 8,280,536 B1 | 10/2012 | Fadell et al. |
| 8,328,524 B2 | 12/2012 | Iimura et al. |
| 8,380,556 B2 | 2/2013 | Singh et al. |
| 2001/0005320 A1 | 6/2001 | Ueda et al. ............ 363/95 |
| 2001/0054291 A1 | 12/2001 | Roh et al. |
| 2001/0054293 A1 | 12/2001 | Gustafson et al. |
| 2002/0000092 A1 | 1/2002 | Sharood et al. |
| 2002/0013679 A1 | 1/2002 | Petite |
| 2002/0016639 A1 | 2/2002 | Smith et al. |
| 2002/0017057 A1 | 2/2002 | Weder |
| 2002/0018724 A1 | 2/2002 | Millet et al. |
| 2002/0020175 A1 | 2/2002 | Street et al. |
| 2002/0029575 A1 | 3/2002 | Okamoto |
| 2002/0031101 A1 | 3/2002 | Petite et al. |
| 2002/0035495 A1 | 3/2002 | Spira et al. |
| 2002/0040280 A1 | 4/2002 | Morgan |
| 2002/0064463 A1 | 5/2002 | Park et al. |
| 2002/0067999 A1 | 6/2002 | Suitou et al. |
| 2002/0082747 A1 | 6/2002 | Kramer |
| 2002/0082924 A1 | 6/2002 | Koether |
| 2002/0095269 A1 | 7/2002 | Natalini et al. |
| 2002/0103655 A1 | 8/2002 | Boies et al. |
| 2002/0113877 A1 | 8/2002 | Welch |
| 2002/0117992 A1 | 8/2002 | Hirono et al. |
| 2002/0118106 A1 | 8/2002 | Brenn |
| 2002/0127120 A1 | 9/2002 | Hahn et al. |
| 2002/0143482 A1 | 10/2002 | Karanam et al. |
| 2002/0152298 A1 | 10/2002 | Kikta et al. |
| 2002/0157408 A1 | 10/2002 | Egawa et al. |
| 2002/0161545 A1 | 10/2002 | Starling et al. |
| 2002/0163436 A1 | 11/2002 | Singh et al. |
| 2002/0170299 A1 | 11/2002 | Jayanth et al. |
| 2002/0173929 A1 | 11/2002 | Seigel |
| 2002/0187057 A1 | 12/2002 | Loprete et al. |
| 2002/0189267 A1 | 12/2002 | Singh et al. |
| 2002/0193890 A1 | 12/2002 | Pouchak |
| 2002/0198629 A1 | 12/2002 | Ellis |
| 2003/0004660 A1 | 1/2003 | Hunter |
| 2003/0004765 A1 | 1/2003 | Wiegand |
| 2003/0005710 A1 | 1/2003 | Singh et al. |
| 2003/0006884 A1 | 1/2003 | Hunt |
| 2003/0014218 A1 | 1/2003 | Trigiani et al. |
| 2003/0019221 A1 | 1/2003 | Rossi et al. |
| 2003/0036810 A1 | 2/2003 | Petite |
| 2003/0037555 A1 | 2/2003 | Street et al. |
| 2003/0050737 A1 | 3/2003 | Osann |
| 2003/0050824 A1 | 3/2003 | Suermondt et al. |
| 2003/0051490 A1 | 3/2003 | Jayanth |
| 2003/0055603 A1 | 3/2003 | Rossi et al. |
| 2003/0063983 A1 | 4/2003 | Ancel et al. |
| 2003/0070438 A1 | 4/2003 | Kikuchi et al. |
| 2003/0070544 A1 | 4/2003 | Mulvaney et al. |
| 2003/0074285 A1 | 4/2003 | Hoffman et al. |
| 2003/0077179 A1 | 4/2003 | Collins et al. |
| 2003/0078677 A1 | 4/2003 | Hull et al. |
| 2003/0078742 A1* | 4/2003 | VanderZee et al. ............ 702/60 |
| 2003/0089493 A1 | 5/2003 | Takano et al. |
| 2003/0108430 A1 | 6/2003 | Yoshida et al. ............ 417/44.11 |
| 2003/0115890 A1 | 6/2003 | Jayanth et al. |
| 2003/0135786 A1 | 7/2003 | Vollmar et al. |
| 2003/0137396 A1 | 7/2003 | Durej et al. |
| 2003/0150924 A1 | 8/2003 | Peter |
| 2003/0150926 A1 | 8/2003 | Rosen |
| 2003/0150927 A1 | 8/2003 | Rosen |
| 2003/0171851 A1 | 9/2003 | Brickfield et al. |
| 2003/0183085 A1 | 10/2003 | Alexander |
| 2003/0191606 A1 | 10/2003 | Fujiyama et al. |
| 2003/0199247 A1 | 10/2003 | Striemer |
| 2003/0205143 A1 | 11/2003 | Cheng |
| 2003/0213851 A1 | 11/2003 | Burd et al. |
| 2003/0216837 A1 | 11/2003 | Reich et al. |
| 2003/0216888 A1 | 11/2003 | Ridolfo |
| 2003/0233172 A1 | 12/2003 | Granqvist et al. |
| 2004/0016241 A1* | 1/2004 | Street et al. ............ 62/129 |
| 2004/0016244 A1 | 1/2004 | Street et al. |
| 2004/0016251 A1 | 1/2004 | Street et al. |
| 2004/0016253 A1 | 1/2004 | Street et al. |
| 2004/0019584 A1 | 1/2004 | Greening et al. |
| 2004/0024495 A1 | 2/2004 | Sunderland |
| 2004/0026522 A1 | 2/2004 | Keen et al. |
| 2004/0037706 A1* | 2/2004 | Hahn et al. ............ 417/26 |
| 2004/0042904 A1 | 3/2004 | Kim |
| 2004/0047406 A1 | 3/2004 | Hunt |
| 2004/0049715 A1 | 3/2004 | Jaw |
| 2004/0059691 A1 | 3/2004 | Higgins |
| 2004/0068390 A1 | 4/2004 | Saunders |

(56) References Cited

U.S. PATENT DOCUMENTS

| | | | |
|---|---|---|---|
| 2004/0078695 | A1 | 4/2004 | Bowers et al. |
| 2004/0079093 | A1 | 4/2004 | Gauthier et al. |
| 2004/0093879 | A1 | 5/2004 | Street et al. |
| 2004/0095237 | A1 | 5/2004 | Chen et al. |
| 2004/0111186 | A1 | 6/2004 | Rossi et al. |
| 2004/0117166 | A1 | 6/2004 | Cassiolato |
| 2004/0133314 | A1 | 7/2004 | Ehlers et al. |
| 2004/0133367 | A1* | 7/2004 | Hart .............................. 702/57 |
| 2004/0140772 | A1 | 7/2004 | Gullo et al. |
| 2004/0140812 | A1 | 7/2004 | Scallante et al. |
| 2004/0153437 | A1 | 8/2004 | Buchan |
| 2004/0159113 | A1 | 8/2004 | Singh et al. |
| 2004/0183687 | A1 | 9/2004 | Petite et al. |
| 2004/0184627 | A1 | 9/2004 | Kost et al. |
| 2004/0184928 | A1 | 9/2004 | Millet et al. |
| 2004/0184929 | A1 | 9/2004 | Millet et al. |
| 2004/0184930 | A1 | 9/2004 | Millet et al. |
| 2004/0184931 | A1 | 9/2004 | Millet et al. |
| 2004/0187502 | A1 | 9/2004 | Jayanth et al. |
| 2004/0191073 | A1 | 9/2004 | Iimura et al. |
| 2004/0210419 | A1 | 10/2004 | Wiebe et al. |
| 2004/0213384 | A1 | 10/2004 | Alles et al. |
| 2004/0230582 | A1 | 11/2004 | Pagnano et al. |
| 2004/0230899 | A1 | 11/2004 | Pagnano et al. |
| 2004/0239266 | A1 | 12/2004 | Lee et al. |
| 2004/0261431 | A1 | 12/2004 | Singh et al. |
| 2005/0043923 | A1 | 2/2005 | Forster et al. |
| 2005/0053471 | A1 | 3/2005 | Hong et al. |
| 2005/0056031 | A1 | 3/2005 | Jeong |
| 2005/0073532 | A1 | 4/2005 | Scott et al. |
| 2005/0086341 | A1 | 4/2005 | Enga et al. |
| 2005/0100449 | A1 | 5/2005 | Hahn et al. |
| 2005/0103036 | A1 | 5/2005 | Maekawa |
| 2005/0125439 | A1 | 6/2005 | Nourbakhsh et al. |
| 2005/0126190 | A1 | 6/2005 | Lifson et al. |
| 2005/0131624 | A1 | 6/2005 | Gaessler et al. |
| 2005/0149570 | A1 | 7/2005 | Sasaki et al. |
| 2005/0154495 | A1 | 7/2005 | Shah |
| 2005/0159924 | A1 | 7/2005 | Shah et al. |
| 2005/0166610 | A1 | 8/2005 | Jayanth |
| 2005/0169636 | A1 | 8/2005 | Aronson et al. |
| 2005/0195775 | A1 | 9/2005 | Petite et al. |
| 2005/0198063 | A1 | 9/2005 | Thomas et al. |
| 2005/0201397 | A1 | 9/2005 | Petite |
| 2005/0204756 | A1 | 9/2005 | Dobmeier et al. |
| 2005/0214148 | A1 | 9/2005 | Ogawa et al. |
| 2005/0222715 | A1 | 10/2005 | Ruhnke et al. |
| 2005/0228607 | A1 | 10/2005 | Simons |
| 2005/0229612 | A1 | 10/2005 | Hrejsa et al. |
| 2005/0229777 | A1 | 10/2005 | Brown et al. |
| 2005/0232781 | A1 | 10/2005 | Herbert et al. |
| 2005/0235660 | A1 | 10/2005 | Pham |
| 2005/0235661 | A1 | 10/2005 | Pham |
| 2005/0235663 | A1 | 10/2005 | Pham |
| 2005/0247194 | A1 | 11/2005 | Kang et al. |
| 2005/0251293 | A1 | 11/2005 | Seigel |
| 2005/0252220 | A1 | 11/2005 | Street et al. |
| 2005/0262856 | A1 | 12/2005 | Street et al. |
| 2005/0262923 | A1 | 12/2005 | Kates |
| 2006/0010898 | A1 | 1/2006 | Suharno et al. |
| 2006/0015777 | A1 | 1/2006 | Loda |
| 2006/0020426 | A1 | 1/2006 | Singh |
| 2006/0021362 | A1 | 2/2006 | Sadegh et al. |
| 2006/0032245 | A1 | 2/2006 | Kates |
| 2006/0032246 | A1 | 2/2006 | Kates |
| 2006/0032247 | A1 | 2/2006 | Kates |
| 2006/0032248 | A1 | 2/2006 | Kates |
| 2006/0032379 | A1 | 2/2006 | Kates |
| 2006/0036349 | A1 | 2/2006 | Kates |
| 2006/0041335 | A9 | 2/2006 | Rossi et al. |
| 2006/0071089 | A1 | 4/2006 | Kates |
| 2006/0074917 | A1 | 4/2006 | Chand et al. |
| 2006/0097063 | A1 | 5/2006 | Zeevi |
| 2006/0098576 | A1 | 5/2006 | Brownrigg et al. |
| 2006/0117773 | A1 | 6/2006 | Street et al. |
| 2006/0123807 | A1 | 6/2006 | Sullivan et al. |
| 2006/0129339 | A1* | 6/2006 | Bruno .............................. 702/60 |
| 2006/0130500 | A1 | 6/2006 | Gauthier et al. |
| 2006/0137368 | A1 | 6/2006 | Kang et al. |
| 2006/0138866 | A1 | 6/2006 | Bergmann et al. |
| 2006/0140209 | A1 | 6/2006 | Cassiolato et al. |
| 2006/0151037 | A1* | 7/2006 | Lepola et al. .................... 138/98 |
| 2006/0179854 | A1 | 8/2006 | Esslinger |
| 2006/0185373 | A1 | 8/2006 | Butler et al. |
| 2006/0196196 | A1 | 9/2006 | Kates |
| 2006/0196197 | A1 | 9/2006 | Kates |
| 2006/0201168 | A1 | 9/2006 | Kates |
| 2006/0222507 | A1 | 10/2006 | Jayanth |
| 2006/0235650 | A1 | 10/2006 | Vinberg et al. |
| 2006/0238388 | A1 | 10/2006 | Jayanth |
| 2006/0242200 | A1 | 10/2006 | Horowitz et al. |
| 2006/0244641 | A1* | 11/2006 | Jayanth et al. .................. 341/51 |
| 2006/0256488 | A1* | 11/2006 | Benzing et al. .................. 361/23 |
| 2006/0259276 | A1 | 11/2006 | Rossi et al. |
| 2006/0271589 | A1 | 11/2006 | Horowitz et al. |
| 2006/0271623 | A1 | 11/2006 | Horowitz et al. |
| 2006/0280627 | A1 | 12/2006 | Jayanth |
| 2007/0002505 | A1 | 1/2007 | Watanabe et al. |
| 2007/0006124 | A1 | 1/2007 | Ahmed et al. |
| 2007/0027735 | A1 | 2/2007 | Rokos |
| 2007/0067512 | A1 | 3/2007 | Donaires et al. |
| 2007/0089434 | A1 | 4/2007 | Singh et al. |
| 2007/0089435 | A1 | 4/2007 | Singh et al. |
| 2007/0089438 | A1 | 4/2007 | Singh et al. |
| 2007/0089439 | A1 | 4/2007 | Singh et al. |
| 2007/0089440 | A1 | 4/2007 | Singh et al. |
| 2007/0101750 | A1 | 5/2007 | Pham et al. |
| 2007/0159978 | A1 | 7/2007 | Anglin et al. |
| 2007/0186569 | A1 | 8/2007 | Street et al. |
| 2007/0204635 | A1 | 9/2007 | Tanaka et al. |
| 2007/0204921 | A1 | 9/2007 | Alles |
| 2007/0205296 | A1 | 9/2007 | Bell et al. |
| 2007/0229305 | A1 | 10/2007 | Bonicatto et al. |
| 2007/0239894 | A1 | 10/2007 | Thind et al. |
| 2008/0015797 | A1 | 1/2008 | Kates |
| 2008/0016888 | A1 | 1/2008 | Kates |
| 2008/0051945 | A1 | 2/2008 | Kates |
| 2008/0058970 | A1 | 3/2008 | Perumalsamy et al. |
| 2008/0078289 | A1 | 4/2008 | Sergi et al. |
| 2008/0109185 | A1 | 5/2008 | Cheung et al. |
| 2008/0114569 | A1 | 5/2008 | Seigel |
| 2008/0121729 | A1 | 5/2008 | Gray |
| 2008/0186898 | A1 | 8/2008 | Petite |
| 2008/0209925 | A1 | 9/2008 | Pham |
| 2008/0216494 | A1 | 9/2008 | Pham et al. |
| 2008/0216495 | A1 | 9/2008 | Kates |
| 2008/0223051 | A1 | 9/2008 | Kates |
| 2008/0234869 | A1 | 9/2008 | Yonezawa et al. |
| 2008/0319688 | A1 | 12/2008 | Kim |
| 2009/0007777 | A1 | 1/2009 | Cohen et al. |
| 2009/0030555 | A1 | 1/2009 | Gray |
| 2009/0037142 | A1 | 2/2009 | Kates |
| 2009/0038010 | A1 | 2/2009 | Ma et al. |
| 2009/0055465 | A1 | 2/2009 | DePue et al. |
| 2009/0057424 | A1 | 3/2009 | Sullivan et al. |
| 2009/0057428 | A1 | 3/2009 | Geadelmann et al. |
| 2009/0068947 | A1 | 3/2009 | Petite |
| 2009/0071175 | A1 | 3/2009 | Pham |
| 2009/0072985 | A1 | 3/2009 | Patel et al. |
| 2009/0093916 | A1 | 4/2009 | Parsonnet et al. |
| 2009/0096605 | A1 | 4/2009 | Petite et al. |
| 2009/0099699 | A1 | 4/2009 | Steinberg et al. |
| 2009/0106601 | A1 | 4/2009 | Ngai et al. |
| 2009/0112672 | A1 | 4/2009 | Flamig et al. |
| 2009/0125151 | A1 | 5/2009 | Steinberg et al. |
| 2009/0140880 | A1 | 6/2009 | Flen et al. |
| 2009/0151374 | A1 | 6/2009 | Kasahara |
| 2009/0187281 | A1 | 7/2009 | Kates |
| 2009/0215424 | A1 | 8/2009 | Petite |
| 2009/0229469 | A1 | 9/2009 | Campbell et al. |
| 2009/0296832 | A1 | 12/2009 | Hunt |
| 2009/0324428 | A1 | 12/2009 | Tolbert, Jr. et al. |
| 2010/0006042 | A1 | 1/2010 | Pitonyak et al. |
| 2010/0011962 | A1 | 1/2010 | Totsugi |

(56) References Cited

U.S. PATENT DOCUMENTS

| | | |
|---|---|---|
| 2010/0017465 A1 | 1/2010 | Brownrigg et al. |
| 2010/0039984 A1 | 2/2010 | Brownrigg |
| 2010/0044449 A1 | 2/2010 | Tessier |
| 2010/0070084 A1 | 3/2010 | Steinberg et al. |
| 2010/0070234 A1 | 3/2010 | Steinberg et al. |
| 2010/0070666 A1 | 3/2010 | Brindle |
| 2010/0078493 A1 | 4/2010 | Alles |
| 2010/0081357 A1 | 4/2010 | Alles |
| 2010/0081372 A1 | 4/2010 | Alles |
| 2010/0102136 A1 | 4/2010 | Hadzidedic et al. |
| 2010/0168924 A1 | 7/2010 | Tessier et al. |
| 2010/0169030 A1 | 7/2010 | Parlos |
| 2010/0179703 A1 | 7/2010 | Singh et al. |
| 2010/0191487 A1 | 7/2010 | Rada et al. |
| 2010/0194582 A1 | 8/2010 | Petite |
| 2010/0214709 A1 | 8/2010 | Hall et al. |
| 2010/0217550 A1 | 8/2010 | Crabtree et al. |
| 2010/0250054 A1 | 9/2010 | Petite |
| 2010/0257410 A1 | 10/2010 | Cottrell et al. |
| 2010/0262299 A1 | 10/2010 | Cheung et al. |
| 2010/0265909 A1 | 10/2010 | Petite et al. |
| 2010/0280667 A1 | 11/2010 | Steinberg |
| 2010/0282857 A1 | 11/2010 | Steinberg |
| 2010/0287489 A1 | 11/2010 | Alles |
| 2010/0305718 A1 | 12/2010 | Clark et al. |
| 2010/0308119 A1 | 12/2010 | Steinberg et al. |
| 2010/0312881 A1 | 12/2010 | Davis et al. |
| 2010/0318227 A1 | 12/2010 | Steinberg et al. |
| 2010/0330985 A1 | 12/2010 | Addy |
| 2011/0004350 A1 | 1/2011 | Cheifetz et al. |
| 2011/0022429 A1 | 1/2011 | Yates et al. |
| 2011/0023045 A1 | 1/2011 | Yates et al. |
| 2011/0023945 A1 | 2/2011 | Hayashi et al. |
| 2011/0040785 A1 | 2/2011 | Steenberg et al. |
| 2011/0042541 A1 | 2/2011 | Spencer et al. |
| 2011/0045454 A1 | 2/2011 | McManus et al. |
| 2011/0054842 A1 | 3/2011 | Kates |
| 2011/0071960 A1 | 3/2011 | Singh |
| 2011/0077896 A1 | 3/2011 | Steinberg et al. |
| 2011/0083450 A1 | 4/2011 | Turner et al. |
| 2011/0102159 A1 | 5/2011 | Olson et al. |
| 2011/0103460 A1 | 5/2011 | Bonicatto |
| 2011/0106471 A1 | 5/2011 | Curtis et al. |
| 2011/0118905 A1 | 5/2011 | Mylaraswamy et al. |
| 2011/0121952 A1 | 5/2011 | Bonicatto et al. |
| 2011/0144932 A1 | 6/2011 | Alles |
| 2011/0166828 A1 | 7/2011 | Steinberg et al. |
| 2011/0181438 A1 | 7/2011 | Millstein et al. |
| 2011/0184563 A1 | 7/2011 | Foslien et al. |
| 2011/0185895 A1 | 8/2011 | Freen |
| 2011/0190910 A1 | 8/2011 | Lombard et al. |
| 2011/0212700 A1 | 9/2011 | Petite |
| 2011/0218957 A1 | 9/2011 | Coon et al. |
| 2011/0264324 A1 | 10/2011 | Petite et al. |
| 2011/0264409 A1 | 10/2011 | Jayanth et al. |
| 2011/0290893 A1 | 12/2011 | Steinberg |
| 2011/0307103 A1 | 12/2011 | Cheung et al. |
| 2011/0309953 A1 | 12/2011 | Petite et al. |
| 2011/0310929 A1 | 12/2011 | Petite et al. |
| 2011/0315019 A1 | 12/2011 | Lyon et al. |
| 2011/0320050 A1 | 12/2011 | Petite et al. |
| 2012/0005590 A1 | 1/2012 | Lombard et al. |
| 2012/0054242 A1 | 3/2012 | Ferrara et al. |
| 2012/0065783 A1 | 3/2012 | Fadell et al. |
| 2012/0065935 A1 | 3/2012 | Steinberg et al. |
| 2012/0066168 A1 | 3/2012 | Fadell et al. |
| 2012/0075092 A1 | 3/2012 | Petite et al. |
| 2012/0092154 A1 | 4/2012 | Petite |
| 2012/0125559 A1 | 5/2012 | Fadell et al. |
| 2012/0125592 A1 | 5/2012 | Fadell et al. |
| 2012/0126019 A1 | 5/2012 | Warren et al. |
| 2012/0126020 A1 | 5/2012 | Filson et al. |
| 2012/0126021 A1 | 5/2012 | Warren et al. |
| 2012/0128025 A1 | 5/2012 | Huppi et al. |
| 2012/0130546 A1 | 5/2012 | Matas et al. |
| 2012/0130547 A1 | 5/2012 | Fadell et al. |
| 2012/0130548 A1 | 5/2012 | Fadell et al. |
| 2012/0130679 A1 | 5/2012 | Fadell et al. |
| 2012/0131504 A1 | 5/2012 | Fadell et al. |
| 2012/0143528 A1 | 6/2012 | Kates |
| 2012/0186774 A1 | 7/2012 | Matsuoka et al. |
| 2012/0191257 A1 | 7/2012 | Corcoran et al. |
| 2012/0199660 A1 | 8/2012 | Warren et al. |
| 2012/0203379 A1 | 8/2012 | Sloo et al. |
| 2012/0221150 A1 | 8/2012 | Arensmeier |
| 2012/0229521 A1 | 9/2012 | Hales, IV et al. |
| 2012/0232969 A1 | 9/2012 | Fadell et al. |
| 2012/0233478 A1 | 9/2012 | Mucignat et al. |
| 2012/0239207 A1 | 9/2012 | Fadell et al. |
| 2012/0239221 A1 | 9/2012 | Mighdoll et al. |
| 2012/0245968 A1 | 9/2012 | Beaulieu et al. |
| 2012/0248210 A1 | 10/2012 | Warren et al. |
| 2012/0248211 A1 | 10/2012 | Warren et al. |
| 2012/0260804 A1 | 10/2012 | Kates |
| 2012/0265491 A1 | 10/2012 | Drummy |
| 2012/0265586 A1 | 10/2012 | Mammone |
| 2012/0271673 A1 | 10/2012 | Riley |
| 2012/0291629 A1 | 11/2012 | Tylutki et al. |
| 2012/0318135 A1 | 12/2012 | Hoglund et al. |
| 2012/0318137 A1 | 12/2012 | Ragland et al. |
| 2013/0066479 A1 | 3/2013 | Shetty et al. |
| 2013/0182285 A1 | 7/2013 | Matsuhara et al. |
| 2013/0287063 A1 | 10/2013 | Kates |
| 2014/0000290 A1 | 1/2014 | Kates |
| 2014/0000291 A1 | 1/2014 | Kates |
| 2014/0000292 A1 | 1/2014 | Kates |
| 2014/0000293 A1 | 1/2014 | Kates |
| 2014/0000294 A1 | 1/2014 | Kates |
| 2014/0012422 A1 | 1/2014 | Kates |
| 2014/0074730 A1 | 3/2014 | Arensmeier et al. |

FOREIGN PATENT DOCUMENTS

| | | |
|---|---|---|
| CH | 173493 A | 11/1934 |
| CN | 1169619 A | 1/1998 |
| CN | 1356472 A | 7/2002 |
| CN | 1356472A A | 7/2002 |
| DE | 842351 C | 6/1952 |
| DE | 764179 C | 4/1953 |
| DE | 1144461 B | 2/1963 |
| DE | 1403516 A1 | 10/1968 |
| DE | 1403467 | 10/1969 |
| DE | 3133502 A1 | 6/1982 |
| DE | 3422398 A1 | 12/1985 |
| DE | 3118638 | 7/1995 |
| DE | 297 23 145 U1 | 4/1998 |
| EP | 0060172 A1 | 9/1982 |
| EP | 0085246 | 8/1983 |
| EP | 0124603 A1 | 11/1984 |
| EP | 0254253 A2 | 1/1988 |
| EP | 0346152 A2 | 12/1989 |
| EP | 0351833 A2 | 1/1990 |
| EP | 0 355 255 | 2/1990 |
| EP | 0398436 A1 | 11/1990 |
| EP | 0410330 A2 | 1/1991 |
| EP | 0419857 A2 | 4/1991 |
| EP | 0432085 A2 | 6/1991 |
| EP | 0453302 | 10/1991 |
| EP | 0479421 A1 | 4/1992 |
| EP | 0557023 A1 | 8/1993 |
| EP | 0579374 A1 | 1/1994 |
| EP | 0351272 | 5/1994 |
| EP | 0660213 A2 | 6/1995 |
| EP | 0747598 A2 | 12/1996 |
| EP | 0877462 | 11/1998 |
| EP | 0982497 A2 | 3/2000 |
| EP | 1008816 A2 | 6/2000 |
| EP | 1 087 184 A2 | 3/2001 |
| EP | 1087142 A2 | 3/2001 |
| EP | 1138949 A2 | 10/2001 |
| EP | 1139037 A1 | 10/2001 |
| EP | 1187021 A2 | 3/2002 |
| EP | 1209427 A1 | 5/2002 |
| EP | 1241417 A1 | 9/2002 |

(56) References Cited

FOREIGN PATENT DOCUMENTS

| | | |
|---|---|---|
| EP | 1245912 | 10/2002 |
| EP | 1245913 A1 | 10/2002 |
| EP | 1393034 A1 | 3/2004 |
| EP | 1435002 A1 | 7/2004 |
| EP | 2180270 A1 | 4/2010 |
| FR | 2 472 862 | 3/1981 |
| FR | 2582430 A1 | 11/1986 |
| FR | 2589561 A1 | 5/1987 |
| FR | 2628558 A1 | 9/1989 |
| FR | 2660739 A1 | 10/1991 |
| GB | 2 062 919 A | 5/1981 |
| GB | 2062919 | 5/1981 |
| GB | 2064818 A | 6/1981 |
| GB | 2116635 A | 9/1983 |
| GB | 2229295 A | 9/1990 |
| JP | 56010639 A | 2/1981 |
| JP | 59145392 A | 8/1984 |
| JP | 61046485 A | 3/1986 |
| JP | 62116844 A | 5/1987 |
| JP | 63061783 | 3/1988 |
| JP | 63302238 A | 12/1988 |
| JP | 01014554 A | 1/1989 |
| JP | 02110242 | 4/1990 |
| JP | 02 294580 A | 5/1990 |
| JP | 04080578 A | 3/1992 |
| JP | 06 058273 A | 1/1994 |
| JP | 08087229 A | 4/1996 |
| JP | 08284842 A | 10/1996 |
| JP | H08261541 A | 10/1996 |
| JP | 2000350490 A | 12/2000 |
| JP | 2002-155868 | 5/2002 |
| JP | 2003018883 A | 1/2003 |
| JP | 2003-176788 | 6/2003 |
| JP | 2004-316504 | 11/2004 |
| JP | 2005241089 A | 9/2005 |
| JP | 2005345096 A | 12/2005 |
| JP | 2006-046219 | 2/2006 |
| JP | 2006046519 A | 2/2006 |
| JP | 2006274807 A | 10/2006 |
| JP | 2009002651 A | 1/2009 |
| JP | 2010048433 A | 3/2010 |
| KR | 10-1998-0036844 A | 8/1998 |
| KR | 10-2000-0025265 | 5/2000 |
| KR | 10-2002-0041977 | 6/2002 |
| KR | 10-2004-0021281 | 3/2004 |
| KR | 10-2006-0020353 | 3/2006 |
| WO | 8601262 A1 | 2/1986 |
| WO | 8703988 A1 | 7/1987 |
| WO | 8705097 A1 | 8/1987 |
| WO | 8802527 A1 | 4/1988 |
| WO | 8806703 A1 | 9/1988 |
| WO | WO 97 18636 | 5/1997 |
| WO | 9748161 A1 | 12/1997 |
| WO | WO 99 17066 | 4/1999 |
| WO | 9965681 A1 | 12/1999 |
| WO | 0021047 A1 | 4/2000 |
| WO | WO 01/69147 A1 | 9/2001 |
| WO | 0214968 A1 | 2/2002 |
| WO | WO 02/075227 | 9/2002 |
| WO | 02/090840 A2 | 11/2002 |
| WO | 02/090913 A1 | 11/2002 |
| WO | 02090914 A1 | 11/2002 |
| WO | 03031996 A1 | 4/2003 |
| WO | 03090000 A1 | 10/2003 |
| WO | 2004049088 A1 | 6/2004 |
| WO | 2005022049 A2 | 3/2005 |
| WO | 2005073686 A1 | 8/2005 |
| WO | WO 2005/108882 | 11/2005 |
| WO | 2006023075 A2 | 3/2006 |
| WO | WO 2006/025880 | 3/2006 |
| WO | 2006091521 A2 | 8/2006 |
| WO | 2008144864 A1 | 12/2008 |
| WO | WO 2009/058356 | 5/2009 |
| WO | 2010138831 A2 | 12/2010 |
| WO | 2011069170 A1 | 6/2011 |
| WO | 2012092625 A2 | 7/2012 |
| WO | 2012118550 A1 | 9/2012 |

OTHER PUBLICATIONS

Ultrasite 32 User's Guide, Computer Process Controls, Sep. 28, 1999.
Ultrasite User's Guide BEC Supplement, Computer Process Controls, Oct. 6, 1997.
Ultrasite User's Guide BCU Supplement, Computer Process Controls, Sep. 4, 1997.
Ultrasite User's Guide RMCC Supplement, Computer Process Controls, Jun. 9, 1997.
Building Environmental Control (BEC) Installation and Operation Manual, Computer Process Controls, Jan. 5, 1998.
Building Control Unit (BCU) Installation and Operation Manual, Computer Process Controls, Jan. 28, 1998.
The International Search Report regarding International Application No. PCT/US2007/019563.
Written Opinion of the International Searching Authority regarding International Application No. PCT/US2007/019563.
Einstein RX-300 Refrigeration Controller Installation and Operation Manual, Computer Process Controls, Apr. 1, 1998.
Translation of Claims and Abstract of KR Patent Laying-Open No. 2000-0000261; 4 pages.
"Small-type Freezing and Air Conditioning Operation," Chinese State Economy and Trading Committee, China Meteorological Press, Mar. 2003 (cited in First Office Action issued by the Chinese Patent Office regarding Application No. 200780030810.X dated Dec. 25, 2009).
"Manual for Freezing and Air Conditioning Technology," Fan Jili, Liaoning Science and Technology Press, Sep. 1995 (cited in First Office Action issued by the Chinese Patent Office regarding Application No. 200780030810.X dated Dec. 25, 2009).
Second Office Action regarding Chinese Patent Application No. 200780030810X, dated Aug. 4, 2010. English translation provided by Unitalen Attorneys at Law.
European Search Report regarding Application No. 04022784.5-2315 / 1500821, dated Aug. 14, 2012.
Fourth Office Action from the State Intellectual Property Office of People's Republic of China regarding Chinese Patent Applicaiton No. 200510005907.8, dated Dec. 8, 2011. Translation provided by Unitalen Attorneys at Law.
Notification of First Office Action from the State Intellectual Property Office of People's Repulic of China regarding Chinese Patent Application No. 200880122964.6, dated Nov. 5, 2012. Translation provided by Unitalen Attorneys at Law.
Examiners Report No. 1 regarding Australian Patent Application No. 2013202431, dated Nov. 25, 2014.
Final Office Action for Application No. 13/770,123 dated Dec. 22, 2014.
International Search Report and Written Opinion for related PCT Application No. PCT/US20141028859, dated Aug. 22, 2014.
International Search Report and Written Opinion of the ISA regarding International Application No. PCT/ US2014/032927, ISA/KR dated Aug. 21, 2014.
Non Final Office Action for U.S. Appl. No. 13/407,180, dated Dec. 2, 2014.
Non-Final Office Action regrding U.S. Appl. No. 13/932,611, dated Jan. 30, 2015.
Notice of Allowance and Fees Due regarding U.S. Appl. No. 13/737,566, dated Sep. 24, 2014.
Notice of Allowance for U.S. Appl. No. 13/835,742 dated Dec. 24, 2014.
Notice of Allowance for U.S. Appl. No. 13/835,810 date Jan. 2, 2015.
Notice of Allowance for U.S. Appl. No. 13/836,043 dated Feb. 4, 2015.
Notice of Allowance for U.S. Appl. No. 13/836,453 dated Dec. 24, 2014.
Notice of Allowance for related U.S. Appl. No. 13/836,043, dated Oct. 9, 2014.

(56) References Cited

OTHER PUBLICATIONS

Notice of Allowance for related U.S. Appl. No. 13/836,244, dated Oct. 30, 2014.
Office Action for U.S. Appl. No. 13/269,188 dated Feb. 10, 2015.
Office Action for U.S. Appl. No. 13/767,479 dated Feb. 6, 2015.
Office Action for U.S. Appl. No. 13/835,621 dated Dec. 29, 2014.
Office Action for Canadian Application No. 2,828,740 dated Jan. 12, 2015.
Office Action for related U.S. Appl. No. 13/269,188, dated Oct. 6, 2014.
Office Action for related U.S. Appl. No. 13/767,479, dated Oct. 21, 2014.
Patent Examination Report for Austrialian Application No. 2012223466 dated Jan. 6, 2015.
Second Office Action from the State Intellectual Property Office of People's Republic of China regarding Chinese Patent Application No. 201110349785.X, dated Jul. 25, 2014. Translation provided by Unitalen Attorneys at Law.
Third Chinese Office Action regarding Application No. 201110349785.X, dated Jan. 30, 2015. Translation provided by Unitalen Attorneys at Law.
Final Office Action and Interview Summary regarding U.S. Appl. No. 13/407,180, mailed Mar. 13, 2015.
Naiad et al., "EER & SEER As Predictors of Seasonal Energy Performance ", Oct. 2004, Southern California Edison, http://www.doe2.com/download/Deer/Seer%2BProgThermostats/EER-SEER_CASE_ProjectSummary_Oct2004_V6a.pdf.
Interview Summary regarding __13/269,188, mailed Mar. 18, 2015.
Notice of Allowance regarding __13/767,479, dated Mar. 31, 2015.
Notice of Allowance regarding __13/835,621, dated Mar. 10, 2015.
Office Action from __13/369,067 dated Apr. 3, 2015.
Office Action regarding __13/770,479, mailed Mar. 16, 2015.
Office Action regarding __13/770,123, mailed Apr. 2, 2015.
Naiad et al., "EER & SEER As Predictors of Seasonal Energy Performance ", Oct. 2004, Southern California Edison, http://www.doe2.com/download/Deer/Seer%2BProgThermostats/EERSEER_CASE_ProjectSummary_Oct2004_V6a.pdf.
Interview Summary regarding U.S. Appl. No. 13/269,188, mailed Mar. 18, 2015.
Notice of Allowance regarding U.S. Appl. No. 13/835,621, dated Mar. 10, 2015.
Office Action regarding U.S. Appl. No. 13/770,479, mailed Mar. 16, 2015.
Office Action regarding U.S. Appl. No. 13/770,123, mailed Apr. 2, 2015.
Advisory Action regarding U.S. Appl. No. 13/269,188, dated Apr. 13, 2015.
Notice of Allowance regarding U.S. Appl. No. 13/835,742, mailed Apr. 17, 2015.
Notice of Allowance regarding U.S. Appl. No. 13/836,453, mailed Apr. 15, 2015.
U.S. Office Action regarding U.S. Appl. No. 13/269,188, dated May 8, 2015.
U.S. Office Action regarding U.S. Appl. No. 14/212,632, dated May 15, 2015.
First Chinese Office Action regarding Application No. 2013800053002, dated Apr. 30, 2015. Translation provided by Unitalen Attorneys at Law.
Advisory Action and Interview Summary regarding U.S. Appl. No. 13/407,180, dated May 27, 2015.
Interview Summary regarding U.S. Appl. No. 13/407,180, dated Jun. 11, 2015.
Interview Summary regarding U.S. Appl. No. 13/770,479, dated Jun. 16, 2015.
Extended European Search Report regarding European Application No. 08845689.8-1608/2207964, dated Jun. 19, 2015.
Extended European Search Report regarding European Application No. 08848538.8-1608/2220372, dated Jun. 19, 2015.
Final Office Action from related U.S. Appl. No. 13/767,479 dated Mar. 14, 2014; 6 pages.
Final Office Action from related U.S. Appl. No. 13/836,043 dated Mar. 12, 2014; 5 pages.
Final Office Action mailed Dec. 7, 2010 for U.S. Appl. No. 12/054,011.
Final Office Action regarding U.S. Appl. No. 11/497,579, dated May 14, 2010.
Final Office Action regarding U.S. Appl. No. 11/497,644, dated Dec. 22, 2010.
Final Office Action regarding U.S. Appl. No. 11/850,846, mailed Jan. 17, 2014.
Final Office Action regarding U.S. Appl. No. 13/770,123, dated Nov. 15, 2013.
Final Office Action regarding U.S. Appl. No. 13/932,611, mailed May 28, 2014.
Final Office Action regarding U.S. Appl. No. 11/214,179, dated Jul. 21, 2011.
Final Office Action regarding U.S. Appl. No. 09/977,552, dated Oct. 22, 2008.
Final Office Action regarding U.S. Appl. No. 09/977,552, dated Apr. 26, 2004.
Final Office Action regarding U.S. Appl. No. 09/977,552, dated May 31, 2005.
Final Office Action regarding U.S. Appl. No. 09/977,552, dated Jun. 18, 2003.
Final Office Action regarding U.S. Appl. No. 09/977,552, dated Jul. 23, 2007.
Final Office Action regarding U.S. Appl. No. 10/061,964, dated Mar. 8, 2004.
Final Office Action regarding U.S. Appl. No. 10/940,877, dated Nov. 13, 2007.
Final Office Action regarding U.S. Appl. No. 10/940,877, dated Apr. 27, 2009.
Final Office Action regarding U.S. Appl. No. 10/940,877, dated May 2, 2006.
Final Office Action regarding U.S. Appl. No. 11/098,575, dated Jun. 17, 2010.
Final Office Action regarding U.S. Appl. No. 11/214,179, dated May 29, 2009.
Final Office Action regarding U.S. Appl. No. 11/256,641, dated Feb. 2, 2009.
Final Office Action regarding U.S. Appl. No. 11/337,918, dated Feb. 17, 2011.
Final Office action regarding U.S. Appl. No. 11/337,918, dated Feb. 4, 2010.
Final Office Action regarding U.S. Appl. No. 12/261,643, dated Jul. 7, 2011.
First Examination Communication regarding European Application No. EP02729051.9, dated Dec. 23, 2005.
First Examination Report regarding Australian Patent Application No. 2010319488, dated Jan. 10, 2013.
First Examination Report regarding Australian Patent Application No. 2012241185, dated Sep. 27, 2013.
First Office Action from the Patent Office of the People's Republic of China dated Jun. 8, 2007, Application No. 200480027753.6 and Translation provided by CCPIT.
First Office Action from the Patent Office of the People's Republic of China regarding Application No. 200510005907.8, dated Jun. 29, 2007.
First Office Action from the State Intellectual Property Office of the People's Republic of China regarding Chinese Patent Application No. 200890100287.3, issued Oct. 25, 2010. Translation provided by Unitalen Attorneys at Law.
First Office Action issued by the Chinese Patent Office for Application No. 200480015875.3, dated Sep. 5, 2008.
First Office Action issued by the Chinese Patent Office on May 30, 2008 regarding Application No. 200580013451.8.
First Office Action issued by the Chinese Patent Office regarding Application No. 200780030810.X dated Dec. 25, 2009.
First Office Action received from the Chinese Patent Office dated Feb. 2, 2007 regarding Application No. 200480011463.2, translated by CCPIT Patent and Trademark Law Office.
First Office Action regarding Canadian Patent Application No. 2,777,349, dated Jul. 19, 2013.

(56) References Cited

OTHER PUBLICATIONS

First Office Action regarding Chinese Application No. 200880106319.5, dated May 25, 2011. English translation provided by Unitalen Attorneys at Law.
First Office Action regarding Chinese Patent Application No. 200780032977.X, dated Sep. 27, 2010. English translation provided by Unitalen Attorneys at Law.
First Office Action regarding Chinese Patent Application No. 200910211779.0, dated May 3, 2012. English translation provided by Unitalen Attorneys at Law.
First Office Action regarding Chinese Patent Application No. 201010117657.8, dated Dec. 29, 2010. English translation provided by Unitalen Attorneys at Law.
First Office Action regarding Chinese Patent Application No. 201110349785.X, dated Nov. 21, 2013, and Search Report. English translation provided by Unitalen Attorneys at Law.
First Official Report regarding Australian Patent Application No. 2007214381, dated Dec. 12, 2008.
Flow & Level Measurement: Mass Flowmeters, http://www.omega.com/literature/transactions/volume4/T9904-10-MASS.html, 2001, 19 pages.
Fourth Office Action regarding Chinese Patent Application No. 200910211779.0, dated Jan. 6, 2014. English translation provided by Unitalen Attorneys at Law.
Frequently Asked Questions, http://www.lipaedge.com/faq.asp, Copyright © 2001, 5 pages.
Home Comfort Zones, Smart Controller™ MyTemp™ Room by Room Temperature Control and Energy Management, User Manual, Aug. 2007.
Honeywell, A7075A1000 HVAC Service Assistant, 2001.
Honeywell, Advanced Portable A/C Diagnostics, The HVAC Service Assistant, 2003.
Honeywell, Excel 5000® System, Excel Building Supervisor—Integrated, 74-2034, Copyright © 1994, Rev. 11-94, 12 pages.
Honeywell, Excel 5000® System, Excel Building Supervisor, 74-2033-1, Copyright © 1996, Rev. 6-96, 12 pages.
Honeywell, HVAC Service Assistant, TRGpro PalmTM OS Interface and HVAC Service Assistant A7075A1000, 2002.
Hvac Service Assistant, ACRx Efficiency and Capacity Estimating Technology, Field Diagnostics, 2004.
International Preliminary Examination Report regarding PCT/US02/13456, dated Sep. 15, 2003.
International Preliminary Report on Patentability for International Application No. PCT/US2008/009618, dated Mar. 24, 2010.
International Preliminary Report on Patentability for International Application No. PCT/US2008/012362, dated May 4, 2010.
International Preliminary Report on Patentability for International Application No. PCT/US2008/012364, dated May 4, 2010.
International Preliminary Report on Patentability regarding Application No. PCT/US2010/056315, mailed May 24, 2012.
International Preliminary Report on Patentability regarding International Application No. PCT/US2007/019563 dated Mar. 10, 2009.
International Search Report and Written Opinion of the International Searching Authority regarding International Application No. PCT/US06/33702, dated Sep. 26, 2007.
International Search Report for International Application No. PCT/US07/019563, dated Jan. 15, 2008, 3 Pages.
International Search Report for International Application No. PCT/US2005/11154, dated Oct. 19, 2005.
International Search Report for International Application No. PCT/US2007/016135 dated Oct. 22, 2007.
International Search Report for International Application No. PCT/US2008/009618, dated Dec. 8, 2008.
International Search Report for International Application No. PCT/US2008/012362, dated Feb. 12, 2009.
International Search Report for International Application No. PCT/US2008/012364 dated Mar. 13, 2009.
International Search Report for PCT/US02/13459; ISA/US; date mailed Sep. 19, 2002.
International Search Report for PCT/US2012/026973, Sep. 3, 2012, 5 pages.
International Search Report for PCT/US2013/061389, Jan. 22, 2014, 7 pages.
International Search Report from PCT /US2008/060900, Aug. 4, 2008, 6 pages.
International Search Report from related PCT Application No. PCT/US2014/028074 mailed Jun. 19, 2014.
International Search Report regarding Application No. PCT/US2010/036601, mailed Dec. 29, 2010.
International Search Report regarding Application No. PCT/US2010/056315, mailed Jun. 28, 2011.
International Search Report regarding Application No. PCT/US2013/021161, mailed May 8, 2013.
International Search Report, Int'l. App. No. PCT/US 06/05917, dated Sep. 26, 2007.
International Search Report, International Application No. PCT/US02/13456, dated Aug. 22, 2002, 2 Pages.
International Search Report, International Application No. PCT/US04/13384; Dated Aug. 1, 2004; 1 Page.
International Search Report, International Application No. PCT/US2004/027654, dated Aug. 25, 2004, 4 Pages. cited by other.
International Search Report, International Application No. PCT/US2006/040964, dated Feb. 15, 2007, 2 Pages.
International Search Report; International Application No. PCT/IB96/01435; May 23, 1997; 1 Page.
International Search Report; International Application No. PCT/US98/18710; Jan. 26, 1999; 1 Page.
Interview Summary from related U.S. Appl. No. 12/054,011 dated Jan. 30, 2012.
Interview Summary regarding U.S. Appl. No. 11/497,644, dated May 4, 2010.
Interview Summary regarding U.S. Appl. No. 11/098,582, dated Apr. 27, 2010.
Interview Summary regarding U.S. Appl. No. 11/214,179, dated Jan. 30, 2009.
Interview Summary regarding U.S. Appl. No. 11/497,579, dated Jul. 15, 2010.
Issue Notification regarding U.S. Appl. No. 11/214,179, dated Mar. 14, 2012.
Jeffus, Larry, "Refrigeration and Air Conditioning: An Introduction to HVAC/R," Appendix C, pp. 1060-1063, Copyright 2004.
Jeffus, Larry, "Refrigeration and Air Conditioning: An Introduction to HVAC/R," Section II, Chapter 4, pp. 176-201, Copyright 2004.
Jeffus, Larry, "Refrigeration and Air Conditioning: An Introduction to HVAC/R," Section II, Chapter 5, pp. 239-245, Copyright 2004.
Jeffus, Larry, "Refrigeration and Air Conditioning: An Introduction to HVAC/R," Section II, Chapter 6, p. 322, Copyright 2004.
Jeffus, Larry, "Refrigeration and Air Conditioning: An Introduction to HVAC/R," Section IV, Chapter 9, pp. 494-504, Copyright 2004.
K. A. Manske et al.; Evaporative Condenser Control in Industrial Refrigeration Systems; University of Wisconsin—Madison, Mechanical Engineering Department; International Journal of Refrigeration, vol. 24, No. 7; pp. 676 -691; 2001, 21 pages.
Li et al., "Development, Evaluation, and Demonstration of a Virtual Refrigerant Charge Sensor," Jan. 2009, HVAC&R Research, Oct. 27, 2008, 21 pages.
Liao et al., A Correlation of Optimal Heat Rejection Pressures in Transcritical Carbon Dioxide Cycles, Applied Thermal Engineering 20 (2000), Jul. 25, 1999, 831-841.
LIPA Launches Free, First-in-Nation Internet-Based Air Conditioner Control Program to Help LIPA and Its Customers Conserve Electricity & Save Money, Apr. 19, 2001, http://www.lipower.org/newscmter/pr/2001/april19_01.html, 3 pages.
Low-Cost Multi-Service Home Gateway Creates New Business Opportunities, Coactive Networks, Copyright 1998-1999, 7 pages.
Nickles, Donald, "Broadband Communications Over Power Transmission Lines," A Guest Lecture From the Dr. Shreekanth Mandayam Engineering Frontiers Lecture Series, May 5, 2004, 21 pages.
Non Final Office Action for related U.S. Appl. No. 13/369,067 dated Aug. 12, 2014.

(56) References Cited

OTHER PUBLICATIONS

Non Final Office Action for related U.S. Appl. No. 13/835,621 dated Aug. 8, 2014.
Non Final Office Action from related U.S. Appl. No. 13/269,188 dated Aug. 14, 2012; 9 pages.
Non Final Office Action from related U.S. Appl. No. 13/269,188 dated Oct. 4, 2013; 11 pages.
"A Practical Example of a Building's Automatic Control," cited in First Office Action from the Patent Office of the People's Republic of China dated Jun. 29, 2007, regarding Application No. 200510005907.8, including translation by CCPIT Patent and Trademark Law Office.
"Air Conditioning Equipment and Diagnostic Primer," Field Diagnostic Services, Inc., Sep. 9, 2002.
About CABA: CABA eBulletin, http://www.caba.org/aboutus/ebulletin/issue17/domosys.html, 2 pages, Sep. 22, 2004.
Advanced Utility Metering: Period of Performance, Subcontractor Report, National Renewable Energy Laboratory, Sep. 2003, 59 pages.
Advisory Action Before the Filing of an Appeal Brief regarding U.S. Appl. No. 11/098,575, dated Nov. 16, 2009.
Advisory Action Before the Filing of an Appeal Brief regarding U.S. Appl. No. 11/098,575, dated Sep. 28, 2009.
Advisory Action Before the Filing of an Appeal Brief regarding U.S. Appl. No. 09/977,552, dated Nov. 10, 2005.
Advisory Action from related U.S. Appl. No. 13/784,890 dated Mar. 14, 2014.
Advisory Action regarding U.S. Appl. No. 11/214,179, dated Aug. 28, 2009.
BChydro, "Power Factor" Guides to Energy Management: The GEM Series, Oct. 1999.
Case Studies: Automated Meter Reading and Load Shed System, http://groupalpha.corn/CaseStudies2.html, Aug. 23, 2004, 1 page.
Communication from European Patent Office concerning Substantive Examination regarding European Patent Application No. 06790063.9, dated Jun. 6, 2011.
Cost Cutting Techniques Used by the Unscrupulous, http://www.kellyshvac.com/howto.html, Oct. 7, 2004, 3 pages.
Election/Restriction Requirement regarding U.S. Appl. No. 09/977,552, dated Jan. 25, 2007.
European Search Report for Application No. EP 01 30 1752, dated Mar. 26, 2002.
European Search Report for Application No. EP 02 25 1531, dated Sep. 30, 2002.
European Search Report for Application No. EP 04 81 5853, dated Jul. 17, 2007.
European Search Report for Application No. EP 06 02 6263, dated Jul. 17, 2007.
European Search Report for Application No. EP 12 182 243.1, dated Oct. 29, 2012.
European Search Report for EP 01 30 7547; Feb. 20, 2002; 1 Page.
European Search Report for EP 02 25 0266; May 17, 2002; 3 Pages.
European Search Report for EP 02 72 9050, Jun. 17, 2004, 2 pages.
European Search Report for EP 82306809.3; Apr. 28, 1983; 1 Page.
European Search Report for EP 91 30 3518; Jul. 22, 1991; 1 Page.
European Search Report for EP 93 30 4470; Oct. 26, 1993; 1 Page.
European Search Report for EP 94 30 3484; Apr. 3, 1997; 1 Page.
European Search Report for EP 96 30 4219; Dec. 1, 1998; 2 Pages.
European Search Report for EP 98 30 3525; May 28, 1999; 2 Pages.
European Search Report for EP 99 30 6052; Dec. 28, 1999; 3 Pages.
European Search Report regarding Application No. 07811712.4-1608/2069638 PCT/US2007019563, dated Jan. 7, 2014.
European Search Report regarding Application No. EP02729051, dated Feb. 17, 2005.
Examination Report received from Australian Government IP Australia dated Oct. 29, 2009 regarding patent application No. 2008202088.
Examiner Interview regarding U.S. Appl. No. 11/256,641, dated Sep. 16, 2008.
Examiner Interview Summary regarding U.S. Appl. No. 11/394,380, dated Jul. 29, 2010.
Examiner Interview Summary regarding U.S. Appl. No. 10/940,877, dated Dec. 8, 2008.
Examiner Interview Summary regarding U.S. Appl. No. 10/940,877, dated Mar. 2, 2007.
Examiner Interview Summary regarding U.S. Appl. No. 10/940,877, dated Mar. 25, 2008.
Examiner's Answer from related U.S. Appl. No. 13/784,890 dated Jul. 3, 2014.
Examiner's Answer regarding U.S. Appl. No. 09/977,552, dated Dec. 17, 2009.
Examiner's First Report on Australian Patent Application No. 2002259066, dated Mar. 1, 2006.
Examiner's First Report on Australian Patent Application No. 2007292917 dated Jan. 10, 2012.
Examiner's First Report on Australian Patent Application No. 2008319275, dated Jan. 31, 2011.
Examiner's Report No. 2 regarding Australian Patent Application No. 2008325240, dated Mar. 5, 2012.
Examiner-Initiated Interview Summary regarding U.S. Appl. No. 11/214,179, dated Dec. 11, 2009.
Extended European Search Report regarding Application No. 07796879.0-1602/2041501 PCT/US2007016135, dated Jul. 14, 2014.
Extended European Search Report regarding Application No. 12182243.1-2311, dated Oct. 29, 2012.
Final Office Action for U.S. Appl. No. 11/850,846, mailed Aug. 13, 2012.
Final Office Action for U.S. Appl. No. 12/054,011, dated Jun. 30, 2011.
Final Office Action from related U.S. Appl. No. 13/269,188 dated May 23, 2013; 11 pages.
Final Office Action from related U.S. Appl. No. 13/369,067 dated May 1, 2014; 19 pages.
Written Opinion of International Searching Authority for International Application No. PCT/US2008/009618, dated Dec. 8, 2008.
Written Opinion of the International Searching Authority for International Application No. PCT/US2008/012364 dated Mar. 12, 2009.
Written Opinion of the International Searching Authority regarding Application No. PCT/US2010/036601, mailed Dec. 29, 2010.
Written Opinion of the International Searching Authority regarding Application No. PCT/US2013/021161, mailed May 8, 2013.
Written Opinion of the International Searching Authority, Int'l. App. No. PCT/US 06/05917, dated Sep. 26, 2007.
Written Opinion regarding PCT/US02/13459, dated Apr. 23, 2003.
Office Action regarding U.S. Appl. No. 11/256,641, dated Apr. 29, 2008.
Office Action regarding U.S. Appl. No. 11/337,918, dated Mar. 25, 2008.
Office Action regarding U.S. Appl. No. 11/337,918, dated Aug. 17, 2009.
Office Action regarding U.S. Appl. No. 11/337,918, dated Oct. 28, 2008.
Office Action regarding U.S. Appl. No. 11/776,879, dated Sep. 17, 2010.
Office Action regarding U.S. Appl. No. 11/850,846, dated Aug. 13, 2010.
Office Action regarding U.S. Appl. No. 12/261,643, dated Feb. 15, 2012.
Office Action regarding U.S. Appl. No. 12/261,677, dated Aug. 4, 2011.
Office Action regarding U.S. Appl. No. 13/303,286, dated Mar. 26, 2012.
Office Action regarding U.S. Appl. No. 13/737,566, dated Dec. 20, 2013.
Official Action regarding Australian Patent Application No. 2008325240, dated Jan. 19, 2011.
Palani, M. et al, Monitoring the Performance of a Residential Central Air Conditioner under Degraded Conditions on a Test Bench, ESL-TR-92105-05, May 1992.
Palani, M. et al, The Effect of Reducted Evaporator Air Flow on the Performance of a Residential Central Air Conditioner, ESL-HH-92-

(56) References Cited

OTHER PUBLICATIONS 05-04, Energy Systems Laboratory, Mechanical Engineering Department, Texas A&M University, Eighth Symposium on Improving Building System in Hot and Humid Climates, May 13-14, 1992.
Pin, C. et al., "Predictive Models as Means to Quantify the Interactions of Spoilage Organisms," International Journal of Food Microbiology, vol. 41, No. 1, 1998, pp. 59-72, XP-002285119.
Record of Oral Hearing regarding U.S. Appl. No. 09/977,552, dated Nov. 29, 2012.
Refrigeration Monitor and Case Control Installation and Operation Manual, Computer Process Controls, Aug. 12, 1999.
Reh, F. John, "Cost Benefit Analysis", http://management.about.com/cs/money/a/CostBenefit.htm, Dec. 8, 2003.
Response to Rule 312 Communication regarding U.S. Appl. No. 09/977,552, dated Oct. 31, 2003.
Restriction from related U.S. Appl. No. 13/269,188 dated Apr. 9, 2013; 5 pages.
Restriction Requirement regarding U.S. Appl. No. 10/940,877, dated Jul. 25, 2005.
Restriction Requirement regarding U.S. Appl. No. 11/214,179, dated Feb. 2, 2010.
Second Examination Communication regarding European Application No. EP02729051.9, dated Jul. 3, 2006.
Second Office action issued by the Chinese Patent Office dated Jun. 19, 2009 regarding Application No. 200510005907.8, translation provided by CCPIT Patent and Trademark Law Office.
Second Office Action issued by the Chinese Patent Office for Application No. 200480015875.3, dated Feb. 27, 2009.
Second Office Action issued by the Chinese Patent Office on Mar. 6, 2009 regarding Application No. 200580013451.8.
Second Office Action received from the Chinese Patent Office dated Jun. 26, 2009 regarding Application No. 200480011463.2, translated by CCPIT Patent and Trademark Law Office.
Second Office Action regarding Chinese Patent Application No. 200890100287.3, dated Jan. 27, 2011. English translation provided by Unitalen Attorneys at Law.
Second Office Action regarding Chinese Patent Application No. 200910211779.0, dated Feb. 4, 2013. English translation provided by Unitalen Attorneys at Law.
Second Official Report regarding Australian Patent Application No. 2007214381, dated Oct. 30, 2009.
Supplementary European Search Report for EP 02 73 1544, Jun. 18, 2004, 2 Pages.
Supplementary European Search Report regarding Application No. EP 07 81 1712, dated Jan. 7, 2014.
Supplementary European Search Report regarding Application No. PCT/US2006/005917, dated Nov. 23, 2009.
Supplementary European Search Report regarding European Application No. EP06790063, dated Jun. 15, 2010.
Tamarkin, Tom D., "Automatic Meter Reading," Public Power magazine, vol. 50, No. 5, Sep.-Oct. 1992, http://www.energycite.com/news/amr.html, 6 pages.
Texas Instruments, Inc. Mechanical Data for "PT (S-PQFP-G48) Plastic Quad Flatpack," Revised Dec. 1996, 2 pages.
Texas Instruments, Inc., Product catalog for "TRF690 1 Single-Chip RF Transceiver," Copyright 2001-2003, Revised Oct. 2003, 27 pages.
The Honeywell HVAC Service Assistant, A Tool for Reducing Electrical Power Demand and Energy Consumption, Field Diagnostics, 2003.
The LS2000 Energy Management System, User Guide, http://www.surfnetworks.com/htmlmanuals/lonWorksEnergyManagement-LS2000-Load-Shed -System-by-Surf-Networks,Inc.html, Sep. 2004, 20 pages.
Third Office Action issued by the Chinese Patent Office on Jun. 19, 2009 regarding Application No. 200580013451.8, translated by CCPIT Patent and Trademark Law Office.
Third Office Action regarding Chinese Application No. 2005100059078 from the State Intellectual Property Office of People's Republic of China, dated Aug. 24, 2011. Translation provided by Unitalen Attorneys at Law.
Third Office Action regarding Chinese Patent Application No. 200910211779.0, dated Sep. 4, 2013. English translation provided by Unitalen Attorneys at Law.
Torcellini, P., et al., "Evaluation of the Energy Performance and Design Process of the Thermal Test Facility at the National Renewable Energy Laboratory", dated Feb. 2005.
Trane EarthWise™ CenTra Vac™ Water-Cooled Liquid Chillers 165-3950 Tons 50 and 60 Hz; CTV PRC007-En; Oct. 2002; 56 pages.
Udelhoven, Darrell, "Air Conditioner EER, SEER Ratings, BTUH Capacity Ratings, & Evaporator Heat Load," http://www.udarrell.com/air-conditioner-capacity-seer.html, Apr. 3, 2003, 15 pages.
Udelhoven, Darrell, "Air Conditioning System Sizing for Optimal Efficiency," http:/ /www.udarrell.com/ airconditioning-sizing.html, Oct. 6, 2003, 7 pages.
Udelhoven, Darrell, "Optimizing Air Conditioning Efficiency TuneUp Optimizing the Condenser Output, Seer, Air, HVAC Industry," http://www.udarrell.com/air-conditioning-efficiency.html, Jul. 19, 2002, 13 pages.
UltraSite User's Guide, Computer Process Controls, Apr. 1, 1996.
Vandenbrink et al.,"Design of a Refrigeration Cycle Evaporator Unit," Apr. 18, 2003.
Watt, James; Development of Empirical Temperature and Humidity-Based Degraded-Condition Indicators for Low-Tonnage Air Conditioners; ESL-TH-97112-03; Dec. 1997.
Written Opinion from related PCT Application No. PCT/US2014/028074 mailed Jun. 19, 2014.
Notice of Allowance dated Feb. 12, 2007 from U.S. Appl. No. 11/130,871.
Notice of Allowance dated Jul. 13, 2006 from Related U.S. Appl. No. 11/130,601.
Notice of Allowance dated Jul. 25, 2007 from U.S. Appl. No. 10/916,223.
Notice of Allowance dated Jun. 11, 2007 from Related U.S. Appl. No. 10/916,222.
Notice of Allowance dated May 2, 2007 from U.S. Appl. No. 11/130,569.
Notice of Allowance dated May 29, 2007 from U.S. Appl. No. 11/130,569.
Notice of Allowance dated Nov. 3, 2008 from Related U.S. Appl. No. 11/417,701.
Notice of Allowance dated Oct. 26, 2007 from Related U.S. Appl. No. 10/916,223.
Notice of Allowance for related U.S. Appl. No. 13/835,810 dated Aug. 5, 2014.
Notice of Allowance for U.S. Appl. No. 10/698,048, dated Sep. 1, 2005.
Notice of Allowance from related U.S. Appl. No. 13/835,742 dated Jan. 31, 2014; 7 pages.
Notice of Allowance from related U.S. Appl. No. 13/835,742 dated Jun. 2, 2014; 8 pages.
Notice of Allowance from related U.S. Appl. No. 13/835,810 dated Mar. 20, 2014; 9 pages.
Notice of Allowance from related U.S. Appl. No. 13/836,453 dated Jan. 14, 2014; 8 pages.
Notice of Allowance from related U.S. Appl. No. 13/836,453 dated Apr. 21, 2014; 8 pages.
Notice of Allowance from related U.S. Appl. No. 13/836,453 dated Aug. 4, 2014.
Notice of Allowance from related U.S. Appl. No. 13/836,244 dated Jul. 2, 2014; 8 pages.
Notice of Allowance regarding U.S. Appl. No. 10/061,964, dated Jul. 19, 2004.
Notice of Allowance regarding U.S. Appl. No. 10/940,877, dated Sep. 4, 2009.
Notice of Allowance regarding U.S. Appl. No. 11/776,879, dated Jul. 9, 2012.
Notice of Allowance regarding U.S. Appl. No. 12/261,677, dated Dec. 15, 2011.
Notice of Allowance regarding U.S. Appl. No. 12/685,424, dated Apr. 25, 2011.
Notice of Allowance regarding U.S. Appl. No. 13/303,286, dated Jul. 19, 2012.

(56) References Cited

OTHER PUBLICATIONS

Notice of Grounds for Refusal regarding Korean Patent Application No. 10-2009-7000850, mailed Oct. 4, 2013. English translation provided by Y.S. Chang & Associates.
Notice of Panel Decision from Pre-Appeal Brief Review regarding U.S. Appl. No. 09/977,552, dated Aug. 4, 2009.
Office Action Communication regarding U.S. Appl. No. 09/977,552, dated Apr. 18, 2007.
Office Action dated Apr. 19, 2006 from Related U.S. Appl. No. 10/916,223.
Office Action dated Aug. 17, 2007 from Related U.S. Appl. No. 11/417,609.
Office Action dated Aug. 17, 2007 from Related U.S. Appl. No. 11/417,701.
Office Action dated Aug. 21, 2007 from Related U.S. Appl. No. 11/417,557.
Office Action dated Feb. 1, 2007 from Related U.S. Appl. No. 11/130,562.
Office Action dated Feb. 13, 2009 from Related U.S. Appl. No. 12/033,765.
Office Action dated Feb. 13, 2009 from Related U.S. Appl. No. 12/050,821.
Office Action dated Feb. 15, 2008 from Related U.S. Appl. No. 11/417,557.
Office Action dated Feb. 3, 2009 from Related U.S. Appl. No. 11/866,295.
Office Action dated Jan. 18, 2006 from Related U.S. Appl. No. 11/130,601.
Office Action dated Jan. 18, 2006 from Related U.S. Appl. No. 11/130,871.
Office Action dated Jan. 23, 2007 from Related U.S. Appl. No. 10/916,222.
Office Action dated Jan. 6, 2006 from Related U.S. Appl. No. 11/130,562.
Office Action dated Jan. 6, 2006 from Related U.S. Appl. No. 10/916,222.
Office Action dated Jul. 1, 2008 from Related U.S. Appl. No. 11/927,425.
Office Action dated Jul. 11, 2006 from Related U.S. Appl. No. 11/130,562.
Office Action dated Jul. 11, 2006 from Related U.S. Appl. No. 10/916,222.
Office Action dated Jul. 11, 2007 from Related U.S. Appl. No. 11/417,609.
Office Action dated Jul. 11, 2007 from Related U.S. Appl. No. 11/417,701.
Office Action dated Jul. 16, 2008 from Related U.S. Appl. No. 11/417,701.
Office Action dated Jul. 24, 2008 from Related U.S. Appl. No. 11/417,557.
Office Action dated Jul. 27, 2006 from Related U.S. Appl. No. 11/130,871.
Office Action dated Jun. 17, 2009 from Related U.S. Appl. No. 12/033,765.
Office Action dated Jun. 19, 2009 from Related U.S. Appl. No. 11/866,295.
Office Action dated Jun. 22, 2009 from Related U.S. Appl. No. 12/050,821.
Office Action dated Jun. 27, 2007 from Related U.S. Appl. No. 11/417,557.
Office Action dated Mar. 30, 2006 from Related U.S. Appl. No. 11/130,569.
Office Action dated May 4, 2005 from Related U.S. Appl. No. 10/916,223.
Office Action dated May 6, 2009 from Related U.S. Appl. No. 11/830,729.
Office Action dated Nov. 14, 2006 from Related U.S. Appl. No. 11/130,569.
Office Action dated Nov. 16, 2006 from Related U.S. Appl. No. 10/916,223.
Office Action dated Nov. 8, 2005 from Related U.S. Appl. No. 10/916,222.
Office Action dated Nov. 9, 2005 from Related U.S. Appl. No. 11/130,562.
Office Action dated Nov. 9, 2005 from Related U.S. Appl. No. 11/130,601.
Office Action dated Nov. 9, 2005 from Related U.S. Appl. No. 11/130,871.
Office Action dated Oct. 27, 2005 from Related U.S. Appl. No. 10/916,223.
Office Action dated Sep. 18, 2007 from Related U.S. Appl. No. 11/130,562.
Office Action for U.S. Appl. No. 11/394,380, dated Jan. 6, 2009.
Office Action for U.S. Appl. No. 11/497,579, dated Oct. 27, 2009.
Office Action for U.S. Appl. No. 11/497,644, dated Dec. 19, 2008.
Office Action for U.S. Appl. No. 11/497,644, dated Jul. 10, 2009.
Office Action regarding U.S. Appl. No. 10/286,419, dated Jun. 10, 2004.
Office Action regarding U.S. Appl. No. 11/098,575, dated Jan. 29, 2009.
Office Action regarding U.S. Appl. No. 11/098,575, dated Jul. 13, 2009.
Office Action regarding U.S. Appl. No. 11/098,575, dated Sep. 9, 2008.
Office Action regarding U.S. Appl. No. 11/120,166, dated Oct. 2, 2006.
Office Action regarding U.S. Appl. No. 11/120,166, dated Oct. 2, 2007.
Office Action regarding U.S. Appl. No. 11/120,166, dated Dec. 15, 2008.
Office Action regarding U.S. Appl. No. 11/120,166, dated Feb. 17, 2010.
Office Action regarding U.S. Appl. No. 11/120,166, dated Apr. 12, 2007.
Office Action regarding U.S. Appl. No. 11/120,166, dated Jun. 5, 2008.
Office Action regarding U.S. Appl. No. 11/120,166, dated Jul. 20, 2009.
Office Action regarding U.S. Appl. No. 11/394,380, dated Sep. 25, 2009.
Office Action regarding U.S. Appl. No. 11/497,644, dated Jan. 29, 2010.
Office Action regarding U.S. Appl. No. 11/497,644, dated Jun. 14, 2010.
Office Action regarding U.S. Appl. No. 09/977,552, dated Jan. 11, 2008.
Office Action regarding U.S. Appl. No. 09/977,552, dated Jan. 14, 2003.
Office Action regarding U.S. Appl. No. 09/977,552, dated Oct. 18, 2004.
Office Action regarding U.S. Appl. No. 09/977,552, dated Dec. 3, 2003.
Office Action regarding U.S. Appl. No. 09/977,552, dated Jul. 12, 2006.
Office Action regarding U.S. Appl. No. 10/061,964, dated Oct. 3, 2003.
Office Action regarding U.S. Appl. No. 10/675,137, dated Feb. 4, 2005.
Office Action regarding U.S. Appl. No. 10/675,137, dated Jun. 29, 2005.
Office Action regarding U.S. Appl. No. 10/675,137, dated Sep. 7, 2004.
Office Action regarding U.S. Appl. No. 10/698,048, dated Mar. 21, 2005.
Office Action regarding U.S. Appl. No. 10/940,877, dated Oct. 27, 2006.
Office Action regarding U.S. Appl. No. 10/940,877, dated Nov. 14, 2005.
Office Action regarding U.S. Appl. No. 10/940,877, dated Dec. 8, 2008.
Office Action regarding U.S. Appl. No. 10/940,877, dated May 21, 2007.

(56) References Cited

OTHER PUBLICATIONS

Office Action regarding U.S. Appl. No. 10/940,877, dated Jun. 5, 2008.
Office Action regarding U.S. Appl. No. 11/098,582 dated Mar. 3, 2010.
Office Action regarding U.S. Appl. No. 11/098,582, dated Jul. 7, 2008.
Office Action regarding U.S. Appl. No. 11/098,582, dated Aug. 4, 2009.
Office Action regarding U.S. Appl. No. 11/098,582, dated Sep. 21, 2007.
Non Final Office Action from related U.S. Appl. No. 13/269,188 dated Feb. 20, 2014; 9 pages.
Non Final Office Action from related U.S. Appl. No. 13/269,188 dated Jul. 17, 2014; 10 pages.
Non Final Office Action from related U.S. Appl. No. 13/369,067 dated Jan. 16, 2014; 16 pages.
Non Final Office Action from related U.S. Appl. No. 13/767,479 dated Oct. 24, 2013; 8 pages.
Non Final Office Action from related U.S. Appl. No. 13/767,479 dated Jul. 23, 2014; 9 pages.
Non Final Office Action from related U.S. Appl. No. 13/835,621 dated Oct. 30, 2013; 8 pages.
Non Final Office Action from related U.S. Appl. No. 13/835,621 dated Apr. 2, 2014; 11 pages.
Non Final Office Action from related U.S. Appl. No. 13/835,742 dated Oct. 7, 2013; 9 pages.
Non Final Office Action from related U.S. Appl. No. 13/835,810 dated Nov. 15, 2013; 9 pages.
Non Final Office Action from related U.S. Appl. No. 13/836,043 dated Oct. 23, 2013; 8 pages.
Non Final Office Action from related U.S. Appl. No. 13/836,043 dated Jul. 11, 2014; 5 pages.
Non Final Office Action from related U.S. Appl. No. 13/836,244 dated Oct. 15, 2013; 11 pages.
Non Final Office Action from related U.S. Appl. No. 13/836,244 dated Feb. 20, 2014; 10 pages.
Non Final Office Action from related U.S. Appl. No. 13/836,453 dated Aug. 20, 2013; 8 pages.
Non-Final Office Action for U.S. Appl. No. 11/098,575 dated Jan. 27, 2010.
Non-Final Office Action for U.S. Appl. No. 11/776,879, dated Mar. 16, 2012.
Non-Final Office Action for U.S. Appl. No. 12/054,011, dated Oct. 20, 2011.
Non-Final Office Action for U.S. Appl. No. 12/054,011, dated Apr. 10, 2012.
Non-Final Office Action for U.S. Appl. No. 12/685,375, mailed Aug. 6, 2012.
Non-Final Office Action for U.S. Appl. No. 13/030,549, dated Nov. 5, 2012.
Non-Final Office Action in U.S. Appl. No. 11/850,846, mailed May 24, 2013.
Non-Final Office Action in U.S. Appl. No. 13/784,890, mailed Jun. 11, 2013.
Non-Final Office Action in U.S. Appl. No. 12/685,375, mailed Jan. 19, 2012.
Non-Final Office Action mailed Mar. 3, 2011 for U.S. Appl. No. 12/054,011.
Non-Final Office Action mailed Aug. 13, 2010 for U.S. Appl. No. 12/054,011.
Non-Final office Action regarding U.S. Appl. No. 11/850,846, dated Apr. 24, 2012.
Non-Final Office Action regarding U.S. Appl. No. 13/770,123, dated Jul. 3, 2013.
Non-Final Office Action regarding U.S. Appl. No. 13/932,611, mailed Nov. 25, 2013.
Non-Final Office Action regarding U.S. Appl. No. 11/214,179, dated Jan. 24, 2011.
Non-Final Office Action regarding U.S. Appl. No. 11/214,179, dated Nov. 5, 2008.
Non-Final Office Action regarding U.S. Appl. No. 11/214,179, dated Jun. 8, 2010.
Non-Final Office Action regarding U.S. Appl. No. 12/261,643, dated Jan. 27, 2011.
Non-Final Office Action regarding U.S. Appl. No. 12/261,643, dated Mar. 12, 2013.
Non-Final Office Action regarding U.S. Appl. No. 12/943,626, dated Dec. 20, 2012.
Non-Final Office Action regarding U.S. Appl. No. 12/955,355, dated Sep. 11, 2012.
Non-Final Office Action regarding U.S. Appl. No. 13/176,021, dated May 8, 2012.
Non-Final Office Action regarding U.S. Appl. No. 13/435,543, dated Jun. 21, 2012.
Non-Final Office Action regarding U.S. Appl. No. 13/770,123, dated Jun. 11, 2014.
Non-Final Office Action regarding U.S. Appl. No. 13/770,479, dated Jan. 16, 2014.
Notice of Allowance and Fee(s) Due regarding U.S. Appl. No. 12/789,562, dated Oct. 26, 2012.
Notice of Allowance and Fees Due and Notice of Allowability regarding U.S. Appl. No. 11/098,582, dated Feb. 24, 2009.
Notice of Allowance and Fees Due and Notice of Allowability regarding U.S. Appl. No. 11/098,582, dated Sep. 24, 2010.
Notice of Allowance and Fees Due and Notice of Allowability regarding U.S. Appl. No. 11/256,641, dated May 19, 2009.
Notice of Allowance and Fees Due regarding U.S. Appl. No. 12/943,626, dated Jun. 19, 2014.
Notice of Allowance and Fees Due regarding U.S. Appl. No. 13/737,566, dated Jun. 18, 2014.
Notice of Allowance and Fees Due, Interview Summary and Notice of Allowability regarding U.S. Appl. No. 11/214,179, dated Nov. 23, 2011.
Notice of Allowance and Notice of Allowability regarding U.S. Appl. No. 10/286,419, dated Dec. 2, 2004.
Notice of Allowance and Notice of Allowability regarding U.S. Appl. No. 10/675,137, dated Dec. 16, 2005.
Notice of Allowance dated Dec. 21, 2007 from Related U.S. Appl. No. 11/417,609.
Notice of Allowance dated Dec. 3, 2007 from Related U.S. Appl. No. 11/130,562.

* cited by examiner

COMPRESSOR SENSOR MODULE

CROSS-REFERENCE TO RELATED APPLICATIONS

This application claims the benefit of U.S. Provisional Application No. 60/984,902, filed on Nov. 2, 2007. The entire disclosure of the above application is incorporated herein by reference.

FIELD

The present disclosure relates to compressors, and more particularly, to a compressor with a sensor module.

BACKGROUND

The statements in this section merely provide background information related to the present disclosure and may not constitute prior art.

Compressors are used in a variety of industrial and residential applications to circulate refrigerant within a refrigeration, heat pump, HVAC, or chiller system (generically "refrigeration systems") to provide a desired heating or cooling effect. Compressors may include an electric motor to provide torque to compress vapor refrigerant. The electric motor may be powered by an alternating current (AC) or direct current (DC) power supply. In the case of an AC power supply, single or poly-phase AC may be delivered to windings of the electric motor. For example, the compressor may include an electric motor configured to operate with three phase AC. The electric motor may include at least one set of windings corresponding to each of the three phases.

In each application, it is desirable for the compressor to provide consistent and efficient operation to ensure that the refrigeration system functions properly. Variations in the supply of electric power to the electric motor of the compressor may disrupt operation of the electric motor, the compressor, and the refrigeration system. Such variations may include, for example, excessive, or deficient, current or voltage conditions. In the case of a poly-phase AC power supply, such variations may include an unbalanced phase condition wherein the current or voltage of at least one phase of AC is excessively varied from the current or voltage of the other phases. Further, such variations may include a loss of phase condition wherein one phase of AC is interrupted while the remaining phases continue to be delivered. Excessive current or voltage conditions may cause the electric motor to overheat which may damage the electric motor or the compressor. Deficient current or voltage conditions, unbalanced phase conditions, and loss of phase conditions may disrupt operation of the electric motor, the compressor, or the refrigeration system and cause unnecessary damage.

The electric motor of a compressor may be equipped with a temperature or current sensor to detect overheating of the electric motor during electrical power disturbances. For example, a bi-metallic switch may trip and deactivate the electric motor when the electric motor is overheated or drawing excessive electrical current. Such a system, however, does not detect variations in the power supply that may not immediately or drastically increase the temperature of the electric motor. In addition, such systems may not detect a variation in electrical power until the condition has increased the temperature of the electric motor or the electric motor windings.

Further, such systems do not provide sufficient data to evaluate electrical efficiency of the electric motor overall. Variations in the supply of electric power may result in inefficient operation of the compressor, the electric motor, or the refrigeration system. Refrigeration systems generally require a significant amount of energy to operate, with energy requirements being a significant cost to retailers. As a result, it is in the best interest of retailers to closely monitor the supply of electric power to their refrigeration systems to maximize efficiency and reduce operational costs.

SUMMARY

A sensor module for a compressor having an electric motor connected to a power supply is provided. The sensor module may comprise a first input connected to a first voltage sensor that generates a voltage signal corresponding to a voltage of said power supply, a second input connected to a first current sensor that generates a current signal corresponding to a current of said power supply, and a processor connected to the first and second inputs that calculates a power factor of the compressor based on voltage measurements from the first input and current measurements from the second input. The processor may be disposed within an electrical enclosure of the compressor and the electrical enclosure may being configured to house electrical terminals for connecting the power supply to the electric motor.

In other features, the processor may be disposed within a tamper-resistant enclosure within the electrical enclosure.

In other features, the processor may calculate an active power and an apparent power of the compressor based on the voltage measurements from the first input and current measurements from the second input and may calculate the power factor according to a ratio of the active power to the apparent power.

In other features, the processor may determine a voltage waveform based on voltage measurements from the first input and a current waveform based on current measurements from the second input and may calculate the power factor according to an angular difference between the current waveform and the voltage waveform.

In other features, the processor may calculate a power consumption of the compressor based on the voltage measurements from the first input and the current measurements from the second input.

In other features, the processor may calculate an active power of the compressor based on the voltage measurements from the first input and the current measurements from the second input and calculates the power consumption by averaging the active power over a time period.

In other features, the sensor module may further comprise a communication port for communicating information from the sensor module to a control module for the compressor, a system controller for a system associated with the compressor, a portable computing device, and/or a network device.

In other features, the information communicated may include the power factor, a calculated active power, a calculated apparent power, and/or a calculated power consumption of the compressor.

In other features, the power supply may includes first, second, and third phases, with the voltage signal generated by the first voltage sensor corresponding to the first phase, and the current signal generated by the first current sensor corresponding to the first phase. Further, the sensor module may further comprise a third input connected to a second voltage sensor that generates a voltage signal corresponding to a voltage of the second phase. A fourth input connected to a third voltage sensor may generate a voltage signal corresponding to a voltage of the third phase. The processor may be connected to the third and fourth inputs and may calculate the power factor based on voltage measurements received from the third and fourth inputs.

In other features, the processor may estimate a current of the second phase and a current of the third phase and may calculate the power factor based on the estimated currents of the second and third phases.

In other features, the processor may calculate an active power and an apparent power of the compressor based on the voltage measurements from the first input, the current measurements from the second input, the voltage measurements from the third input, the voltage measurements from the fourth input and the estimated currents of the second and third phases and may calculate the power factor according to a ratio of the active power to the apparent power.

In other features, the sensor module may further comprise a fifth input connected to a second current sensor that generates a current signal corresponding to a current of the second phase. The processor may be connected to the fifth input and may calculate the power factor based on current measurements received from the fifth input.

In other features, the processor may estimate a current of the third phase and may calculate the power factor based on the estimated current of the third phase.

In other features, the processor may calculate an active power and an apparent power of the compressor based on the voltage measurements from the first input, the current measurements from the second input, the voltage measurements from the third input, the voltage measurements from the fourth input, the current measurements from the fifth input, and the estimated current of the third phase and calculates the power factor according to a ratio of the active power to the apparent power.

In other features, the sensor module may further comprise a fifth input connected to a second current sensor that generates a current signal corresponding to a current of the second phase and a sixth input connected to a third current sensor that generates a current signal corresponding to a current of the third phase. The processor may be connected to the fifth and sixth inputs and may calculate the power factor based on current measurements received from the fifth and sixth inputs.

In other features, the processor may calculate an active power and an apparent power of the compressor based on the voltage measurements from the first input, the current measurements from the second input, the voltage measurements from the third input, the voltage measurements from the fourth input, the current measurements from the fifth input, and the current measurements from the sixth input and calculates the power factor according to a ratio of the active power to the apparent power.

In other features, a compressor having the sensor module is provided.

A method for a sensor module with a processor disposed within an electrical enclosure of a compressor having an electric motor connected to a power supply is also provided. The electrical enclosure may be configured to house electrical terminals for connecting the power supply to the electric motor. The method may comprise receiving voltage measurements of the power supply from a first voltage sensor connected to the sensor module, receiving current measurements of the power supply from a first current sensor connected to the sensor module, calculating a power factor of the compressor based on the voltage measurements and the current measurements, and generating an output based on the power factor.

In other features, calculating the power factor may comprise calculating an active power and an apparent power of the compressor based on the voltage measurements and the current measurements and calculating the power factor according to a ratio of the active power to the apparent power.

In other features, calculating the power factor may comprise determining a voltage waveform based on the voltage measurements, determining a current waveform based on the current measurements, and calculating the power factor according to an angular difference between the current waveform and the voltage waveform.

In other features, the method may further comprise calculating a power consumption of the compressor based on the voltage measurements and the current measurements.

In other features, calculating the power consumption may comprise calculating an active power of the compressor based on the voltage measurements and the current measurements and calculating the power consumption by averaging the active power over a time period.

In other features, generating the output based on the power factor may comprise communicating the power factor to a control module, a system controller, a portable computing device, and/or a network device, connected to the sensor module.

In other features, power supply may include first, second, and third phases, with the voltage measurements from the first voltage sensor corresponding to the first phase, and the current measurements from the first current sensor corresponding to the first phase. The method may further comprise receiving voltage measurements corresponding to the second phase of the power supply from a second voltage sensor connected to the sensor module, receiving voltage measurements corresponding to the third phase of the power supply from a third voltage sensor connected to the sensor module. The calculating the power factor may comprise calculating the power factor based on the voltage measurements corresponding to the second phase and the voltage measurements corresponding to the third phase.

In other features, the method may further comprise calculating a current estimate for the second phase and calculating a current estimate for the third phase. Calculating the power factor may comprise calculating the power factor based on the current estimates for the second and third phases.

In other features, calculating the power factor may comprise calculating an active power and an apparent power of the compressor based on the voltage measurements for the first, second, and third phases, the current measurements for the first phase, and the current estimates for the second and third phases and calculating the power factor according to a ratio of the active power to the apparent power.

In other features, the method may further comprise receiving current measurements corresponding to the second phase of the power supply from a second current sensor connected to the sensor module. Calculating the power factor may comprise calculating the power factor based on the current measurements corresponding to the second phase.

In other features, the method may further comprise calculating a current estimate for the third phase. Calculating the power factor may comprise calculating the power factor based on the current estimate for the third phase.

In other features, calculating the power factor may comprise calculating an active power and an apparent power of the compressor based on the voltage measurements for the first, second, and third phases, the current measurements for the first and second phases, and the current estimate for the third phase and calculating the power factor according to a ratio of the active power to the apparent power.

In other features, the method may further comprising receiving current measurements corresponding to the third phase of the power supply from a third current sensor connected to the sensor module. Calculating the power factor may comprise calculating the power factor based on the current measurements corresponding to the third phase.

In other features, calculating the power factor may comprise calculating an active power and an apparent power of the compressor based on the voltage measurements for the first, second, and third phases, and the current measurements for the first, second, and third phases and calculating the power factor according to a ratio of the active power to the apparent power.

A computer-readable medium having computer executable instructions for performing the method is provided.

Another sensor module for a compressor having an electric motor connected to a power supply is also provided. The sensor module may comprise a first input connected to a first voltage sensor that generates a voltage signal corresponding to a voltage of the power supply, a second input connected to a first current sensor that generates a current signal corresponding to a current of the power supply, and a processor connected to the first and second inputs that monitors the first and second inputs. The processor may detect an unexpected variation of electric power from the power supply and/or a mechanical malfunction based on voltage measurements from the first input and current measurements from the second input. The processor may be disposed within an electrical enclosure of the compressor, the electrical enclosure being configured to house electrical terminals for connecting the power supply to the electric motor.

In other features, the processor may be disposed within a tamper-resistant enclosure within the electrical enclosure.

In other features, the sensor module may further comprise a communication port for communicating a notification corresponding to the expected variation and/or the mechanical malfunction to a control module for the compressor, a system controller for a system associated with the compressor, a portable computing device, and/or a network device.

In other features, the processor may detect the unexpected variation of electric power including a no-power condition.

In other features, the processor may compare the voltage measurements from the first input with a predetermined voltage threshold and may determine that the no-power condition exists when the voltage measurements remain less than the predetermined voltage threshold for a predetermined time period.

In other features, the sensor module may detects the unexpected variation of electric power including a low-voltage condition.

In other features, the processor may determine a normal operating voltage of the compressor and may determine that the low-voltage condition exists when the voltage measurements from the first input are less than a predetermined percentage of the normal operating voltage.

In other features, the processor may determine the normal operating voltage based on historical data of the compressor.

In other features, the processor may determine the normal operating voltage based on an inputted normal operating voltage.

In other features, the sensor module may detect the unexpected variation of electric power including a current-overload condition.

In other features, the processor may determine a current maximum threshold, may compare the current measurements from the second input with the current maximum threshold, and may determine that the current-overload condition exists based on the comparison.

In other features, the power supply may include first, second, and third phases, with the voltage signal generated by the first voltage sensor corresponding to the first phase, and with the current signal generated by the first current sensor corresponding to the first phase. The sensor module may further comprise a third input connected to a second voltage sensor that generates a voltage signal corresponding to a voltage of the second phase and a fourth input connected to a third voltage sensor that generates a voltage signal corresponding to a voltage of the third phase. The processor may be connected to the third and fourth inputs and may detect the unexpected variation of electric power from the power supply based on voltage measurements received from the third and fourth inputs.

In other features, the unexpected variation of electric power may include a phase-loss condition.

In other features, the processor may compare voltage measurements received from the first, third, and fourth inputs and may determine that the phase-loss condition exists when voltage measurements from the first input are less than a predetermined percentage of an average of voltage measurements from the third and fourth inputs.

In other features, the unexpected variation of electric power may include a voltage-imbalance condition.

In other features, the processor may calculate an average of voltage measurements received from the first, third, and fourth inputs and may determine that the voltage-imbalance condition based on the greatest of a difference between voltage measurements from the first input and the average, a difference between voltage measurements from the third input and the average, and a difference between voltage measurements from the fourth input and the average.

In other features, the sensor module may further comprise a fifth input connected to a second current sensor that generates a current signal corresponding to a current of the second phase. The processor may be connected to the fifth input and may detect the unexpected variation of electric power from the power supply based on current measurements received from the fifth input.

In other features, the unexpected variation of electric power may include a current-delay condition.

In other features, the processor may determine that the current-delay condition exists when a current measurement from the second input is greater than a predetermined current threshold and a current measurement from the fifth input is not greater than the predetermined current threshold within a predetermined time period.

In other features, the sensor module may detect the mechanical malfunction including a welded-contactor condition.

In other features, the processor may receive run-state data corresponding to a current run-state of the compressor, may compare the voltage measurements from the first input with a voltage threshold, and may determine that the welded-contactor condition exists based on the current run-state and the comparison.

In other features, the sensor module may detect the mechanical malfunction including a locked-rotor condition.

In other features, the processor may compare the current measurements from the second input with a current threshold and may determine that the locked-rotor condition exists when the current measurements are greater than the current threshold.

In other features, the processor may generate a buffer of the current measurements from the second input, may determine a greatest current value from the buffer, may compare the current measurements with the greatest current value from the buffer, and may determine that the locked-rotor condition exists when the current measurements are greater than a predetermined percentage of the greatest current value.

In other features, the sensor module may detect the mechanical malfunction including a protection-trip condition.

In other features, the processor may compare the voltage measurements with a voltage threshold and the current measurements with a current threshold and may determine that the protection-trip condition exists when the voltage measurements are greater than the voltage threshold and the current measurements are less than the current threshold.

Another method for a sensor module with a processor disposed within an electrical enclosure of a compressor having an electric motor connected to a power supply is also provided. The electrical enclosure may be configured to house electrical terminals for connecting the power supply to the electric motor. The method may comprise receiving voltage measurements of the power supply from a first voltage sensor connected to the sensor module, receiving current measurements of the power supply from a first current sensor connected to the sensor module, detecting an unexpected variation of electric power from the power supply and/or a mechanical malfunction of the compressor based on the voltage measurements and the current measurements, and generating an output based on the detecting.

In other features, generating the output based on the detecting may comprise communicating a result of the detecting to a control module, a system controller, a portable computing device, and/or a network device, connected to the sensor module.

In other features, the detecting may include detecting the unexpected variation of electric power including a no-power condition.

In other features, detecting the no-power condition may comprise comparing the voltage measurements with a predetermined voltage threshold, and determining that the no-power condition exists when the voltage measurements remain less than the predetermined voltage threshold for a predetermined time period.

In other features, the detecting may include detecting the unexpected variation of electric power including a low-voltage condition.

In other features, detecting the low-voltage condition may comprise determining a normal operating voltage of the compressor, and determining that the low-voltage condition exists when the voltage measurements are less than a predetermined percentage of the normal operating voltage.

In other features, determining the normal operating voltage may comprise determining the normal operating voltage based on historical data of the compressor.

In other features, determining the normal operating voltage may comprise determining the normal operating voltage based on an inputted normal operating voltage.

In other features, the detecting may include detecting the unexpected variation of electric power including a current-overload condition.

In other features, detecting the current-overload condition may comprise determining a current maximum threshold, comparing the current measurements with the current maximum threshold, and determining that the current-overload condition exists based on the comparison.

In other features, the power supply may include first, second, and third phases, with the voltage measurements from the first voltage sensor corresponding to the first phase, and with the current measurements from the first current sensor corresponding to the first phase. The method may further comprise receiving voltage measurements corresponding to the second phase of the power supply from a second voltage sensor connected to the sensor module, and receiving voltage measurements corresponding to the third phase of the power supply from a third voltage sensor connected to the sensor module. Detecting the unexpected variation of electric power from the power supply may be based on the voltage measurements corresponding to the first, second, and third phases and the current measurements.

In other features, detecting the unexpected variation of electric power may include detecting a phase-loss condition.

In other features, detecting the phase-loss condition may comprise comparing voltage measurements corresponding to the first, second, and third phases, and determining that the phase-loss condition exists when voltage measurements corresponding to the first phase are less than a predetermined percentage of an average of voltage measurements corresponding to the second and third phases.

In other features, detecting the unexpected variation of electric power may include detecting a voltage-imbalance condition.

In other features, detecting the voltage-imbalance condition may comprise calculating an average of the voltage measurements corresponding to the first, second, and third phases and determining that the voltage-imbalance condition exists based on the greatest of a difference between voltage measurements corresponding to the first phase and the average, a difference between voltage measurements corresponding to the second phase and the average, and a difference between voltage measurements corresponding to the third phase and the average.

In other features, the method may further comprise receiving current measurements corresponding to the second phase of the power supply from a second current sensor connected to the sensor module. The detecting the unexpected variation of electric power from the power supply may include detecting the unexpected variation of electric power based on the current measurements corresponding to the first and second phases.

In other features, detecting the unexpected variation of electric power may include detecting a current-delay condition.

In other features, detecting the current-delay condition may comprise comparing the current measurements corresponding with the first phase and the current measurements corresponding with the second phase with a predetermined current threshold and determining that the current-delay condition exists when the current measurements corresponding to the first phase are greater than the predetermined current threshold and the current measurements corresponding with the second phase are not greater than the predetermined current threshold within a predetermined time period.

In other features, the detecting may include detecting the mechanical malfunction including a welded-contactor condition.

In other features, the method may further comprise receiving run-state data corresponding to a current run-state of the compressor, comparing the voltage measurements with a voltage threshold, and determining that the welded-contactor condition exists based on the current run-state and the comparison.

In other features, the detecting may include detecting the mechanical malfunction of the compressor including a locked-rotor condition.

In other features, the detecting the locked-rotor condition may comprise comparing the current measurements with a current threshold and determining that the locked-rotor condition exists when the current measurements are greater than the current threshold.

In other features, detecting the locked-rotor condition may comprise generating a buffer of the current measurements, determining a greatest current value from the buffer, comparing the current measurements with the current value from the buffer, and determining that the locked-rotor condition exists when the current measurements are greater than a predetermined percentage of the greatest current value.

In other features, the detecting may include detecting the mechanical malfunction including a protection-trip condition.

In other features, the detecting the protection-trip condition may comprise comparing the voltage measurements with a voltage threshold, comparing the current measurements with a current threshold, and determining that the protection-trip condition exists when the voltage measurements are greater than the voltage threshold and the current measurements are less than the current threshold.

Further areas of applicability will become apparent from the description provided herein. It should be understood that the description and specific examples are intended for purposes of illustration only and are not intended to limit the scope of the present disclosure.

DRAWINGS

The drawings described herein are for illustration purposes only and are not intended to limit the scope of the present disclosure in any way.

DETAILED DESCRIPTION

Figure 1:
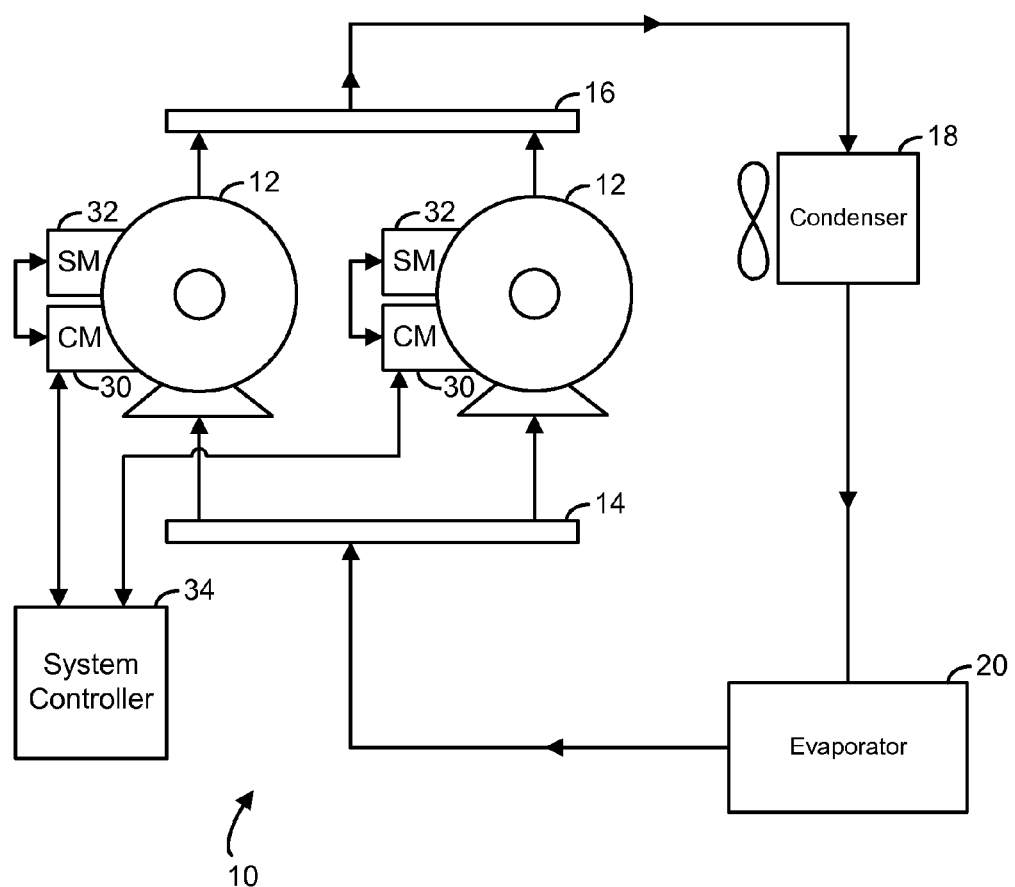
FIG. 1 is a schematic view of a refrigeration system.

The following description is merely exemplary in nature and is not intended to limit the present disclosure, application, or uses. It should be understood that throughout the drawings, corresponding reference numerals indicate like or corresponding parts and features.

As used herein, the terms module, control module, and controller refer to one or more of the following: an application specific integrated circuit (ASIC), an electronic circuit, a processor (shared, dedicated, or group) and memory that execute one or more software or firmware programs, a combinational logic circuit, or other suitable components that provide the described functionality. Further, as used herein, computer-readable medium refers to any medium capable of storing data for a computer. Computer-readable medium may include, but is not limited to, memory, RAM, ROM, PROM, EPROM, EEPROM, flash memory, punch cards, dip switches, CD-ROM, floppy disk, magnetic tape, other magnetic medium, optical medium, or any other device or medium capable of storing data for a computer.

With reference to FIG. 1, an exemplary refrigeration system 10 may include a plurality of compressors 12 piped together with a common suction manifold 14 and a discharge header 16. Compressor 12 may be a reciprocating compressor, a scroll type compressor, or another type of compressor. Compressor 12 may include a crank case. Compressors 12 may be equipped with electric motors to compress refrigerant vapor that is delivered to a condenser 18 where the refrigerant vapor is liquefied at high pressure, thereby rejecting heat to the outside air. The liquid refrigerant exiting the condenser 18 is delivered to an evaporator 20. As hot air moves across the evaporator, the liquid turns into gas, thereby removing heat from the air and cooling a refrigerated space. This low pressure gas is delivered to the compressors 12 and again compressed to a high pressure gas to start the refrigeration cycle again. While a refrigeration system 10 with two compressors 12, a condenser 18, and an evaporator 20 is shown in FIG. 1, a refrigeration system 10 may be configured with any number of compressors 12, condensers 18, evaporators 20, or other refrigeration system components.

Each compressor 12 may be equipped with a control module (CM) 30 and a sensor module (SM) 32. As described herein, SM 32 may be affixed to compressor 12 and may monitor electric power delivered to compressor 12 with one or more voltage sensors and one or more current sensors. Based on electrical power measurements, such as electric current (I) and voltage (V), SM 32 may determine apparent power, actual power, power consumption, and power factor calculations for the electric motor of compressor 12. SM 32 may communicate the electric power measurements and calculations to CM 30. SM 32 may also alert CM 30 of variations in the power supply, or of mechanical failures, based on the measurements and calculations. For example, SM 32 may alert CM 30 of an excessive current or voltage condition, a deficient current or voltage condition, a current or voltage imbalance condition, or a loss of phase or current delay condition (if poly-phase electric power is used). Based on the monitoring of the electric power supply and based on the communication with CM 30, SM 32 may detect and alert CM 30 to a welded contactor condition, or a locked rotor condition.

CM 30 may control operation of compressor 12 based on data received from SM 32, based on other compressor and refrigeration system data received from other compressor or refrigeration system sensors, and based on communication with a system controller 34. CM 30 may be a protection and control system of the type disclosed in assignee's commonly-owned U.S. patent application Ser. No. 11/059,646, Publication No. 2005/0235660, filed Feb. 16, 2005, the disclosure of which is incorporated herein by reference. Other suitable protection and control systems may be used.

In addition to the data received by CM 30 from SM 32, CM 30 may receive compressor and refrigeration system data including discharge pressure, discharge temperature, suction pressure, suction temperature, and other compressor related data from pressure and temperature sensors connected to, or, embedded within, compressor 12. In addition, oil level and oil pressure data may be received by SM 32 and communicated to CM 30 and/or received by CM 30 directly. In this way, CM 30 may monitor the various operating parameters of compressor 12 and control operation of compressor 12 based on protection and control algorithms and based on communication with system controller 34. For example, CM 30 may activate and deactivate the compressor 12 according to a set-point, such as a suction pressure, suction temperature, discharge pressure, or discharge temperature set-point. In the case of a discharge pressure set-point, CM 30 may activate compressor 12 when the discharge pressure, as determined by a discharge pressure sensor, falls below the discharge pressure set-point. CM 30 may deactivate compressor 12 when the discharge pressure rises above the discharge pressure set-point.

Further, CM 30 may activate or deactivate compressor 12 based on data and/or alerts received from SM 32. For example, CM 30 may deactivate compressor 12 when alerted of an excessive current or voltage condition, a deficient current or voltage condition, a current or voltage imbalance condition, or a loss of phase or current delay condition (if poly-phase electric power is used). Further, CM 30 may activate compressor 12 when alerted of a welded contactor condition or deactivate compressor 12 when alerted of a locked rotor condition. CM 30 may communicate operating data of compressor 12, including electric power data received from SM 32, to system controller 34.

In this way, SM 32 may be specific to compressor 12 and may be located within an electrical enclosure 72 of compressor 12 for housing electrical connections to compressor 12 (shown in FIGS. 5-12) at the time of manufacture of compressor 12. CM 30 may be installed on compressor 12 after manufacture and at the time compressor 12 is installed at a particular location in a particular refrigeration system, for example. Different control modules may be manufactured by different manufacturers. However, each CM 30 may be designed and configured to communicate with SM 32. In other words, SM 32 for a particular compressor 12 may provide data and signals that can be communicated to any control module appropriately configured to communicate with SM 32. Further, manufacturers of different control modules may configure a control module to receive data and signals from SM 32 without knowledge of the algorithms and computations employed by SM 32 to provide the data and signals.

System controller 34 may be used and configured to control the overall operation of the refrigeration system 10. System controller 34 is preferably an Einstein Area Controller offered by CPC, Inc. of Atlanta, Ga., or any other type of programmable controller that may be programmed to operate refrigeration system 10 and communicate with CM 30. System controller 34 may monitor refrigeration system operating conditions, such as condenser temperatures and pressures, and evaporator temperatures and pressures, as well as environmental conditions, such as ambient temperature, to determine refrigeration system load and demand. System controller 34 may communicate with CM 30 to adjust set-points based on operating conditions to maximize efficiency of refrigeration system 10. System controller 34 may evaluate efficiency based on electric power measurements and calculations made by SM 32 and communicated to system controller 34 from CM 30.

Figure 2:
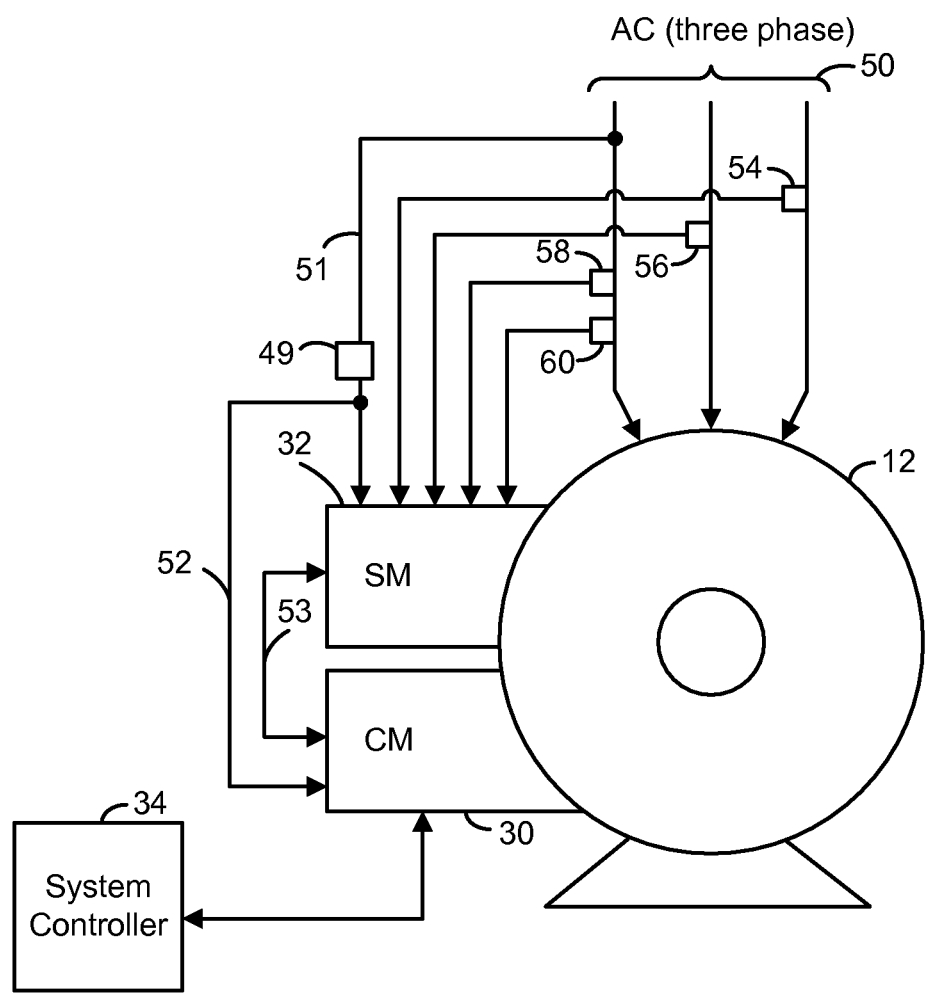
FIG. 2 is a schematic view of a compressor with a sensor module and a control module.

With reference to FIG. 2, three phase AC electric power 50 may be delivered to compressor 12 to operate an electric motor. SM 32 and CM 30 may receive low voltage power from one of the phases of electric power 50 delivered to compressor 12. For example, a transformer 49 may convert electric power 51 from one of the phases to a lower voltage for delivery to SM 32 and CM 30. In this way, SM 32 and CM 30 may operate on single phase AC electric power at a lower voltage than electric power 50 delivered to compressor 12. For example, electric power delivered to SM 32 and CM 30 may be 24 V AC. When low voltage power, for example 24V AC, is used to power CM 30 and SM 32, lower voltage rated components, such as lower voltage wiring connections, may be used.

SM 32 may be connected to three voltage sensors 54, 56, 58, for sensing voltage of each phase of electric power 50 delivered to compressor 12. In addition, SM 32 may be connected to a current sensor 60 for sensing electric current of one of the phases of electric power 50 delivered to compressor 12. Current sensor 60 may be a current transformer or current shunt resistor.

When a single current sensor 60 is used, electric current for the other phases may be estimated based on voltage measurements and based on the current measurement from current sensor 60. Because the load for each winding of the electric motor may be substantially the same as the load for each of the other windings, because the voltage for each phase is known from measurement, and because the current for one phase is known from measurement, current in the remaining phases may be estimated.

Figure 3:
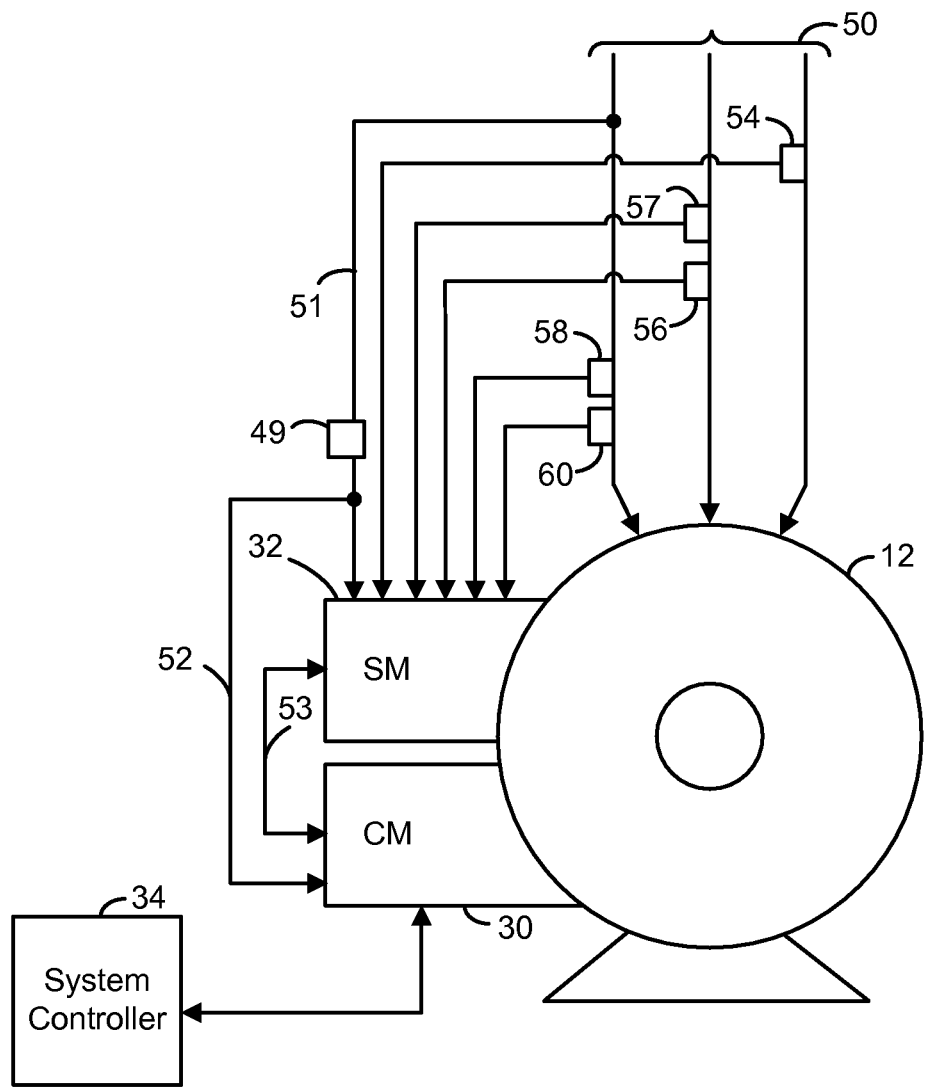
FIG. 3 is a schematic view of a compressor with a sensor module and a control module.
Figure 4:
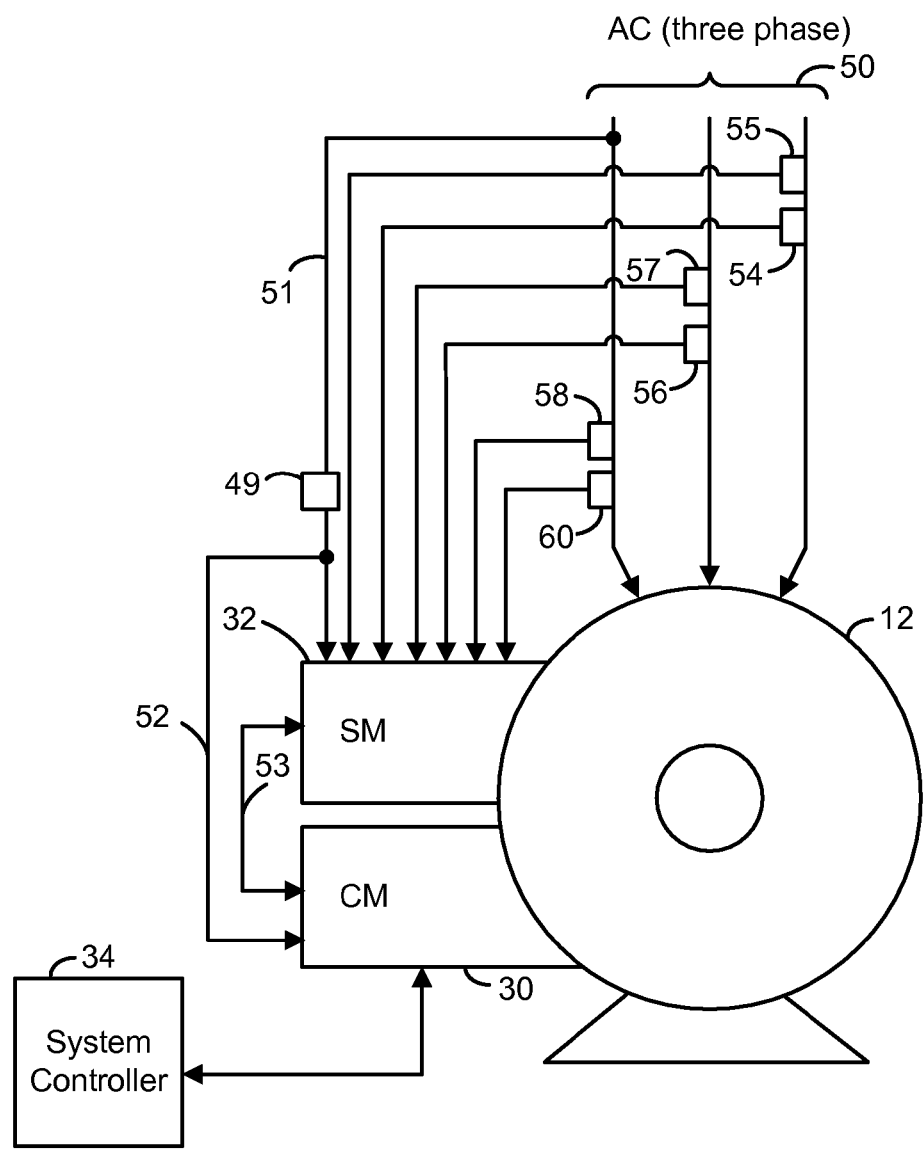
FIG. 4 is a schematic view of a compressor with a sensor module and a control module.

Additional current sensors may also be used and connected to SM 32. With reference to FIG. 3, two current sensors 57, 60 may be used to sense electric current for two phases of electric power 50. When two current sensors 57, 60 are used, electric current for the remaining phase may be estimated based on voltage measurements and based on the current measurements from current sensors 57, 60. With reference to FIG. 4, three current sensors 55, 57, 60 may be used to sense electric current for all three phases of electric power 50.

In the case of a dual winding three phase electric motor, six electrical power terminals may be used, with one terminal for each winding resulting in two terminals for each of the three phases of electric power 50. In such case, a voltage sensor may be included for each of the six terminals, with each of the six voltage sensors being in communication with SM 32. In addition, a current sensor may be included for one or more of the six electrical connections.

Figure 5:
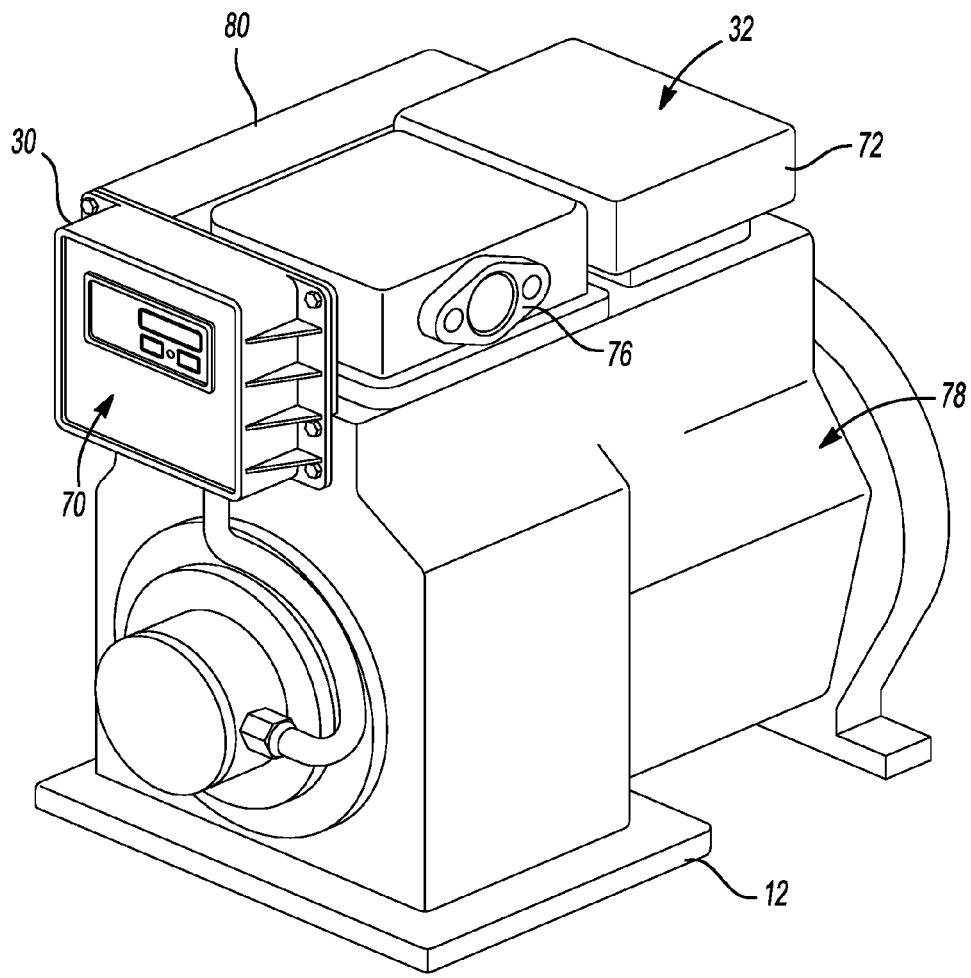
FIG. 5 is a perspective view of a compressor with a sensor module and a control module.
Figure 6:
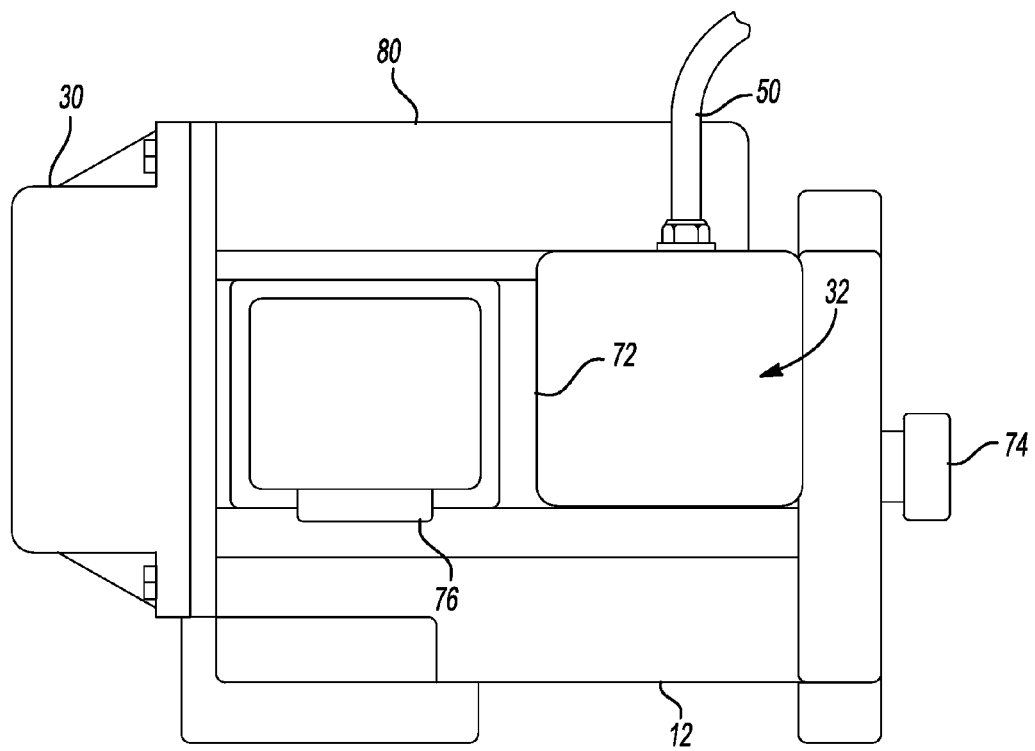
FIG. 6 is a top view of a compressor with a sensor module and a control module.

With reference to FIGS. 5 and 6, CM 30 and SM 32 may be mounted on or within compressor 12. CM 30 may include a display 70 for graphically displaying alerts or messages. As discussed above, SM 32 may be located within electrical enclosure 72 of compressor 12 for housing electrical connections to compressor 12.

Compressor 12 may include a suction nozzle 74, a discharge nozzle 76, and an electric motor disposed within an electric motor housing 78.

Electric power 50 may be received by electrical enclosure 72. CM 30 may be connected to SM 32 through a housing 80. In this way, CM 30 and SM 32 may be located at different locations on or within compressor 12, and may communicate via a communication connection routed on, within, or through compressor 12, such as a communication connection routed through housing 80.

With reference to FIGS. 7 through 12, SM 32 may be located within electrical enclosure 72. In FIGS. 7 through 12, a schematic view of electrical enclosure 72 and SM 32 is shown. SM 32 may include a processor 100 with RAM 102 and ROM 104 disposed on a printed circuit board (PCB)106. Electrical enclosure 72 may be an enclosure for housing electrical terminals 108 connected to an electric motor of compressor 12. Electrical terminals 108 may connect electric power 50 to the electric motor of compressor 12.

Electrical enclosure 72 may include a transformer 49 for converting electric power 50 to a lower voltage for use by SM 32 and CM 30. For example, electric power 51 may be converted by transformer 49 and delivered to SM 32. SM 32 may receive low voltage electric power from transformer 49 through a power input 110 of PCB 106. Electric power may also be routed through electrical enclosure 72 to CM 30 via electrical connection 52.

Voltage sensors 54, 56, 58 may be located proximate each of electrical terminals 108. Processor 100 may be connected to voltage sensors 54, 56, 58 and may periodically receive or sample voltage measurements. Likewise, current sensor 60 may be located proximate one of electrical power leads 116. Processor 100 may be connected to current sensor 60 and may periodically receive or sample current measurements. Electrical voltage and current measurements from voltage sensors 54, 56, 58 and from current sensor 60 may be suitably scaled for the processor 100.

PCB 106 may include a communication port 118 to allow communication between processor 100 of SM 32 and CM 30. A communication link between SM 32 and CM 30 may include an optical isolator 119 to electrically separate the communication link between SM 32 and CM 30 while allowing communication. Optical isolator 119 may be located within electrical enclosure 72. Although optical isolator 119 is independently shown, optical isolator 119 may also be located on PCB 106. At least one additional communication port 120 may also be provided for communication between SM 32 and other devices. A handheld or portable device may directly access and communicate with SM 32 via communication port 120. For example, communication port 120 may allow for in-circuit programming of SM 32 a device connected to communication port 120. Additionally, communication port 120 may be connected to a network device for communication with SM 32 across a network.

Communication with SM 32 may be made via any suitable communication protocol, such as I2C, serial peripheral interface (SPI), RS232, RS485, universal serial bus (USB), or any other suitable communication protocol.

Processor 100 may access compressor configuration and operating data stored in an embedded ROM 124 disposed in a tamper resistant housing 140 within electrical enclosure 72. Embedded ROM 124 may be a compressor memory system disclosed in assignee's commonly-owned U.S. patent application Ser. No. 11/405,021, filed Apr. 14, 2006, U.S. patent application Ser. No. 11/474,865, filed Jun. 26, 2006, U.S. patent application Ser. No. 11/474,821, filed Jun. 26, 2006, U.S. patent application Ser. No. 11/474,798, filed Jun. 26, 2006, or U.S. Patent Application No. 60/674,781, filed Apr. 26, 2005, the disclosures of which are incorporated herein by reference. In addition, other suitable memory systems may be used.

Embedded ROM 124 may store configuration and operating data for compressor 12. When configuration data for compressor 12 is modified, the modified data may likewise be stored in embedded ROM 124. Configuration data for compressor 12 may be communicated to CM 30 or system controller 34. When compressor and/or SM 32 are replaced, the default configuration data for the new compressor 12 may be communicated to CM 30 and/or system controller 34 upon startup. In addition, configuration data may be downloaded remotely. For example, configuration data in embedded ROM 124 may include operating and diagnostic software that may be upgraded via a network connection. In this way, operating and diagnostic software may be upgraded efficiently over the network connection, for example, via the internet.

Relays 126, 127 may be connected to processor 100. Relay 126 may control activation or deactivation of compressor 12. When SM 32 determines that an undesirable operating condition exists, SM 32 may simply deactivate compressor 12 via relay 126. Alternatively, SM 32 may notify CM 30 of the condition so that CM 30 may deactivate the compressor 12. Relay 127 may be connected to a compressor related component. For example, relay 127 may be connected to a crank case heater. SM 32 may activate or deactivate the crank case heater as necessary, based on operating conditions or instructions from CM 30 or system controller 34. While two relays 126, 127 are shown, SM 32 may, alternatively, be configured to operate one relay, or more than two relays.

Processor 100 and PCB 106 may be mounted within a housing enclosure 130. Housing enclosure 130 may be attached to or embedded within electrical enclosure 72. Electrical enclosure 72 provides an enclosure for housing electrical terminals 108 and transformer 49. Housing enclosure 130 may be tamper-resistant such that a user of compressor 12 may be unable to inadvertently or accidentally access processor 100 and PCB 106. In this way, SM 32 may remain with compressor 12, regardless of whether compressor 12 is moved to a different location, returned to the manufacturer for repair, or used with a different CM 30.

LED's 131, 132 may be located on, or connected to, PCB 106 and controlled by processor 100. LED's 131, 132 may indicate status of SM 32 or an operating condition of compressor 12. LED's 131, 132 may be located on housing enclosure 130 or viewable through housing enclosure 130. For example, LED 131 may be red and LED 132 may be green. SM 32 may light green LED 132 to indicate normal operation. SM 32 may light red LED 131 to indicate a predetermined operating condition. SM 32 may also flash the LED's 131, 132 to indicate other predetermined operating conditions.

Figure 7:
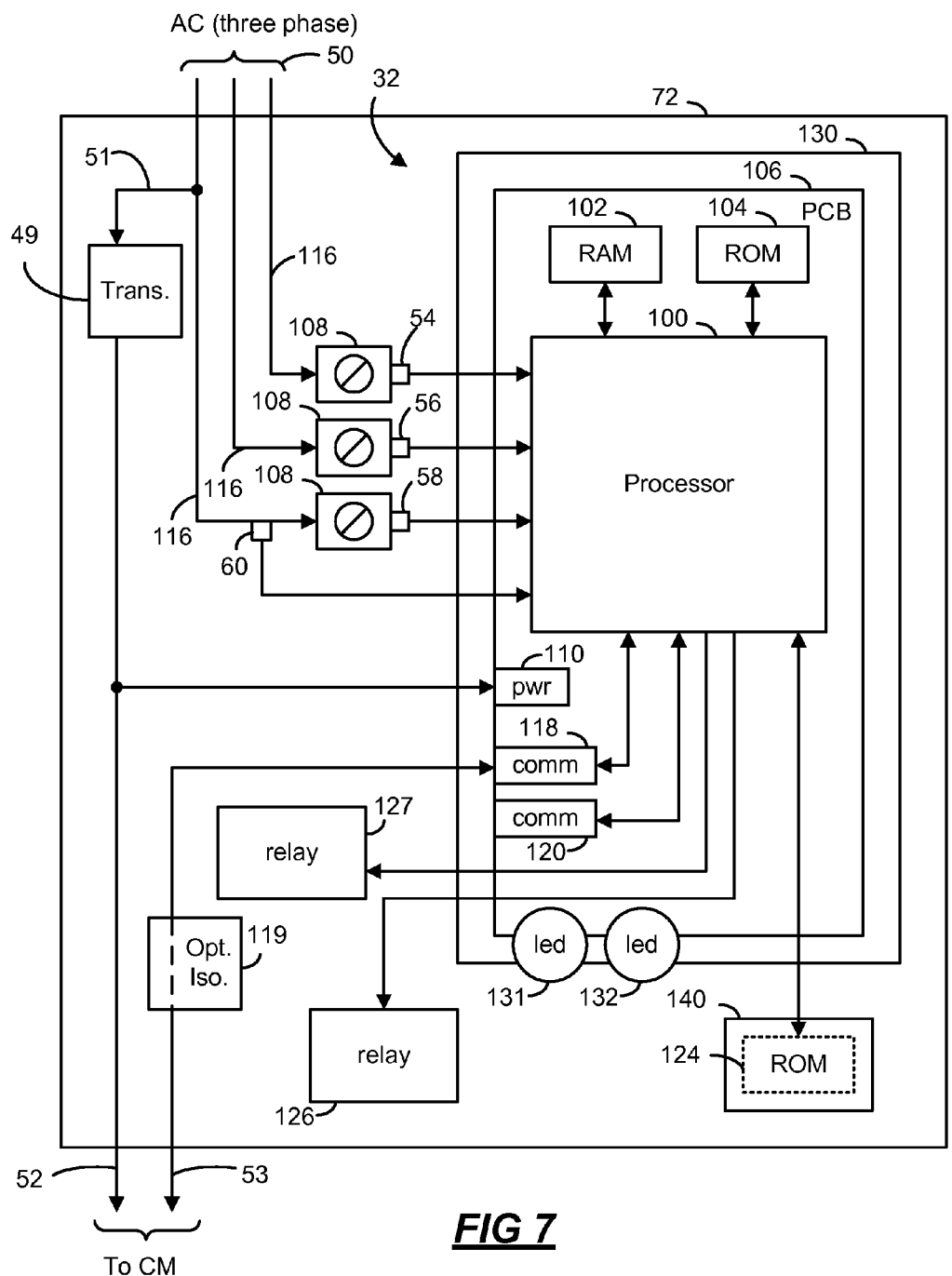
FIG. 7 is a schematic view of an electrical enclosure of a compressor including a sensor module.
Figure 8:
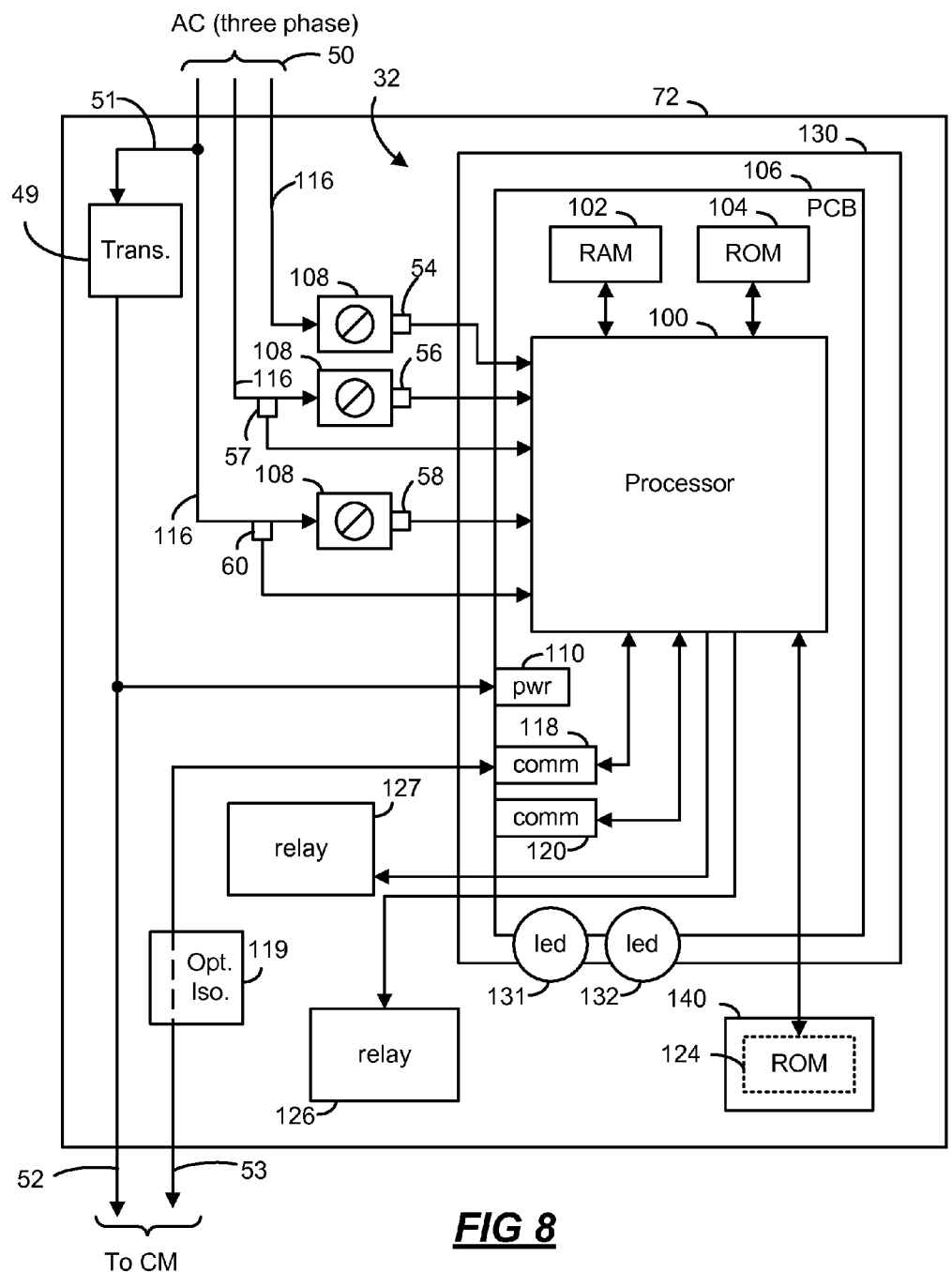
FIG. 8 is a schematic view of an electrical enclosure of a compressor including a sensor module.
Figure 9:
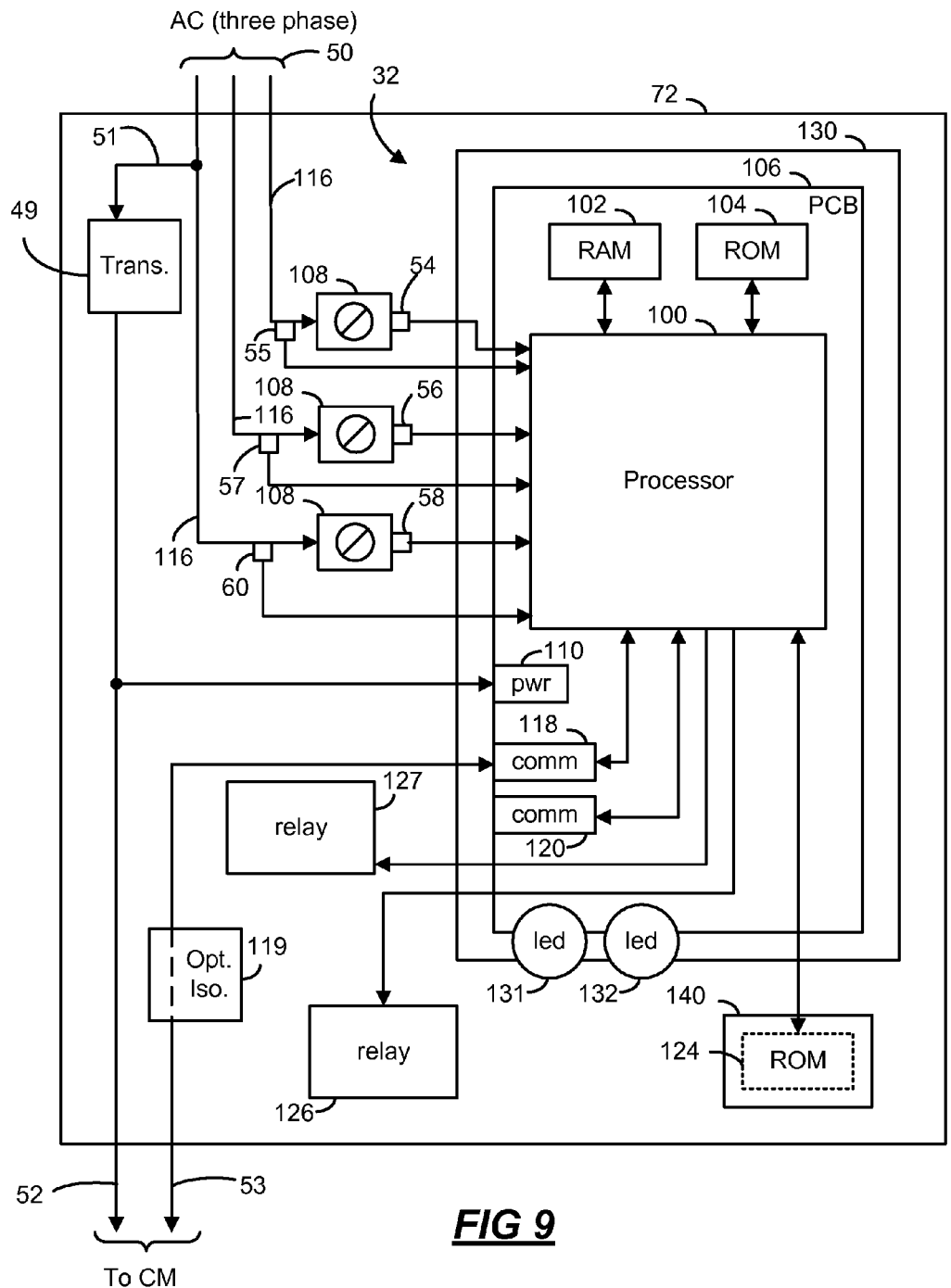
FIG. 9 is a schematic view of an electrical enclosure of a compressor including a sensor module.

In FIG. 7, one current sensor 60 is shown. Additional current sensors may also be used and connected to SM 32. With reference to FIG. 8, two current sensors 57, 60 may be used to sense electric current for two phases of electric power 50. When two current sensors 57, 60 are used, electric current for the remaining phase may be estimated based on voltage measurements and based on the current measurements from current sensors 57, 60. With reference to FIG. 9, three current sensors 55, 57, 60 may be used to sense electric current for all three phases of electric power 50.

Figure 10:
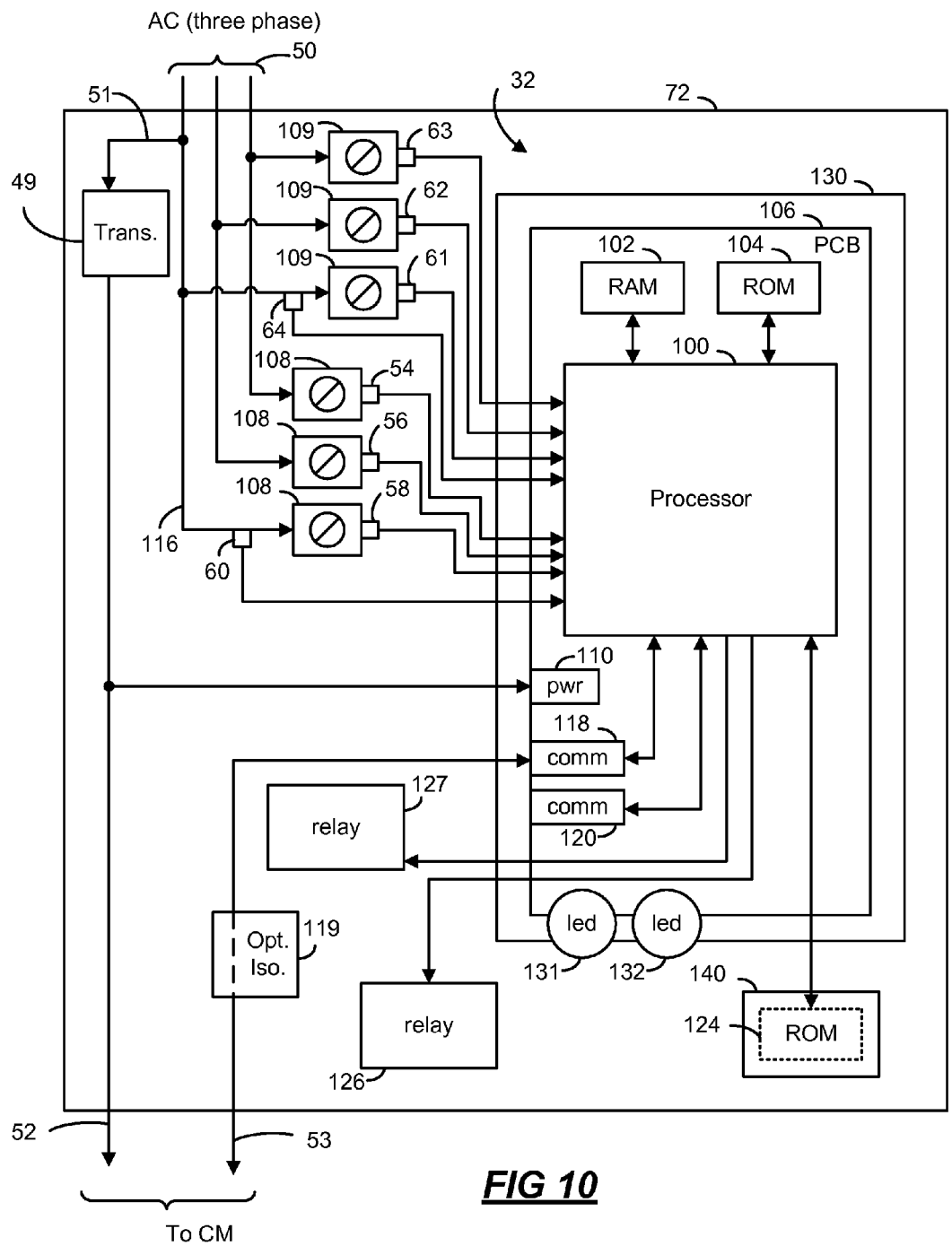
FIG. 10 is a schematic view of an electrical enclosure of a compressor including a sensor module.
Figure 11:
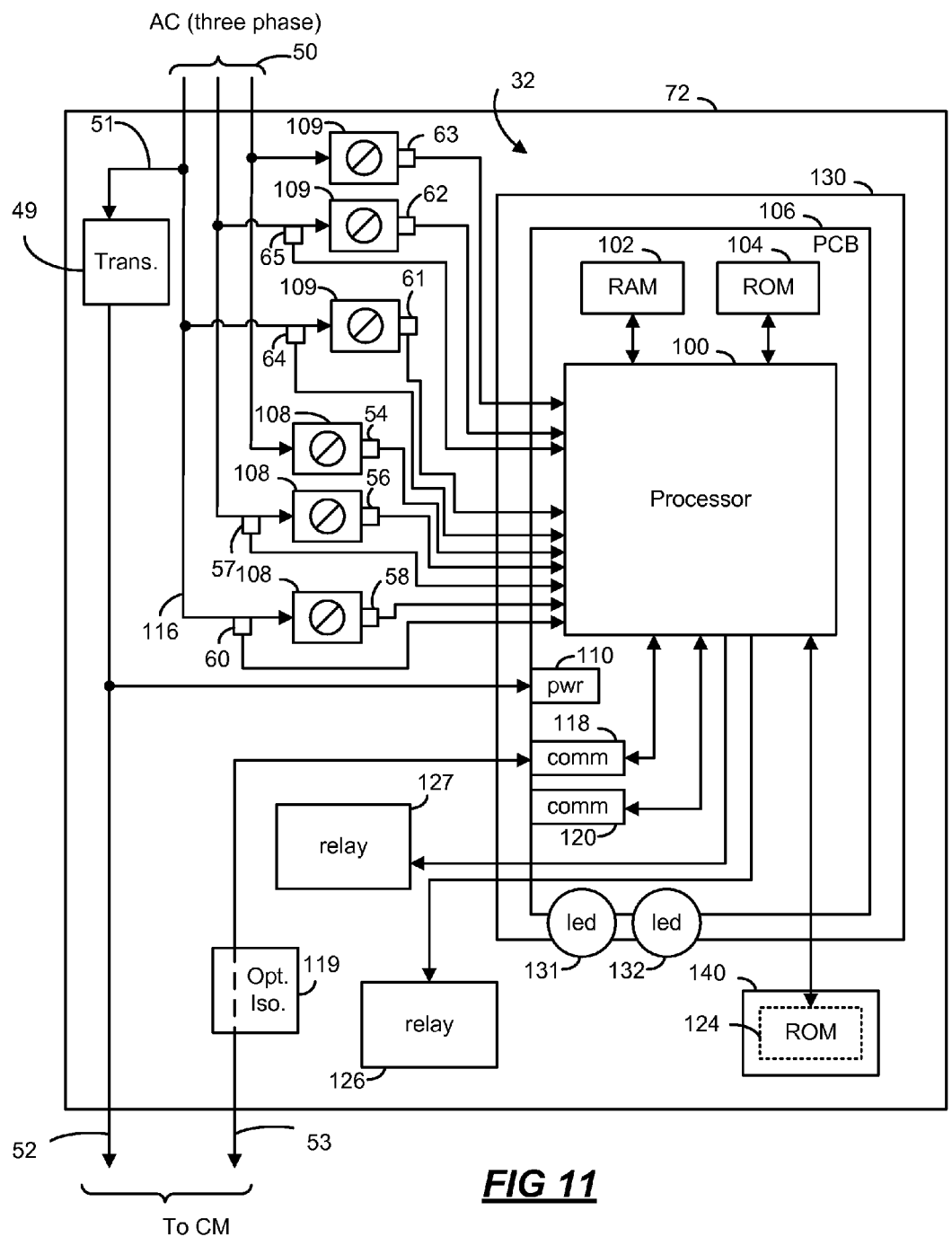
FIG. 11 is a schematic view of an electrical enclosure of a compressor including a sensor module.
Figure 12:
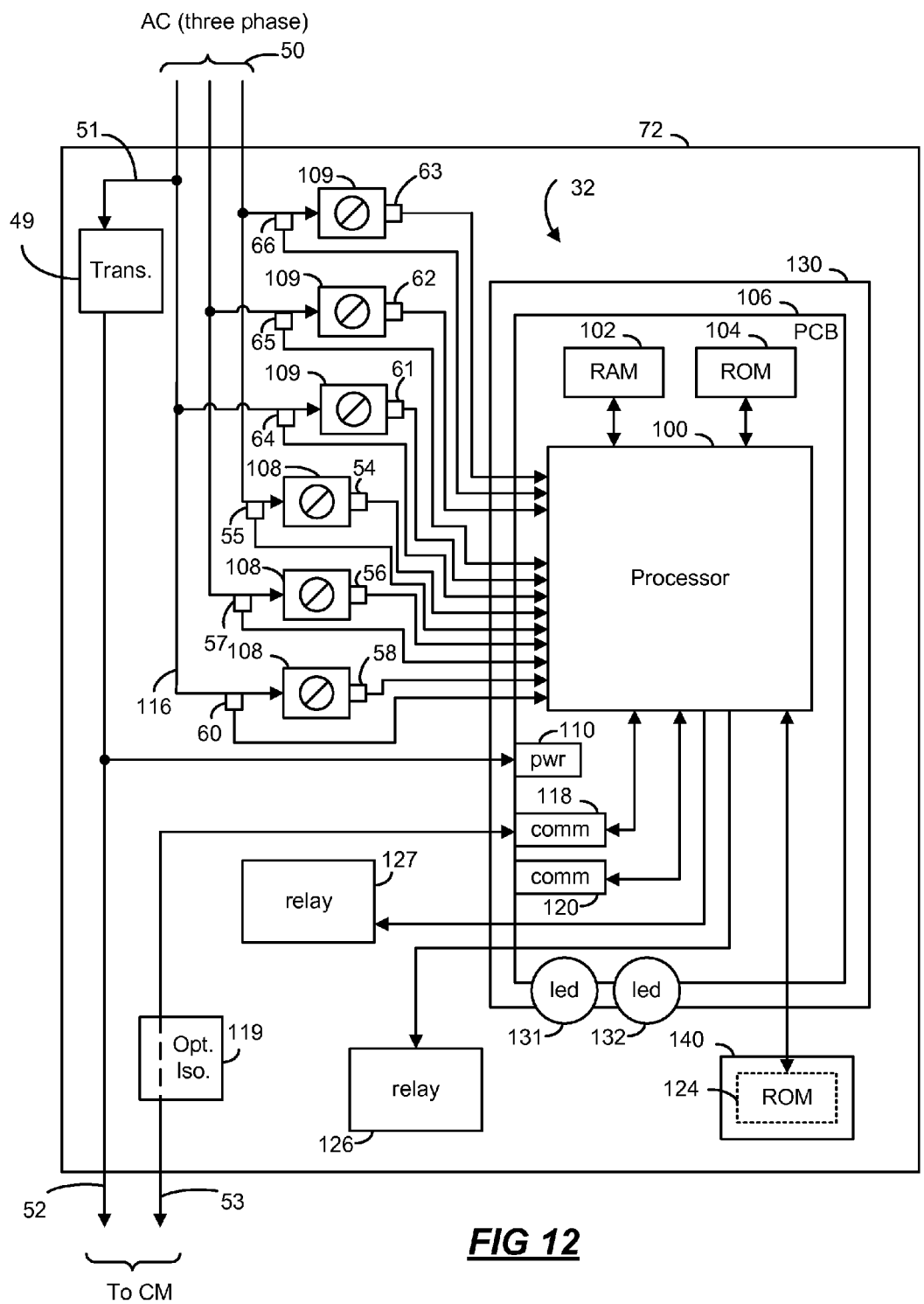
FIG. 12 is a schematic view of an electrical enclosure of a compressor including a sensor module.

With reference to FIGS. 10 to 12, in the case of a dual winding three phase electric motor, electrical enclosure 72 may include additional electrical terminals 109 for additional windings. In such case, six electrical terminals 108, 109 may be located within electrical enclosure 72. Three electrical terminals 108 may be connected to the three phases of electric power 50 for a first set of windings of the electric motor of compressor 12. Three additional electrical terminals 109 may also connected to the three phases of electric power 50 for a second set of windings of the electric motor of compressor 12.

Voltage sensors 61, 62, 63 may be located proximate each of electrical terminals 109. Processor 100 may be connected to voltage sensors 61, 62, 63 and may periodically receive or sample voltage measurements. With reference to FIG. 10, processor 100 may periodically receive or sample current measurements from a current sensor 64 for sensing electrical current flowing to one of the additional electrical terminals 109. Additional current sensors may also be used. With reference to FIG. 11, four current sensors 57, 60, 64, 65 may be connected to processor 100. Two current sensors 57, 60 may be associated with electrical terminals 108 and two current sensors 64, 65 may be associated with electrical terminals 109. With reference to FIG. 12, six current sensors 55, 57, 60, 64, 65, 66 may be connected to processor 100. Three current sensors 55, 57, 60 may be associated with electrical terminals 108 and three current sensors 64, 65, 66 may be associated with electrical terminals 109. With six current sensors 55, 57, 60, 64, 65, 66, processor 100 may receive current measurements for each winding of a dual winding three phase electric motor associated with compressor 12.

Processor 100 may sample current and voltage measurements from the various sensors periodically over each cycle of AC power to determine multiple instantaneous current and voltage measurements. For example, processor 100 may sample current and voltage measurements twenty times per cycle or approximately once every millisecond in the case of alternating current with a frequency of sixty mega-hertz. From these actual current and voltage measurements, processor 100 may calculate additional power related data such as true and apparent power, power consumption over time, and power factor.

Based on actual current and voltage measurements, processor 100 may determine a root mean square (RMS) value for voltage and current for each phase of electric power 50. Processor 100 may calculate an RMS voltage value by squaring each of the sampled voltage measurements, averaging the squared measurements, and calculating the square root of the average. Likewise, processor 100 may calculate an RMS current value by squaring each of the sampled current measurements, averaging the squared measurements, and calculating the square root of the average.

From RMS voltage and RMS current calculations, processor 100 may calculate apparent power (S) according to the following equation:

$$S = V_{RMS} \times I_{RMS} \quad (1),$$

where $V_{RMS}$ is the calculated RMS of voltage over at least one cycle of AC and where $I_{RMS}$ is the calculated RMS of current over at least one cycle of AC. Apparent power may be calculated in units of Volt-Amps (VA) or kilo-Volt-Amps (kVA)

Processor 100 may calculate apparent power for each phase of electric power 50. When current sensors 55, 57, 60, 64, 65, 66 are available for all three phases of electric power 50, actual current measurements may be used to calculate apparent power. When current sensors are not available for all three phases, current for a missing phase may be estimated by interpolation from known current and voltage measurements.

Processor 100 may calculate total apparent power ($S_{Total}$) for an electric motor of compressor 12 based on apparent power calculations for each of the phases, according to the following equation:

$$S_{Total} = V_{RMS(1)} \times I_{RMS(1)} + V_{RMS(2)} \times I_{RMS(2)} + V_{RMS(3)} \times I_{RMS(3)} \quad (2),$$

where $V_{RMS(1)}$, $V_{RMS(2)}$, and $V_{RMS(3)}$ are the calculated RMS voltage over a cycle of AC for the first, second, and third phase of AC, respectively, and where $I_{RMS(1)}$, $I_{RMS(2)}$, and $I_{RMS(3)}$ are the calculated RMS current a cycle of AC for the first, second, and third phase of AC, respectively. Apparent power is calculated in units of Volt-Amps (VA) or kilo-Volt-Amps (kVA)

Active power (P), in units of watts (W) or kilo-watts (kW) may be calculated as an integral of the product of instantaneous currents and voltages over a cycle of AC, according to the following equation:

$$P = \frac{1}{T} \int_0^T (v(t)i(t))\,dt, \quad (3)$$

where v(t) is instantaneous voltage at time t, in units of volts; where i(t) is instantaneous current at time t, in units of amps; and where T is the period.

Based on the actual instantaneous electrical current and voltage measurements sampled over a cycle of the AC power, processor 100 may calculate (P) as the sum of the products of instantaneous voltage and current samples for each sample interval (e.g., one millisecond), over one cycle of AC. Thus, P may be calculated by processor 100 according to the following equation:

$$P \cong \frac{1}{T} \sum_{k=1}^{k=\frac{T}{\Delta t}} v(k)i(k)\Delta t, \quad (4)$$

where v(k) is the instantaneous voltage measurement for the kth sample; i(k) is the instantaneous current measurement for the kth sample; T is the period; and $\Delta t$ is the sampling interval (e.g., 1 millisecond).

P may be calculated for each phase of electric power. Processor 100 may calculate a total active power ($P_{Total}$) by adding the active power for each phase, according to the following equation:

$$P_{Total} = P_{(1)} + P_{(2)} + P_{(3)} \quad (5),$$

Where $P_{(1)}$, $P_{(2)}$, and $P_{(3)}$ are the active power for the first, second, and third phase of AC, respectively.

Based on the active power calculations, processor 100 may calculate energy consumption by calculating an average of active power over time. Energy consumption may be calculated by processor 100 in units of watt-hours (WH) or kilo-watt-hours (kWH).

Further, based on the active power calculation and the apparent power calculation, processor 100 may calculate the power factor (PF) according to the following equation:

$$PF = \frac{P}{S}, \tag{6}$$

where P is active power in units of watts (W) or kilo-watts (kW); and where S is apparent power in units of volt-amps (VA) or kilo-volt-amps (kVA). Generally, PF is the ratio of the power consumed to the power drawn. Processor 100 may calculate PF for each phase of electric power. Processor 100 may also calculate a total PF as a ratio of total actual power to total apparent power, according to the following equation:

$$PF_{Total} = \frac{P_{Total}}{S_{Total}}, \tag{7}$$

where $P_{total}$ and $S_{Total}$ are calculated according to formulas 2 and 5 above.

Alternatively, processor 100 may calculate power factor by comparing the zero crossings of the voltage and current waveforms. The processor may use the angular difference between the zero crossings as an estimate of PF. Processor 100 may monitor voltage and current measurements to determine voltage and current waveforms for electric power 50. Based on the measurements, processor may determine where each waveform crosses the zero axis. By comparing the two zero crossings, processor 100 may determine an angular difference between the voltage waveform and the current waveform. The current waveform may lag the voltage waveform, and the angular difference may be used by processor 100 as an estimate of PF.

PF may be used as an indication of the efficiency of the electric motor or the compressor. Increased lag between the current waveform and the voltage waveform results in a lower power factor. A power factor near one, i.e., a unity power factor, is more desirable than a lower power factor. An electric motor with a lower power factor may require more energy to operate, thereby resulting in increased power consumption.

SM 32 may provide continually updated power factor calculations, as well as RMS voltage, RMS current, active power, apparent power, and energy consumption calculations, based on continually sampled instantaneous electrical current and voltage measurements, to CM 30 and/or system controller 34. CM 30 and system controller 34 may utilize the electrical electric power measurements and calculations communicated from SM 32 to control and evaluate efficiency of compressor 12 or refrigeration system 10.

Further, electrical measurements and calculations, including PF, may be accessed by a user through system controller 34 or CM 30. Additionally, electrical measurements and calculations may be accessed through direct communication with SM 32 via communication port 120. Electrical measurements and calculations may be stored and periodically updated in embedded ROM 124.

In this way, electrical calculations and measurements, such as RMS voltage, RMS current, active power, apparent power, power factor, and energy calculations may be accurately and efficiently made at the compressor 12 and communicated to other modules or controllers or to a user of the compressor 12 or refrigeration system 10 for purposes of evaluating electrical power usage.

In addition to communicating electrical calculations and measurements to other modules, controllers, or users, SM 32 may use the electrical calculations and measurements diagnostically to detect certain variations in operating conditions. SM 32 may alert CM 30 to certain operating conditions based on the electrical calculations and measurements.

Figure 13:
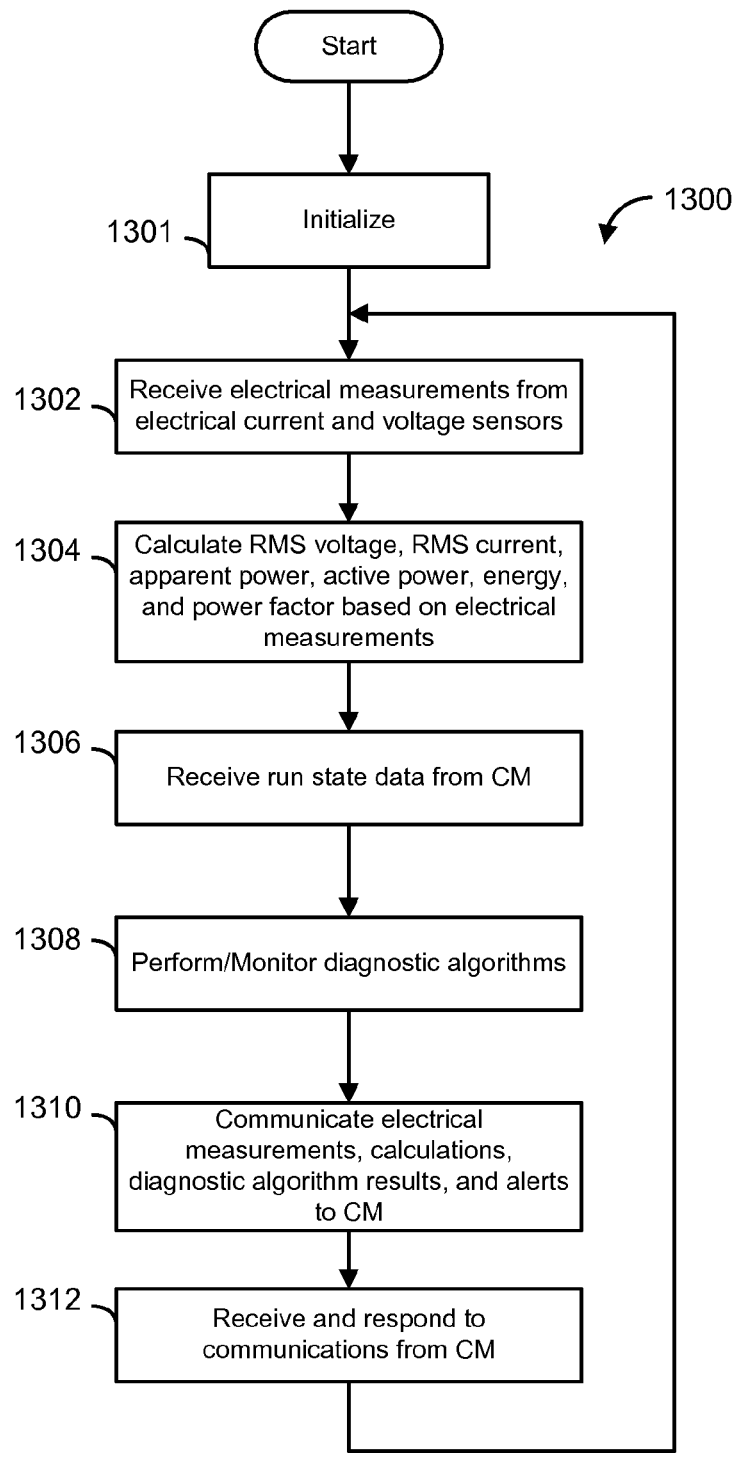
FIG. 13 is a flow chart illustrating an operating algorithm of a sensor module in accordance with the present teachings.

Referring now to FIG. 13, a flow chart illustrating an operating algorithm 1300 for SM 32 is shown. In step 1301, SM 32 may initialize. Initialization may include resetting counters, timers, or flags, checking and initializing RAM 102, initializing ports, including communication ports 118, 120, enabling communication with other devices, including CM 30, checking ROM 104, checking embedded ROM 124, and any other necessary initialization functions. SM 32 may load operating instructions from ROM 104 for execution by processor 100.

In step 1302, SM 32 may receive actual electrical measurements from connected voltage and current sensors. SM 32 may receive a plurality of instantaneous voltage and current measurements over the course of a cycle of the AC electrical power. SM 32 may buffer the voltage and current measurements in RAM 102 for a predetermined time period.

In step 1304, SM 32 may calculate RMS voltage and RMS current based on the instantaneous voltage and current measurements. Based on the RMS voltage and RMS current calculations, SM 32 may calculate apparent power in step 1304. Based on the instantaneous voltage and current measurements, SM 32 may also calculate active power. Based on the apparent power calculation and the active power calculation, SM 32 may calculate the power factor. SM 32 may also calculate the power factor from the instantaneous voltage and current measurements by examining an angular difference between the zero crossings of the electrical current waveform and the voltage waveform.

In step 1306, SM 32 may receive run state data from CM 30. The run state data may include data indicating whether an electric motor of compressor 12 is currently in an activated or deactivated state. The run state data may also include timing data indicating a period of time that the electric motor has been in the current state. If the electric motor is a dual winding three phase electric motor, the run state data may also including data indicating whether one or both of the windings are activated.

In step 1308, based on the electrical measurements and calculations, and based on the data received from CM 30, SM 32 may perform and/or monitor diagnostic algorithms as described in more detail below. Some diagnostic algorithms may be executed once per each iteration of operating algorithm 1300. Some diagnostic algorithms may be executed concurrently with, and monitored by, operating algorithm 1300.

In step 1310, SM 32 may communicate the results of the electrical measurements and calculations to CM 30. SM 32 may also communicate the results of any diagnostic algorithms to CM 30. As described below, SM 32 may set operating flags corresponding to operating conditions according to diagnostic algorithms. SM 32 may communicate any operating flags to CM 30 in step 1310.

In step 1312, SM 32 may receive and respond to communications from CM 30. For example, CM 30 may request particular data from SM 32. CM 30 may also request certain data from embedded ROM 124. CM 30 may update SM 32 with operating parameters or thresholds for use in diagnostic algorithms. CM 30 may direct SM 32 to activate or deactivate any compressor related devices, such as a crank case heater, controlled by SM 32 via relay 127.

After responding to communications from CM 30 in step 1312, SM 32 may loop back to step 1302 and continue operation.

Figure 14:
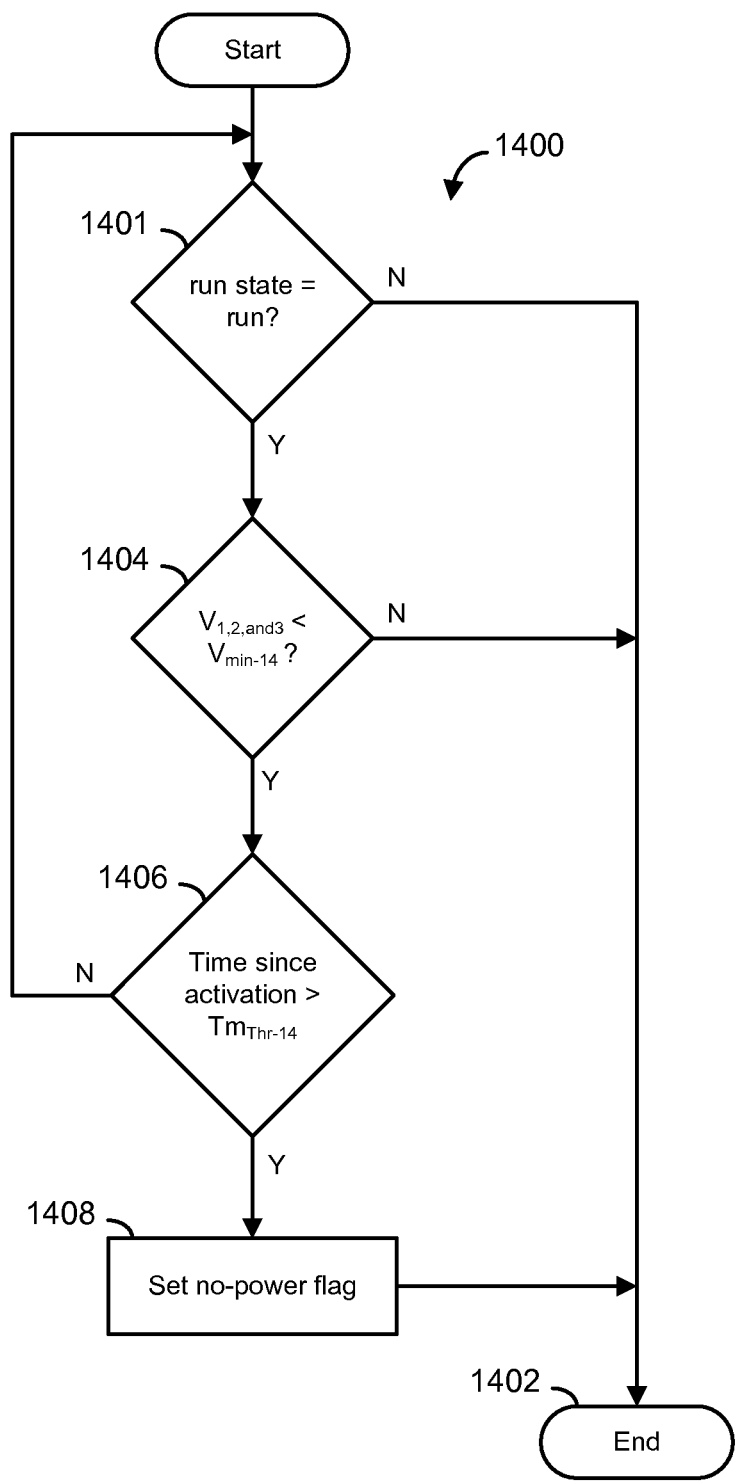
FIG. 14 is a flow chart illustrating a diagnostic algorithm of a sensor module in accordance with the present teachings.

Referring now to FIG. 14, a flow chart illustrating an algorithm 1400 for SM 32 to detect a no-power condition is shown. The algorithm 1400 may be one of the diagnostic algorithms performed/monitored by SM 32, as described with reference to step 1308 of FIG. 13 above. Prior to execution of the algorithm 1400, a no-power flag may have been reset by SM 32.

In step 1401, SM 32 may determine whether the current run state is set to run, based on run state data received from CM 30, as described with reference to step 1306 of FIG. 13 above. When the run state is not set to run, compressor 12 is not activated, and SM 32 may end execution of the algorithm in step 1402.

When the run state is set to run, SM 32 may proceed to step 1404 and check voltage measurements. When three phase power is used, SM 32 may check each of three voltage measurements, $V_1$, $V_2$, and $V_3$. SM 32 may determine whether $V_1$, $V_2$, and $V_3$ are less than a minimum voltage threshold, $V_{min-14}$. In step 1404, when $V_1$, $V_2$, and $V_3$ are greater than or equal to $V_{min-14}$, SM 32 may determine that compressor 12 has sufficient power, and end execution of algorithm 1400 in step 1402.

In step 1404, when SM 32 determines that $V_1$, $V_2$, and $V_3$ are less than $V_{min-14}$, SM 32 may proceed to step 1406. In step 1406, SM 32 may determine whether the time since the compressor 12 was activated is greater than a time threshold, $Tm_{Thr-14}$. For example, $Tm_{Thr-14}$ may be set to two seconds. In this way, SM 32 may allow for any bounce of any contactor coil relays. In step 1406, when the time since compressor activation is not greater than $Tm_{Thr-14}$, SM 32 may return to step 1401.

In step 1406, when the time since compressor activation is greater than $TM_{Thr-14}$, SM 32 may proceed to step 1408. In step 1408, SM 32 may set a no-power flag. By setting the no-power flag, SM 32 may indicate that compressor 12 does not have sufficient electrical power to operate. The no-power flag may be communicated to, or detected by, CM 30 and/or system controller 34. CM 30 and/or system controller 34 may adjust compressor and refrigeration system operation accordingly.

Figure 15:
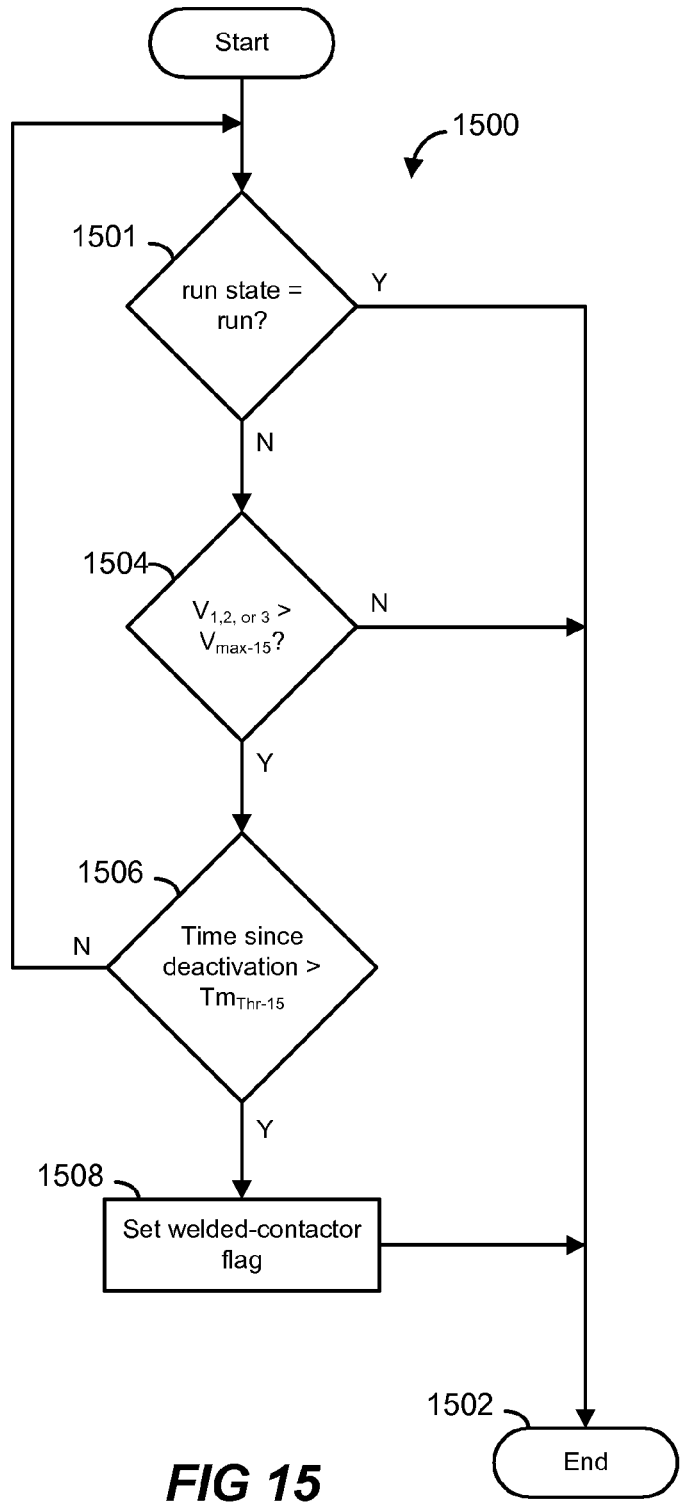
FIG. 15 is a flow chart illustrating a diagnostic algorithm of a sensor module in accordance with the present teachings.

Referring now to FIG. 15, a flow chart illustrating an algorithm 1500 for SM 32 to detect a welded contactor condition is shown. The algorithm 1500 may be one of the diagnostic algorithms performed/monitored by SM 32, as described with reference to step 1308 of FIG. 13 above. Prior to execution of the algorithm 1500, a welded-contactor flag may have been reset by SM 32. A welded contactor may cause compressor 12 to continue to operate, even though SM 32 or CM 30 may have attempted to open a contactor to deactivate the compressor.

In step 1501, SM 32 may determine whether the current run state is set to run, based on run state data previously received from CM 30, as described with reference to step 1306 of FIG. 13 above. When the run state is set to run, the compressor 12 is activated, and SM 32 may end execution of the algorithm in step 1502.

When the run state is not set to run, SM 32 may proceed to step 1504 and check voltage measurements. When three phase power is used, SM 32 may check each of three voltage measurements, $V_1$, $V_2$, and $V_3$. SM 32 may determine whether voltages $V_1$, $V_2$, or $V_3$ are greater than a maximum voltage threshold, $V_{max-15}$. In step 1504, when $V_1$, $V_2$, or $V_3$ are not greater than or equal to $V_{max-15}$, SM 32 may determine that a welded contactor condition does not exist, and end execution of the algorithm in step 1502.

When $V_1$, $V_2$, or $V_3$ are greater than $V_{max-15}$, SM 32 may proceed to step 1506. In step 1506, SM 32 may determine whether the time since compressor 12 was deactivated is greater than a time threshold, $Tm_{Thr-15}$. For example, $Tm_{Thr-15}$ may be set to two seconds. By waiting for the $Tm_{Thr-15}$, SM 32 may allow for any bounce of any contactor coil relays. In step 1506, when the time since compressor deactivation is not greater than $Tm_{Thr-15}$, SM 32 may return to step 1501.

In step 1506, when the time since compressor deactivation is greater than $TM_{Thr-15}$, SM 32 may proceed to step 1508. In step 1508, SM 32 may set a welded-contactor flag. By setting the welded-contactor flag, SM 32 may indicate that compressor 12 may have at least one welded contactor. In such case, power may be delivered to compressor 12, due to the welded contactor, despite the attempt of CM 30 or SM 32 to deactivate compressor 12. The welded-contactor flag may be communicated to, or detected by, CM 30 and/or system controller 34. CM 30 and/or system controller 34 may adjust compressor and refrigeration system operation accordingly. Specifically, CM 30 may activate compressor 12 while it is in the welded-contactor state to avoid a voltage imbalance condition and prevent damage or overheating of compressor 12. Further, CM 30 or system controller 34 may notify a user that compressor 12 is being operated in a welded-contactor state.

Figure 16:
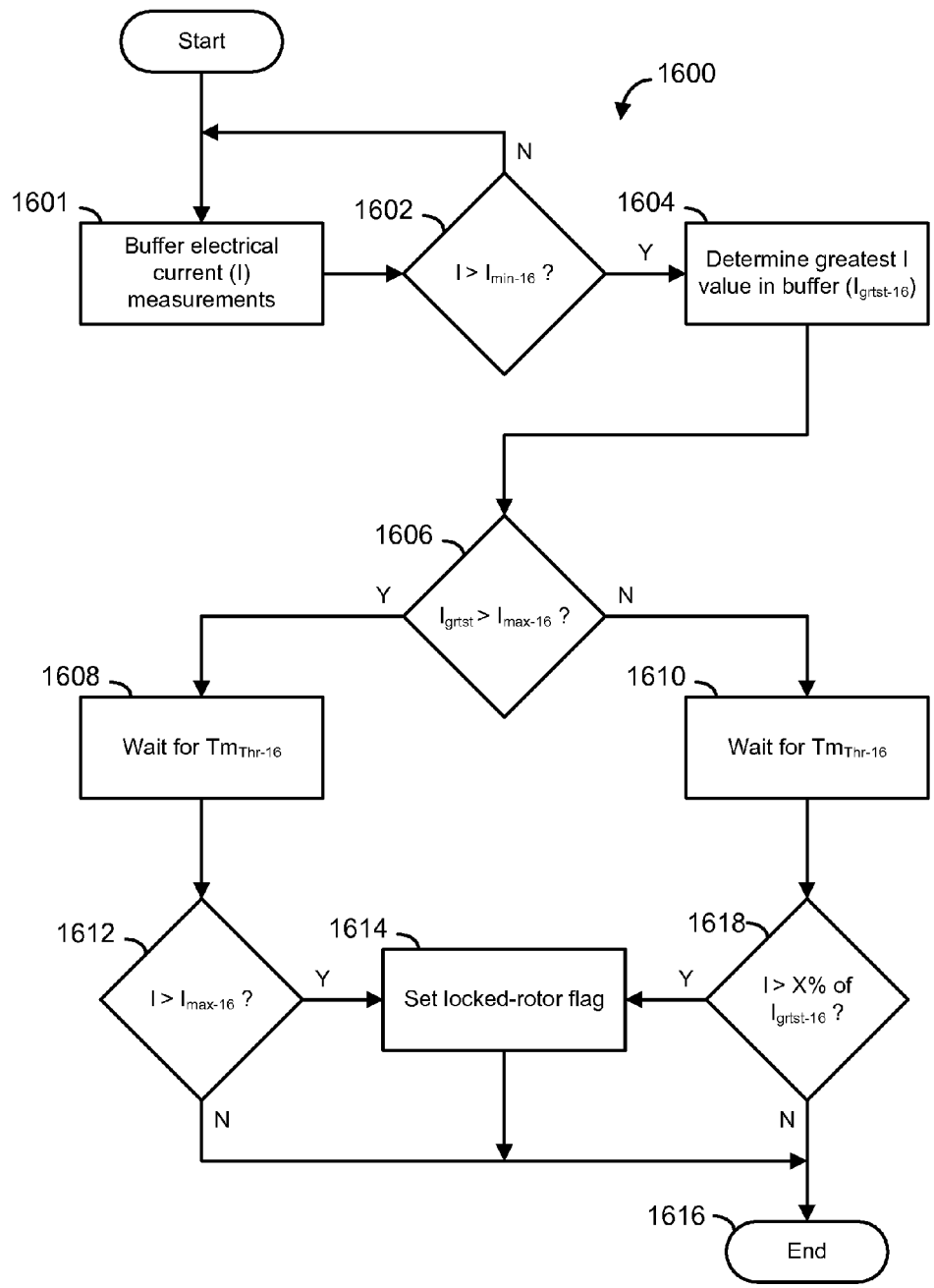
FIG. 16 is a flow chart illustrating a diagnostic algorithm of a sensor module in accordance with the present teachings.

Referring now to FIG. 16, a flow chart illustrating an algorithm 1600 for SM 32 to detect a locked rotor condition is shown. Algorithm 1600 may be one of the diagnostic algorithms performed/monitored by SM 32, as described with reference to step 1308 of FIG. 13 above. In a locked rotor condition, a rotor of the electric motor may be seized. Normally, when an electric motor is activated, electric current of the motor (I) increases for an initial period during startup, and then decreases as the motor reaches operating speed. If, however, the rotor is seized, I will not decrease after the initial period. Prior to execution of the algorithm 1600, a locked-rotor flag may have been reset by SM 32.

In step 1601, SM 32 may buffer electrical current measurements for a predetermined buffer period. For example, SM 32 may buffer electrical current measurements for 200 ms.

In step 1602, SM 32 may determine whether I is greater than a minimum electric current threshold ($I_{min-16}$). When I is not greater than $I_{min-16}$, SM 32 may loop back to step 1601 and continue to buffer I. In step 1602, when SM 32 determines that I is greater than $I_{min-16}$, SM 32 may proceed to step 1604.

In step 1604, SM 32 may determine the greatest I value currently in the buffer ($I_{grtst-16}$). In step 1606, SM 32 may determine whether $I_{grtst}$ is greater than an electric current threshold ($I_{max-16}$). SM 32 may then wait in steps 1608 and 1610 for a time threshold ($TM_{Thr-16}$) to expire. For example, $Tm_{Thr-16}$ may be set to two seconds. In this way, SM 32 allows I to settle to a normal operating current if the electric motor does not have a locked rotor.

When $I_{grtst-16}$ is greater than $I_{max-16}$ in step 1606, then in step 1612, SM 32 may use $I_{max-16}$ as the current threshold. In step 1612, when I is greater than $I_{max-16}$, SM 32 may determine that a locked rotor condition exists and may proceed to step 1614 to set the locked-rotor flag. In step 1612, when I is not greater than $I_{max-16}$, SM 32 may end execution of the algorithm in step 1616.

In step 1606, when $I_{grtst-16}$ is not greater than $I_{max-16}$, SM 32 may use a predetermined percentage (X %) of $I_{grtst-16}$ as the current threshold in step 1618. In step 1618, when $I_{mtr-16}$ is greater than X % of $I_{grtst-16}$, SM 32 may determine that a locked rotor condition exists and may set the locked-rotor flag in step 1614. SM 32 may end execution of the algorithm in step 1616. The locked-rotor flag may be communicated to, or detected by, CM 30 and/or system controller 34. CM 30 and/or system controller 34 may adjust compressor and refrigeration system operation accordingly.

If a locked-rotor condition is detected a predetermined number of consecutive times, SM 32 may set a locked rotor lockout flag. SM 32 may cease operation of the compressor until the lockout flag is cleared by a user. For example, SM 32 may set the locked rotor lockout flag when it detects ten consecutive locked rotor conditions.

Figure 17:
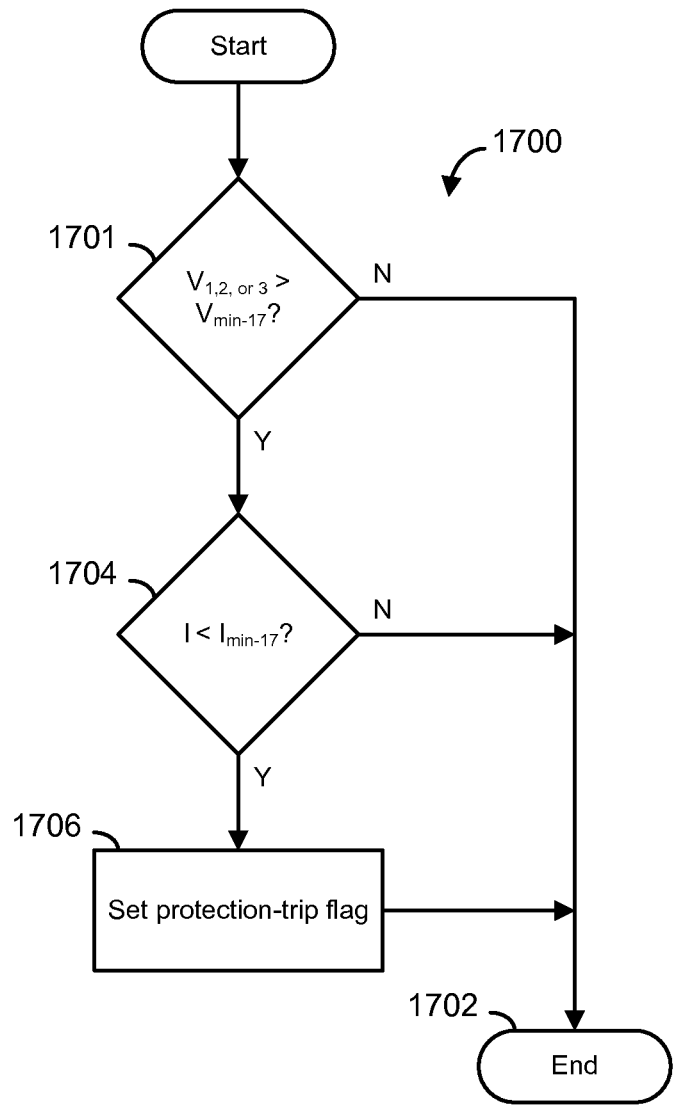
FIG. 17 is a flow chart illustrating a diagnostic algorithm of a sensor module in accordance with the present teachings.

Referring now to FIG. 17, a flow chart illustrating an algorithm 1700 for SM 32 to detect a motor protection trip is shown. Algorithm 1700 may be one of the diagnostic algorithms performed/monitored by SM 32, as described with reference to step 1308 of FIG. 13 above. Compressor 12 may be configured with internal line breaks. The internal line breaks may trip, or deactivate, compressor 12 when electric current is excessive or when compressor 12 is overheating. In such case, SM 32 may detect that an internal line break has occurred and notify CM 30. Prior to execution of the algorithm 1700, a protection-trip flag may have been reset by SM 32.

In step 1701, SM 32 determines whether any voltage, $V_1$, $V_2$, or $V_3$ is greater than a voltage minimum threshold ($V_{min-17}$). When $V_1$, $V_2$, or $V_3$ is not greater than $V_{min-17}$, SM 32 may end execution of algorithm 1700 in step 1702. When $V_1$, $V_2$, or $V_3$ is greater than $V_{min-17}$, SM 32 may proceed to step 1704. In step 1704, SM 32 may determine whether I is less than a current minimum $I_{min-17}$. When I is not less than $I_{min-17}$, SM 32 may end execution of algorithm 1700 in step 1702. When I is less than $I_{min-17}$, SM 32 may proceed to step 1706 and set a protection-trip flag. In this way, when voltage is present, but electric current is not present, SM 32 may determine that an internal line break condition has occurred. The protection-trip flag may be communicated to, or detected by, CM 30 and/or system controller 34. CM 30 and/or system controller 34 may adjust compressor 12 and refrigeration system 10 operation accordingly.

Figure 18:
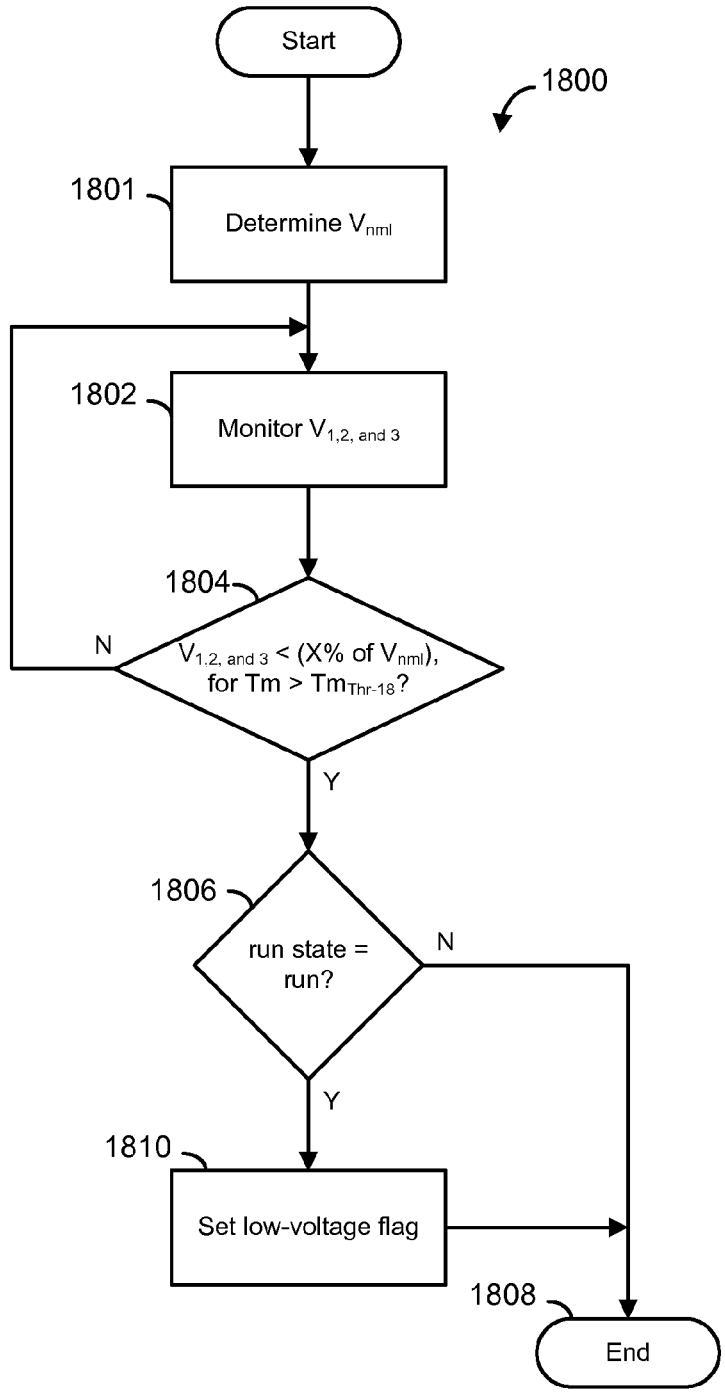
FIG. 18 is a flow chart illustrating a diagnostic algorithm of a sensor module in accordance with the present teachings.

Referring now to FIG. 18, a flow chart illustrating an algorithm 1800 for SM 32 to detect a low voltage condition is shown. Algorithm 1800 may be one of the diagnostic algorithms performed/monitored by SM 32, as described with reference to step 1308 of FIG. 13 above. Prior to execution of the algorithm 1800, a low-voltage flag may have been reset by SM 32.

In step 1801, SM 32 may determine the normal operating voltage of compressor ($V_{nml}$). SM 32 may determine $V_{nml}$ based on historical data of previous compressor operating voltages. For example, $V_{nml}$ may be calculated by averaging the voltage over the first five electrical cycles of power during the first normal run. $V_{nml}$ may alternatively be predetermined and stored in ROM 104, 124, or calculated based on an average voltage over the operating life of the compressor.

In step 1802, SM 32 may monitor $V_{1, 2, and 3}$ for a predetermined time period $TM_{thr-18}$. For example, $Tm_{Thr-18}$ may be set to two seconds. The time threshold may or may not be the same as the time threshold used in other diagnostic algorithms. In step 1804, SM 32 may determine whether $V_{1, 2, and 3}$ are less than a predetermined percentage (X %) of $V_{nml}$ for more than $TM_{thr-18}$. For example, the predetermined percentage may be 75 percent. In step 1804, when $V_{1, 2, and 3}$ are not less than X % of $V_{nml}$ for more than $TM_{thr-18}$, SM 32 loops back to step 1802. In step 1804, when $V_{1, 2, and 3}$ are less than X % of $V_{nml}$ for more than $TM_{thr-18}$, SM 32 may proceed to step 1806.

In step 1806, SM 32 may determine whether the run state is set to run. When the run state is not set to run in step 1806, SM 32 ends execution of algorithm 1800 in step 1808. When the run state is set to run, SM 32 may determine that a low-voltage condition exists and may set a low-voltage flag in step 1810. The low-voltage flag may be communicated to, or detected by, CM 30 and/or system controller 34. CM 30 and/or system controller 34 may adjust compressor 12 and refrigeration system 10 operation accordingly.

Figure 19:
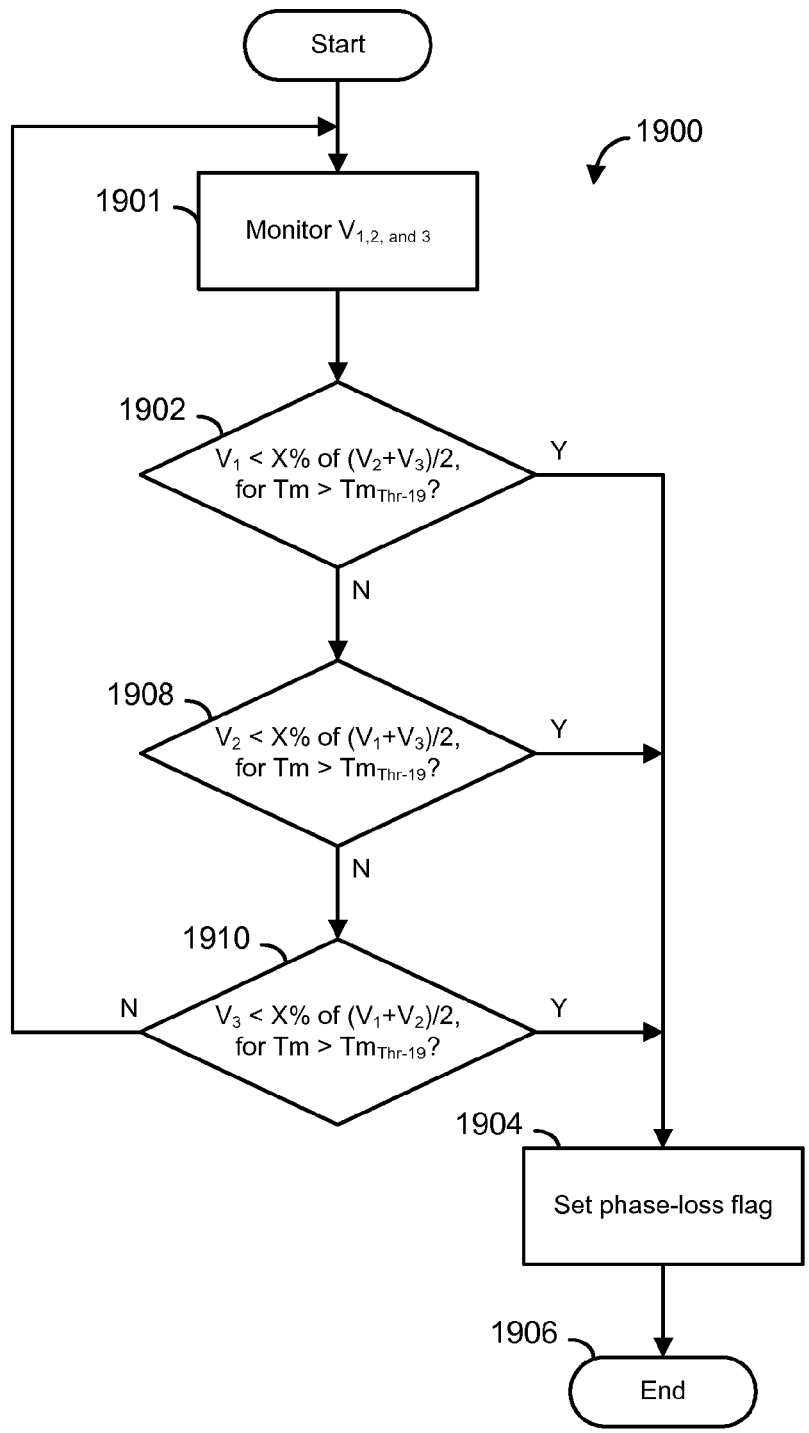
FIG. 19 is a flow chart illustrating a diagnostic algorithm of a sensor module in accordance with the present teachings.

Referring now to FIG. 19, a flow chart illustrating an algorithm 1900 for SM 32 to detect a phase loss condition for compressor 12, when three phase electric power 50 is used. Algorithm 1900 may be one of the diagnostic algorithms performed/monitored by SM 32, as described with reference to step 1308 of FIG. 13 above. SM 32 may compare each voltage, $V_1$, $V_2$, and $V_3$, to determine whether any particular voltage is lower than a predetermined percentage of the average of the other two voltages. Prior to execution of the algorithm 1900, a phase-loss flag may have been reset by SM 32

In step 1901, SM 32 may monitor $V_1$, $V_2$, and $V_3$. In step 1902, SM 32 may determine whether $V_1$ is less than a predetermined percentage, X %, of the average of $V_2$ and $V_3$, for a time (Tm) greater than a time threshold, $Tm_{Thr-19}$. When $V_1$ is less than X % of the average of $V_2$ and $V_3$, SM 32 may set the phase-loss flag in step 1904 and end execution of algorithm 1900 in step 1906. When $V_1$ is not less than X % of the average of $V_2$ and $V_3$, SM 32 may proceed to step 1908.

In step 1908, SM 32 may determine whether $V_2$ is less than X % of the average of $V_1$ and $V_3$, for Tm greater than $Tm_{Thr-19}$. When $V_2$ is less than X %, of the average of $V_1$ and $V_3$, SM 32 may set the phase-loss flag in step 1904 and end execution of algorithm 1900 in step 1906. When $V_2$ is not less than X % of the average of $V_1$ and $V_3$, SM may proceed to step 1910.

In step 1910, SM 32 may determine whether $V_3$ is less than X % of the average of $V_1$ and $V_2$, for Tm greater than $Tm_{Thr-19}$. When $V_3$ is less than X %, of the average of $V_1$ and $V_2$, SM 32 may set the phase-loss flag in step 1904 and end execution of algorithm 1900 in step 1906. When $V_3$ is not less than X % of the average of $V_1$ and $V_2$, SM 32 may loop back to step 1901. In this way, algorithm 1900 may operate concurrently with algorithm 1300. The phase-loss flag may be communicated to, or detected by, CM 30 and/or system controller 34. CM 30 and/or system controller 34 may adjust compressor 12 and refrigeration system 10 operation accordingly.

If a phase-loss condition is detected a predetermined number of consecutive times, SM 32 may set a phase-loss lockout flag. SM 32 may cease operation of the compressor until the lockout flag is cleared by a user. For example, SM 32 may set the phase-loss lockout flag when it detects ten consecutive phase-loss conditions.

Figure 20:
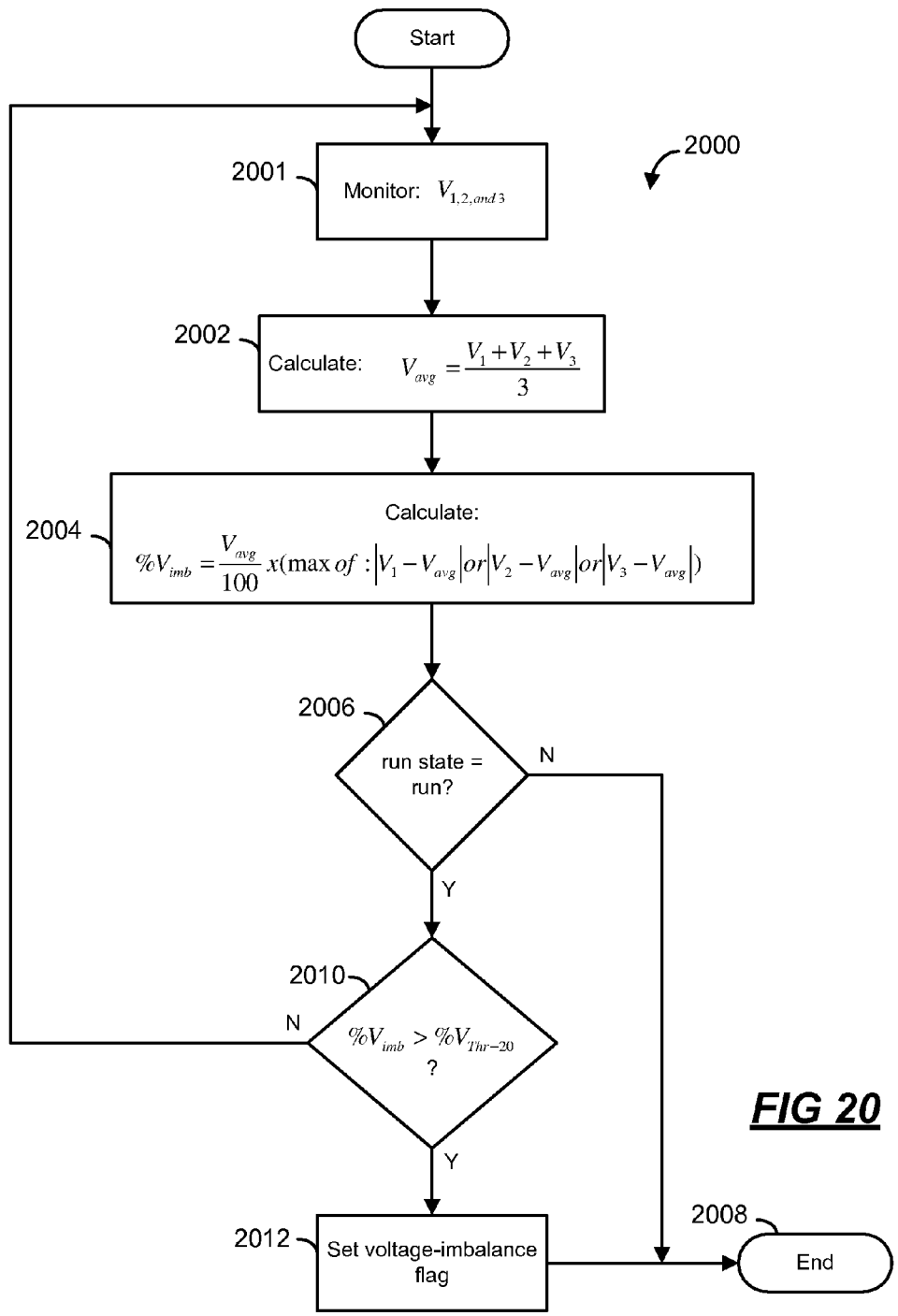
FIG. 20 is a flow chart illustrating a diagnostic algorithm of a sensor module in accordance with the present teachings.

Referring now to FIG. 20, a flow chart illustrating an algorithm 2000 for SM 32 to detect a voltage imbalance condition for compressor 12, when three phase electric power 50 is used. Algorithm 2000 may be one of the diagnostic algorithms performed/monitored by SM 32, as described with reference to step 1308 of FIG. 13 above. SM 32 may determine whether the difference between any of voltages $V_1$, $V_2$, or $V_3$ is greater than a predetermined percentage of the average of $V_1$, $V_2$, and $V_3$. When the difference between any of voltages $V_1$, $V_2$, or $V_3$ is greater than a predetermined percentage of the average of $V_1$, $V_2$, and $V_3$, SM 32 may determine that a voltage imbalance condition exists. Prior to execution of the algorithm 2000, a voltage-imbalance flag may have been reset by SM 32

In step 2001, SM 32 may monitor $V_1$, $V_2$, and $V_3$. In step 2002, SM 32 may calculate the average ($V_{avg}$) of $V_1$, $V_2$, and $V_3$. In step 2004, SM 32 may calculate the percentage of voltage imbalance (%$V_{imb}$) by determining the maximum of the absolute value of the difference between each of $V_1$ and $V_{avg}$, $V_2$ and $V_{avg}$, and $V_3$ and $V_{avg}$. The maximum difference is then multiplied by $V_{avg}/100$.

In step 2006, SM 32 determines whether the run state is set to run. In step 2006, when the run state is not set to run, SM 32 may end execution of algorithm 2000 in step 2008. In step 2006, when the run state is set to run, SM 32 may proceed to step 2010.

In step 2010, SM 32 may determine whether %$V_{imb}$ is greater than a voltage imbalance threshold (%$V_{Thr-20}$). When %$V_{imb}$ is not greater than %$V_{Thr-20}$, SM 32 loops back to step 2001. In this way, algorithm 2000 may execute concurrently with operating algorithm 1300. When %$V_{imb}$ is greater than %$V_{Thr-20}$, a voltage imbalance condition exists, and SM 32 may set the voltage-imbalance flag in step 2012. SM 32 may end execution of algorithm 2000 in step 2008. The voltage-imbalance flag may be communicated to, or detected by, CM 30 and/or system controller 34. CM 30 and/or system controller 34 may adjust compressor 12 and refrigeration system 10 operation accordingly.

Figure 21:
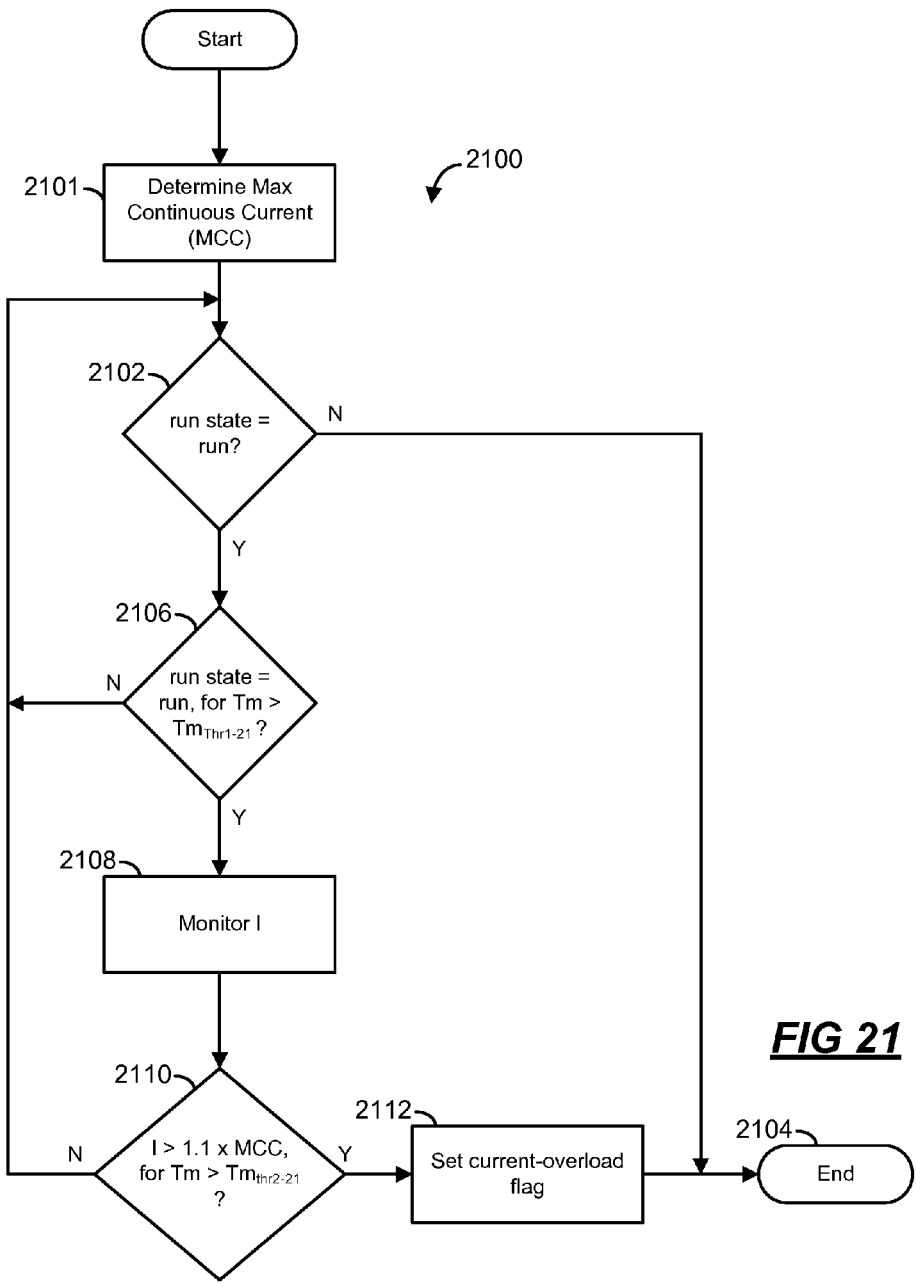
FIG. 21 is a flow chart illustrating a diagnostic algorithm of a sensor module in accordance with the present teachings.

Referring now to FIG. 21, a flow chart illustrating an algorithm 2100 for SM 32 to detect a current overload condition is shown. Algorithm 2100 may be one of the diagnostic algorithms performed/monitored by SM 32, as described with reference to step 1308 of FIG. 13 above. Prior to execution of the algorithm 2100, a current-overload flag may have been reset by SM 32

In step 2101, SM 32 may determine the maximum continuous current (MCC) for the electric motor of compressor 12. MCC may be predetermined and set during the manufacture of compressor 12. MCC may be stored in ROM 104 and/or embedded ROM 124. In addition, MCC may be user configurable. MCC may vary based on the type of refrigerant used. Thus, a user of compressor 12 may modify the default MCC value to conform to actual refrigeration system conditions.

In step 2102, SM 32 may determine whether the run state is set to run. When the run state is not set to run, SM 32 ends execution of algorithm 2100 in step 2104. In step 2102, when the run state is set to run, SM 32 may proceed to step 2106. In step 2106, when run state has not been set to run for a time period greater than a first time threshold ($TM_{Thr1-21}$), SM 32 loops back to step 2102. In step 2106, when run state has been set to run for a time period greater than $TM_{Thr1-21}$, SM 32 may proceed to step 2108.

In step 2108, SM 32 monitors I. In step 2110, SM 32 may determine whether I is greater than MCC multiplied by 1.1. In other words, SM 32 may determine whether I is greater than 110% of MCC for a time greater than a second time threshold ($TM_{Thr2-21}$). When SM 32 determines that I is not greater than 110% of MCC for a time greater than $TM_{Thr2-21}$, SM 32 may loop back to step 2102. In this way, algorithm 2100 may execute concurrently with operating algorithm 1300. When SM 32 determines that I is greater than 110% of MCC for a time greater than $TM_{Thr2-21}$, SM 32 may determine that a current-overload condition exists and may set the current-overload flag in step 2112. SM 32 may end execution of the algorithm 2100 in step 2104. The current-overload flag may be communicated to, or detected by, CM 30 and/or system controller 34. CM 30 and/or system controller 34 may adjust compressor and refrigeration system operation accordingly.

Figure 22:
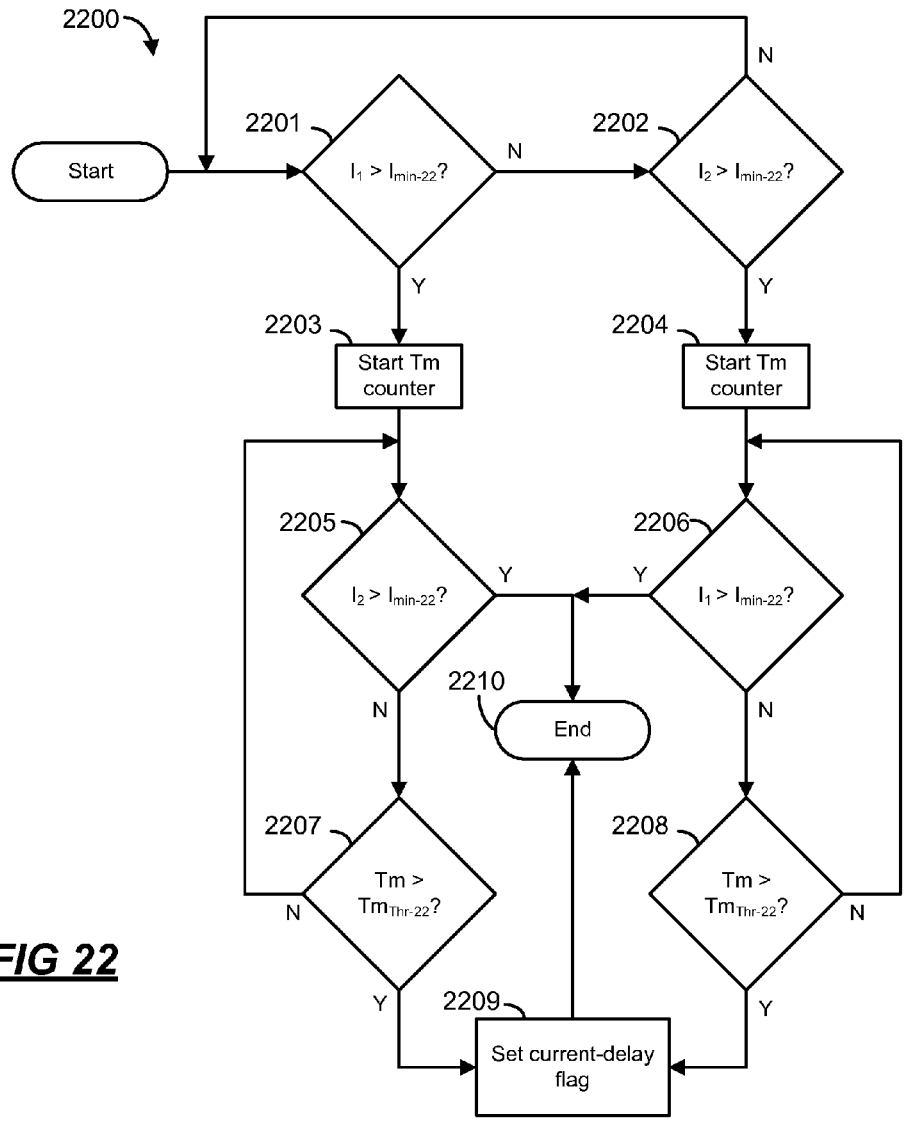
FIG. 22 is a flow chart illustrating a diagnostic algorithm of a sensor module in accordance with the present teachings.

Referring now to FIG. 22, a flow chart illustrating an algorithm 2200 for SM 32 to detect a current delay condition, in a two current sensor system, to detect a lag between two electrical currents $I_1$ and $I_2$. Algorithm 2200 may be one of the diagnostic algorithms performed/monitored by SM 32, as described with reference to step 1308 of FIG. 13 above. Prior to execution of the algorithm, a current-delay flag may have been reset by SM 32.

When SM 32 detects current greater than a current threshold ($I_{min-22}$) from one of the two current sensors, SM 32 may determine whether current indicated by the other current sensor becomes greater than $I_{min-22}$ within a time period threshold ($Tm_{Thr-22}$). In step 2201, SM 32 may determine whether $I_1$ is greater than a current threshold $I_{min-22}$. When $I_1$ is greater than $I_{min-22}$, SM 32 may proceed to step 2203 and start a time counter (Tm). SM 32 may proceed to step 2205 to determine whether $I_2$ is greater than $I_{min-22}$. In step 2205, when $I_2$ is greater than $I_{min-22}$, SM 32 may determine that a current-delay condition does not exist, and end execution of the algorithm in step 2210. In step 2205, when $I_2$ is not greater than $I_{min-22}$, SM 32 may proceed to step 2207 and determine whether Tm is greater than $Tm_{Thr-22}$. In step 2207, when TM is not greater than $TM_{Thr-22}$, SM 32 may loop back to step 2205 to compare $I_2$ with $I_{min-22}$. In step 2207, when Tm is greater than $Tm_{Thr-22}$, the time period has expired and a current-delay condition exists. SM 32 may proceed to step 2209 to set a current-delay flag. SM 32 may end execution of the algorithm 2200 in step 2210. The current-delay flag may be communicated to, or detected by, CM 30 and/or system controller 34. CM 30 and/or system controller 34 may adjust compressor and refrigeration system operation accordingly.

When $I_1$ is not greater than $I_{min-22}$, SM 32 may proceed to step 2202 and determine whether $I_2$ is greater than $I_{min-22}$. When $I_2$ is not greater than $I_{min-22}$, SM 32 loops back to step 2201. When $I_2$ is greater than $I_{min-22}$, SM 32 may proceed to step 2204 to start time Tm counter. SM 32 may proceed to step 2206 to determine whether $I_1$ is greater than $I_{min-22}$. In step 2206, when $I_1$ is greater than $I_{min-22}$, SM 32 may determine that a current-delay condition does not exist, and end execution of the algorithm in step 2210. In step 2206, when $I_1$ is not greater than $I_{min-22}$, SM 32 may proceed to step 2208 and determine whether Tm is greater than $Tm_{Thr-22}$. In step 2208, when TM is not greater than $TM_{Thr-22}$, SM 32 may loop back to step 2206 to compare $I_1$ with $I_{min-22}$. In step 2208, when Tm is greater than $Tm_{Thr-22}$, the time period has expired and a current-delay condition exists. SM 32 may proceed to step 2209 to set the current-delay flag. SM 32 may end execution of the algorithm 2200 in step 2210. As noted above, the current-delay flag may be communicated to, or detected by, CM 30 and/or system controller 34, which may adjust compressor and refrigeration system operation accordingly.

Figure 23:
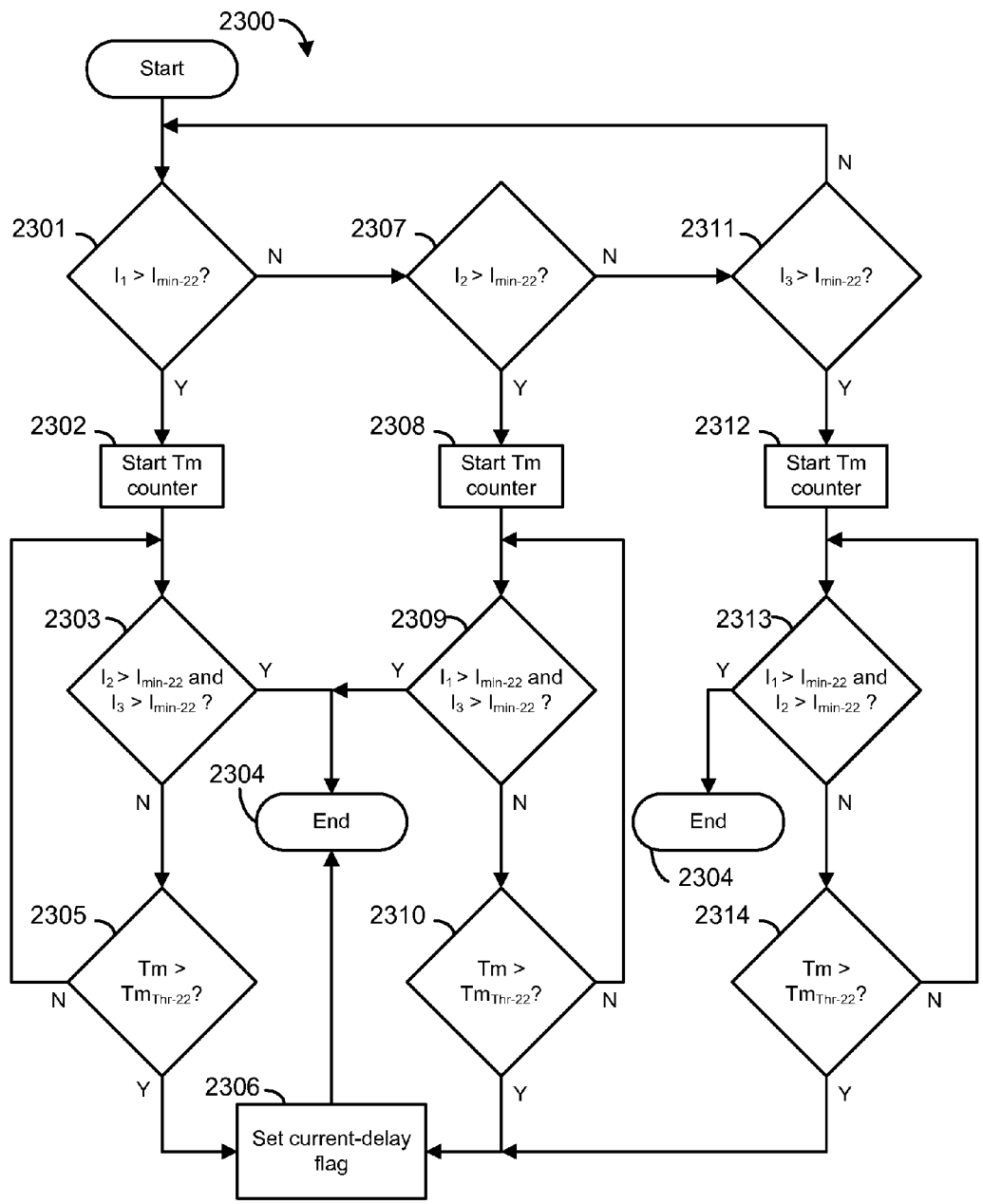
FIG. 23 is a flow chart illustrating a diagnostic algorithm of a sensor module in accordance with the present teachings.

Referring now to FIG. 23, a flow chart illustrating an algorithm 2300 for SM 32 to detect a current delay condition is shown, in a three current sensor system, to detect a lag between three electrical currents $I_1$, $I_2$, and $I_3$. Algorithm 2300 may be one of the diagnostic algorithms performed/monitored by SM 32, as described with reference to step 1308 of FIG. 13 above. Prior to execution of the algorithm, a current-delay flag may have been reset by SM 32.

When SM 32 detects current greater than a current threshold ($I_{min-22}$) from one of the three current sensors, SM 32 may determine whether current indicated by the other current sensors becomes greater than $I_{min-22}$ within a predetermined time period ($Tm_{Thr-22}$). In step 2301, SM 32 may determine whether $I_1$ is greater than a current threshold $I_{min-22}$. When $I_1$ is greater than $I_{min-22}$, SM 32 may proceed to step 2302 and start a time counter (Tm). SM 32 may proceed to step 2303 to determine whether $I_2$ and $I_3$ are greater than $I_{min-22}$. In step 2303, when $I_2$ and $I_3$ are greater than $I_{min-22}$, SM 32 may determine that a current-delay condition does not exist, and end execution of the algorithm in step 2304. In step 2303, when $I_2$ and $I_3$ are not greater than $I_{min-22}$, SM 32 may proceed to step 2305 and determine whether Tm is greater than Tm$_{Thr-22}$. In step 2305, when TM is not greater than TM$_{Thr-22}$, SM 32 may loop back to step 2303 to compare I$_2$ and I$_3$ with I$_{min-22}$. In step 2305, when Tm is greater than Tm$_{Thr-22}$, the time period has expired and a current-delay condition exists. SM 32 may proceed to step 2306 to set a current-delay flag. SM 32 may end execution of the algorithm 2300 in step 2304. The current-delay flag may be communicated to, or detected by, CM 30 and/or system controller 34. CM 30 and/or system controller 34 may adjust compressor and refrigeration system operation accordingly.

In step 2301, when I$_1$ is not greater than I$_{min-22}$, SM 32 may proceed to step 2307 and determine whether I$_2$ is greater than I$_{min-22}$. When I$_2$ is greater than I$_{min-22}$, SM 32 may proceed to step 2308 to start Tm counter. SM 32 may proceed to step 2309 to determine whether I$_1$ and I$_3$ are greater than I$_{min-22}$. In step 2309, when I$_1$ and I$_3$ are greater than I$_{min-22}$, SM 32 may determine that a current-delay condition does not exist, and end execution of the algorithm in step 2304. In step 2309, when I$_1$ and I$_3$ are not greater than I$_{min-22}$, SM 32 may proceed to step 2310 and determine whether Tm is greater than Tm$_{Thr-22}$. In step 2310, when TM is not greater than TM$_{Thr-22}$, SM 32 may loop back to step 2309 to compare I$_1$ and I$_3$ with I$_{min-22}$. In step 2310, when Tm is greater than Tm$_{Thr-22}$, the time period has expired and a current-delay condition exists. SM 32 may proceed to step 2306 to set the current-delay flag. SM 32 may end execution of the algorithm 2300 in step 2304. As noted above, the current-delay flag may be communicated to, or detected by, CM 30 and/or system controller 34, which may adjust compressor and refrigeration system operation accordingly.

In step 2307, when I$_2$ is not greater than I$_{min-22}$, SM 32 may proceed to step 2311 and determine whether I$_3$ is greater than I$_{min-22}$. When I$_3$ is not greater than I$_{min-22}$, SM 32 may loop back to step 2301. When I$_3$ is greater than I$_{min-22}$, SM 32 may proceed to step 2312 to start Tm counter. SM 32 may proceed to step 2313 to determine whether I$_1$ and I$_2$ are greater than I$_{min-22}$. In step 2313, when I$_1$ and I$_2$ are greater than I$_{min-22}$, SM 32 may determine that a current-delay condition does not exist, and end execution of the algorithm in step 2304. In step 2313, when I$_1$ and I$_2$ are not greater than I$_{min-22}$, SM 32 may proceed to step 2314 and determine whether Tm is greater than Tm$_{Thr-22}$. In step 2314, when TM is not greater than TM$_{Thr-22}$, SM 32 may loop back to step 2313 to compare I$_1$ and I$_2$ with I$_{min-22}$. In step 2314, when Tm is greater than Tm$_{Thr-22}$, the time period has expired and a current-delay condition exists. SM 32 may proceed to step 2306 to set the current-delay flag. SM 32 may end execution of the algorithm 2300 in step 2304. As noted above, the current-delay flag may be communicated to, or detected by, CM 30 and/or system controller 34, which may adjust compressor and refrigeration system operation accordingly.

With respect to each of the diagnostic algorithms described above with reference to FIGS. 14 to 23, SM 32 may selectively execute the diagnostic algorithms as needed and as data for the diagnostic algorithms is available. When a communication link is not available, or when data from a connected sensor is not available, due to malfunction or otherwise, SM 32 may disable those portions of the diagnostic algorithms that require the missing communication link or data. In this way, SM 32 may execute those portions of the diagnostic algorithms that are executable, based on the data and communication link(s) available to SM 32.

In this way, SM 32 may monitor electrical current and voltage measurements, make data calculations based on the electrical current and voltage measurements, and execute diagnostic algorithms based on the measurements and based on the calculations. SM 32 may communicate the measurements, the calculations, and the results of the diagnostic algorithms to CM 30 or system controller 34. SM 32 may thereby be able to provide efficient and accurate electrical power measurements and calculations to be utilized by other modules and by users to evaluate operating conditions, power consumption, and efficiency.

What is claimed is:

1. A sensor module for a compressor having an electric motor connected to a power supply that includes first, second, and third phases, the sensor module comprising:
   a first input connected to a first voltage sensor that generates a first voltage signal corresponding to a voltage of said first phase of said power supply;
   a second input connected to a second voltage sensor that generates a second voltage signal corresponding to a voltage of said second phase of said power supply;
   a third input connected to a third voltage sensor that generates a third voltage signal corresponding to a voltage of said third phase of said power supply;
   a fourth input connected to a current sensor that generates a current signal corresponding to a current of said first phase of said power supply;
   a processor connected to said first, second, third, and fourth inputs that calculates a first estimated current corresponding to a current of said second phase of said power supply and a second estimated current corresponding to a current of said third phase of said power supply based on voltage measurements from said first, second, and third inputs and current measurements from said fourth input, and that calculates a power factor of said compressor based on said voltage measurements from said first, second, and third inputs, said current measurements from said fourth input, and said first and second estimated currents.

2. The sensor module of claim 1 wherein said processor is disposed within an electrical enclosure attached to an exterior of said compressor, said electrical enclosure being configured to receive electrical leads of said power supply and to house said first, second, and third voltage sensors, said current sensor, and electrical terminals that connect said electrical leads of said power supply to said electric motor.

3. The sensor module of claim 1 wherein said processor is disposed within a tamper-resistant enclosure within said electrical enclosure.

4. The sensor module of claim 1 wherein said processor calculates an active power and an apparent power of said compressor based on said voltage measurements from said first, second, and third inputs, said current measurements from said fourth input, and said first and second estimated currents, and calculates said power factor according to a ratio of said active power to said apparent power.

5. The sensor module of claim 1 wherein said processor determines a voltage waveform based on said voltage measurements from said first, second, and third inputs and a current waveform based on said current measurements from said fourth input and said first and second estimated currents, and calculates said power factor according to an angular difference between said current waveform and said voltage waveform.

6. The sensor module of claim 1 wherein said processor calculates a power consumption of said compressor based on said voltage measurements from said first, second, and third inputs, said current measurements from said fourth input, and said first and second estimated currents.

7. The sensor module of claim 6 wherein said processor calculates an active power of said compressor based on said voltage measurements from said first, second, and third inputs, said current measurements from said fourth input, and said first and second estimated currents, and calculates said power consumption by averaging said active power over a time period.

8. The sensor module of claim 1 further comprising a communication port for communicating information from said sensor module to at least one of: a control module for said compressor, a system controller for a system associated with said compressor, a portable computing device, and a network device.

9. The sensor module of claim 8 wherein said information includes at least one of: said power factor, a calculated active power, a calculated apparent power, and a calculated power consumption of said compressor.

10. The sensor module of claim 1 wherein said processor calculates an active power and an apparent power of said compressor based on said voltage measurements from said first, second, and third inputs, said current measurements from said fourth input, and said first and second estimated currents and calculates said power factor according to a ratio of said active power to said apparent power.

11. For a sensor module of a compressor having an electric motor connected to a power supply that includes first, second, and third phases, a method comprising:
   receiving, with a processor of the sensor module, first voltage measurements from a first voltage sensor that generates a first voltage signal corresponding to a voltage of said first phase of said power supply;
   receiving, with said processor, second voltage measurements from a second voltage sensor that generates a second voltage signal corresponding to a voltage of said second phase of said power supply;
   receiving, with said processor, third voltage measurements from a third voltage sensor that generates a third voltage signal corresponding to a voltage of said third phase of said power supply;
   receiving, with said processor, current measurements from a current sensor that generates a current signal corresponding to a current of said first phase of said power supply;
   calculating, with said processor, a first estimated current corresponding to a current of said second phase of said power supply and a second estimated current corresponding to a current of said third phase of said power supply, based on said first, second, and third voltage measurements, and said current measurements;
   calculating, with said processor, a power factor of said compressor based on said first, second, and third voltage measurements, said current measurements, and said first and second estimated currents;
   generating an output, with said processor, based on said power factor.

12. The method of claim 11 wherein said calculating said power factor comprises:
   calculating an active power and an apparent power of said compressor based on said first, second, and third voltage measurements, said current measurements, and said first and second estimated currents;
   calculating said power factor according to a ratio of said active power to said apparent power.

13. The method of claim 11 wherein said calculating said power factor comprises:
   determining a voltage waveform based on said first, second, and third voltage measurements;
   determining a current waveform based on said current measurements and said first and second estimated currents;
   calculating said power factor according to an angular difference between said current waveform and said voltage waveform.

14. The method of claim 11 further comprising:
   calculating a power consumption of said compressor based on said first, second, and third voltage measurements, said current measurements, and said first and second estimated currents.

15. The method of claim 11 wherein said processor is disposed within an electrical enclosure attached to an exterior of said compressor, said electrical enclosure being configured to receive electrical leads of said power supply and to house said first, second, and third voltage sensors, said current sensor, and electrical terminals that connect said electrical leads of said power supply to said electric motor.

* * * * *